US012610742B2

(12) United States Patent
Menture et al.

(10) Patent No.: US 12,610,742 B2
(45) Date of Patent: Apr. 21, 2026

(54) MICROPUMP AND METHOD OF FABRICATING THE SAME

(71) Applicant: AITA BIO INC., New York, NY (US)

(72) Inventors: Jacob Menture, New York, NY (US); Peter Smeys, San Jose, CA (US); Dilan Casanovas Mack, New York, NY (US); Laurence Heads, New York, NY (US)

(73) Assignee: AITA BIO INC., New York, NY (US)

( * ) Notice: Subject to any disclaimer, the term of this patent is extended or adjusted under 35 U.S.C. 154(b) by 828 days.

(21) Appl. No.: 17/779,473

(22) PCT Filed: Nov. 24, 2020

(86) PCT No.: PCT/US2020/062044

§ 371 (c)(1),
(2) Date: May 24, 2022

(87) PCT Pub. No.: WO2021/108421

PCT Pub. Date: Jun. 3, 2021

(65) Prior Publication Data

US 2023/0006127 A1 Jan. 5, 2023

Related U.S. Application Data

(60) Provisional application No. 62/940,191, filed on Nov. 25, 2019.

(51) Int. Cl.
*H10N 30/20* (2023.01)
*H10N 30/082* (2023.01)
*H10N 30/09* (2023.01)

(52) U.S. Cl.
CPC ....... *H10N 30/2047* (2023.02); *H10N 30/082* (2023.02); *H10N 30/09* (2023.02)

(58) Field of Classification Search
CPC ... H01N 30/2047; H01N 30/09; H01N 30/082
See application file for complete search history.

(56) References Cited

U.S. PATENT DOCUMENTS 1,125,984 A 1/1915 Dumas
3,719,655 A 3/1973 Jackson
(Continued)

FOREIGN PATENT DOCUMENTS

CH 680009 A5 5/1992
CH 683634 A5 4/1994
(Continued)

OTHER PUBLICATIONS

Search Report and Opinion dated Feb. 26, 2021 for PCT/US20/62044.
(Continued)

*Primary Examiner* — Sean Gugger
(74) *Attorney, Agent, or Firm* — Neal Marcus

(57) ABSTRACT

A method is disclosed of fabricating a MEMS device that includes one or more wafers configured as pump or valve. The pump or valve includes an inlet port to receive fluid and an outlet port to release the fluid within the pump or valve. The method comprises growing silicon dioxide on a silicon layer of the one or more wafers to form a silicon dioxide layer on the silicon layer, depositing silicon nitride on the silicon dioxide layer of the one or more wafers to form a silicon nitride layer on the silicon dioxide layer, spinning a front side to create a pattern thereon defining an area for the pump or valve, dry etching the one or more wafers at the area for the pump or valve to remove the silicon dioxide and silicon nitride layers to define an opening for the pump or valve.

25 Claims, 17 Drawing Sheets

(56) References Cited

U.S. PATENT DOCUMENTS

| | | | |
|---|---|---|---|
| 3,876,623 | A | 4/1975 | Jackson et al. |
| 4,825,227 | A | 4/1989 | Fischbeck et al. |
| 4,938,742 | A | 7/1990 | Smits |
| 5,161,774 | A | 11/1992 | Engelsdorf et al. |
| 5,224,843 | A | 7/1993 | van Lintel |
| 5,538,221 | A | 7/1996 | Joswig |
| 5,594,292 | A | 1/1997 | Takeuchi et al. |
| 5,927,885 | A | 7/1999 | Duez et al. |
| 6,565,331 | B1 | 5/2003 | Takeuchi et al. |
| 6,589,229 | B1 | 7/2003 | Connelly et al. |
| 6,666,658 | B2 | 12/2003 | Takeuchi et al. |
| 6,682,318 | B2 | 1/2004 | Takeuchi et al. |
| 6,716,002 | B2 | 4/2004 | Higashino |
| 6,740,059 | B2 | 5/2004 | Flaherty |
| 6,800,210 | B2 | 10/2004 | Patel et al. |
| 6,811,133 | B2 | 11/2004 | Miles |
| 6,830,562 | B2 | 12/2004 | Morgensen et al. |
| 6,930,364 | B2 | 8/2005 | Bruner |
| 6,960,192 | B1 | 11/2005 | Flaherty et al. |
| 6,997,907 | B2 | 2/2006 | Safabash et al. |
| 7,014,625 | B2 | 3/2006 | Bengtsson et al. |
| 7,090,471 | B2 | 8/2006 | Xie et al. |
| 7,104,768 | B2 | 9/2006 | Richter et al. |
| 7,198,250 | B2 | 4/2007 | East |
| 7,207,974 | B2 | 4/2007 | Safabash et al. |
| 7,217,395 | B2 | 5/2007 | Sander |
| 7,287,965 | B2 | 10/2007 | Vogeley et al. |
| 7,290,993 | B2 | 11/2007 | Vogeley et al. |
| 7,381,184 | B2 | 6/2008 | Funderburk et al. |
| 7,407,493 | B2 | 8/2008 | Cane |
| 7,582,059 | B2 | 9/2009 | Funderburk et al. |
| 7,585,287 | B2 | 9/2009 | Bresina et al. |
| 7,622,048 | B2 | 11/2009 | Birkmeyer et al. |
| 7,654,956 | B2 | 2/2010 | Brister et al. |
| 7,682,338 | B2 | 3/2010 | Griffin |
| 7,698,950 | B2 | 4/2010 | Kraatz |
| 7,699,807 | B2 | 4/2010 | Faust et al. |
| 7,713,761 | B2 | 5/2010 | Koezuka et al. |
| 7,771,412 | B2 | 8/2010 | Anderson et al. |
| 7,815,607 | B2 | 10/2010 | Rutti et al. |
| 7,879,010 | B2 | 2/2011 | Hunn et al. |
| 7,896,844 | B2 | 3/2011 | Thalmann et al. |
| 7,909,791 | B2 | 3/2011 | Liniger et al. |
| 7,969,064 | B2 | 6/2011 | Vogeley et al. |
| 8,038,260 | B2 | 10/2011 | Okamura |
| 8,053,956 | B2 | 11/2011 | Bibl et al. |
| 8,128,201 | B2 | 3/2012 | Okamura et al. |
| 8,152,771 | B2 | 4/2012 | Morgensen et al. |
| 8,162,892 | B2 | 4/2012 | Mogensen et al. |
| 8,167,841 | B2 | 5/2012 | Teisen-Simony et al. |
| 8,172,805 | B2 | 5/2012 | Morgensen et al. |
| 8,226,208 | B2 | 7/2012 | Okamura et al. |
| 8,226,615 | B2 | 7/2012 | Bikovsky |
| 8,231,577 | B2 | 7/2012 | Carter et al. |
| 8,262,200 | B2 | 9/2012 | Okamura |
| 8,280,475 | B2 | 10/2012 | Brister et al. |
| 8,308,452 | B2 | 11/2012 | Amirouche et al. |
| 8,430,850 | B2 | 4/2013 | Gyrn et al. |
| 8,454,327 | B2 | 6/2013 | Hirata et al. |
| 8,475,410 | B2 | 7/2013 | Kaufmann et al. |
| 8,512,243 | B2 | 8/2013 | Stafford |
| 8,523,322 | B2 | 9/2013 | Okamura et al. |
| 8,562,567 | B2 | 10/2013 | Gundberg |
| 8,602,991 | B2 | 12/2013 | Stafford |
| 8,635,774 | B2 | 1/2014 | Hoisington et al. |
| 8,641,674 | B2 | 2/2014 | Bobroff et al. |
| 8,672,462 | B2 | 3/2014 | Essen et al. |
| 8,784,383 | B2 | 7/2014 | Cole et al. |
| 8,807,719 | B2 | 8/2014 | Hoisington et al. |
| 8,858,185 | B2 | 10/2014 | Johnson et al. |
| 8,882,254 | B2 | 11/2014 | Von Essen et al. |
| 8,900,190 | B2 | 12/2014 | Chong et al. |
| 8,916,395 | B2 | 12/2014 | Adiga et al. |
| 8,945,057 | B2 | 2/2015 | Gyrn et al. |
| 8,979,247 | B2 | 3/2015 | Hoisington et al. |
| 8,979,808 | B1 | 3/2015 | Chong et al. |
| 9,050,128 | B2 | 6/2015 | Ros et al. |
| 9,055,901 | B2 | 6/2015 | Brister et al. |
| 9,060,927 | B2 | 6/2015 | Steiner et al. |
| 9,095,659 | B2 | 8/2015 | Thalmann et al. |
| 9,270,205 | B2 | 2/2016 | Gardner et al. |
| 9,276,194 | B2 | 3/2016 | Kitayama et al. |
| 9,278,174 | B2 | 3/2016 | Gray |
| 9,410,641 | B2 | 8/2016 | Herz et al. |
| 9,480,421 | B2 | 11/2016 | Stafford |
| 9,536,706 | B2 | 1/2017 | Huff et al. |
| 9,546,743 | B2 | 1/2017 | Livermore-Clifford et al. |
| 9,685,513 | B2 | 6/2017 | Kub et al. |
| 9,775,563 | B2 | 10/2017 | Stafford |
| 9,861,720 | B2 | 1/2018 | Dodd et al. |
| 9,901,622 | B2 | 2/2018 | Joseph et al. |
| 9,943,653 | B2 | 4/2018 | Kamen et al. |
| 9,968,747 | B2 | 5/2018 | Gravesen et al. |
| 9,980,670 | B2 | 5/2018 | Funderburk et al. |
| 10,002,938 | B2 | 6/2018 | Zhang |
| 10,006,564 | B2 | 6/2018 | Okamura et al. |
| 10,041,483 | B2 | 8/2018 | Chappel |
| 10,060,815 | B2 | 8/2018 | Kazama et al. |
| 10,107,645 | B2 | 10/2018 | Hajati |
| 10,189,252 | B2 | 1/2019 | Panchawagh et al. |
| 10,220,616 | B2 | 3/2019 | Panchawagh et al. |
| 10,226,207 | B2 | 3/2019 | Stafford |
| 10,278,732 | B2 | 5/2019 | Schoonmaker et al. |
| 10,279,106 | B1 | 5/2019 | Cook et al. |
| 10,323,772 | B2 | 6/2019 | Huff |
| 10,342,489 | B2 | 7/2019 | Stafford |
| 10,363,342 | B2 | 7/2019 | Dillon et al. |
| 10,449,292 | B2 | 10/2019 | Pizzochero et al. |
| 10,485,459 | B2 | 11/2019 | Arita et al. |
| 10,513,428 | B2 | 12/2019 | Giusti |
| 10,532,151 | B2 | 1/2020 | Wei |
| 10,561,711 | B2 | 2/2020 | Berenson et al. |
| 10,586,912 | B2 | 3/2020 | Latev et al. |
| 10,595,900 | B2 | 3/2020 | Schoonmaker et al. |
| 10,716,893 | B2 | 7/2020 | Gray et al. |
| 10,766,258 | B2 | 9/2020 | Hishinuma et al. |
| 10,828,417 | B2 | 11/2020 | Smith et al. |
| 10,912,881 | B2 | 2/2021 | Maguire |
| 10,973,443 | B2 | 4/2021 | Funderburk et al. |
| 11,092,150 | B2 | 8/2021 | Marsh |
| 11,131,299 | B2 | 9/2021 | Richter et al. |
| 11,266,567 | B2 | 3/2022 | Bianchi et al. |
| 11,383,028 | B2 | 7/2022 | Pizzochero et al. |
| 11,406,753 | B2 | 8/2022 | Gray et al. |
| 11,446,434 | B2 | 9/2022 | Lanigan et al. |
| 11,486,381 | B2 | 11/2022 | Kutter et al. |
| 11,547,357 | B2 | 1/2023 | Antonio et al. |
| 11,555,725 | B2 | 1/2023 | Wald et al. |
| 11,617,827 | B2 | 4/2023 | Mogensen et al. |
| 11,737,783 | B2 | 8/2023 | Garai |
| 2004/0000843 | A1 | 1/2004 | East |
| 2004/0063322 | A1 | 4/2004 | Yang |
| 2005/0123420 | A1 | 6/2005 | Richter et al. |
| 2005/0260793 | A1 | 11/2005 | Patel et al. |
| 2007/0282269 | A1 | 12/2007 | Carter et al. |
| 2008/0051698 | A1 | 2/2008 | Mounce et al. |
| 2008/0136866 | A1 | 6/2008 | Okamura et al. |
| 2008/0150998 | A1 | 6/2008 | Okamura |
| 2008/0234630 | A1 | 9/2008 | Iddan et al. |
| 2009/0062768 | A1 | 3/2009 | Saul |
| 2009/0192471 | A1 | 7/2009 | Carter et al. |
| 2009/0204077 | A1 | 8/2009 | Hasted et al. |
| 2009/0297372 | A1* | 12/2009 | Amirouche .......... F04B 43/046 417/413.2 |
| 2010/0055882 | A1 | 3/2010 | Imhoff et al. |
| 2010/0152665 | A1 | 6/2010 | Hasted |
| 2010/0168710 | A1 | 7/2010 | Braithwaite |
| 2011/0061526 | A1 | 3/2011 | Wackerle et al. |
| 2011/0063369 | A1 | 3/2011 | Okamura |
| 2011/0106011 | A1 | 5/2011 | Cinar et al. |
| 2011/0212261 | A1 | 9/2011 | Okamura et al. |
| 2011/0280755 | A1 | 11/2011 | Wackerle et al. |
| 2011/0306929 | A1 | 12/2011 | Levesque et al. |
| 2012/0156097 | A1 | 6/2012 | Beden et al. |

(56) References Cited

U.S. PATENT DOCUMENTS

| | | |
|---|---|---|
| 2012/0209190 A1 | 8/2012 | Gray et al. |
| 2012/0306929 A1 | 12/2012 | Chalkov |
| 2013/0068325 A1 | 3/2013 | Herz et al. |
| 2013/0085449 A1 | 4/2013 | Saulenas et al. |
| 2013/0138078 A1 | 5/2013 | Smith et al. |
| 2013/0186078 A1 | 7/2013 | Lemke et al. |
| 2013/0237918 A1 | 9/2013 | Gyrn |
| 2013/0245555 A1 | 9/2013 | Dirac et al. |
| 2014/0111575 A1 | 4/2014 | Hoisington et al. |
| 2014/0184677 A1 | 7/2014 | Hoisington et al. |
| 2014/0262972 A1 | 9/2014 | Adiga et al. |
| 2015/0034592 A1 | 2/2015 | Huff et al. |
| 2015/0053930 A1 | 2/2015 | Zhang |
| 2015/0171313 A1 | 6/2015 | Hoisington et al. |
| 2016/0146685 A1 | 5/2016 | Chiou et al. |
| 2016/0341552 A1 | 11/2016 | Kub et al. |
| 2017/0226994 A1 | 8/2017 | Richter et al. |
| 2017/0246383 A1 | 8/2017 | Lanier, Jr. et al. |
| 2017/0252824 A1 | 9/2017 | Gibson et al. |
| 2018/0035548 A1 | 2/2018 | Landesberger et al. |
| 2018/0093881 A1 | 4/2018 | Chiou et al. |
| 2018/0132990 A1 | 5/2018 | Baeten et al. |
| 2018/0207356 A1 | 7/2018 | Joseph et al. |
| 2018/0261679 A1 | 9/2018 | Zhang |
| 2019/0154551 A1 | 5/2019 | Richter et al. |
| 2019/0203703 A1 | 7/2019 | Shabanian et al. |
| 2019/0374709 A1 | 12/2019 | Cole et al. |
| 2020/0001005 A1 | 1/2020 | Politis et al. |
| 2020/0001607 A1 | 1/2020 | Menzei et al. |
| 2020/0009865 A1 | 1/2020 | Hishinuma et al. |
| 2020/0023123 A1 | 1/2020 | O'Connor et al. |
| 2020/0025311 A1 | 1/2020 | Huff |
| 2020/0085377 A1 | 3/2020 | Stafford |
| 2020/0138911 A1 | 5/2020 | Joseph et al. |
| 2020/0178899 A1 | 6/2020 | Chae et al. |
| 2020/0179596 A1 | 6/2020 | Dechelette et al. |
| 2020/0277948 A1 | 9/2020 | Kutter et al. |
| 2020/0297258 A1 | 9/2020 | Chae et al. |
| 2021/0060553 A1 | 3/2021 | Röhl et al. |
| 2021/0077147 A1 | 3/2021 | Chae et al. |
| 2021/0137432 A1 | 5/2021 | Chae et al. |
| 2021/0275066 A1 | 9/2021 | Chae et al. |
| 2021/0282675 A1 | 9/2021 | Chae et al. |
| 2021/0307659 A1 | 10/2021 | Chae et al. |
| 2021/0330220 A1 | 10/2021 | Chae et al. |
| 2021/0346597 A1 | 11/2021 | Maguire et al. |
| 2021/0353911 A1 | 11/2021 | Cole |
| 2021/0363983 A1 | 11/2021 | Marsh |
| 2022/0054744 A1 | 2/2022 | Cole et al. |
| 2022/0105261 A1 | 4/2022 | Yodfat et al. |
| 2022/0125358 A1 | 4/2022 | Curry et al. |
| 2022/0151517 A1 | 5/2022 | Rao et al. |
| 2022/0226573 A1 | 7/2022 | Pananen et al. |
| 2022/0361820 A1 | 11/2022 | Gray et al. |
| 2022/0379019 A1 | 12/2022 | Lanigan et al. |
| 2022/0409051 A1 | 12/2022 | Smeys et al. |
| 2023/0062738 A1 | 3/2023 | Lanigan et al. |
| 2023/0166029 A1 | 6/2023 | Carter et al. |
| 2023/0181217 A1 | 6/2023 | Li et al. |
| 2023/0248391 A1 | 8/2023 | Chen et al. |
| 2023/0285236 A1 | 9/2023 | Liu et al. |
| 2023/0302230 A1 | 9/2023 | Todesco et al. |
| 2023/0346428 A1 | 11/2023 | Garai |

FOREIGN PATENT DOCUMENTS

| | | |
|---|---|---|
| CH | 683793 A5 | 5/1994 |
| CH | 684286 A5 | 8/1994 |
| CN | 105628288 B | 12/2020 |
| DE | 10238600 A1 | 3/2004 |
| DE | 102005038483 B3 | 12/2006 |
| DE | 102005058080 A1 | 6/2007 |
| DE | 102006028986 A1 | 12/2007 |
| DE | 102008035990 B4 | 1/2012 |
| DE | 102016201718 A1 | 8/2017 |
| DE | 102018207858 A1 | 11/2019 |
| DE | 102019202722 A1 | 9/2020 |
| DE | 102019211941 B3 | 10/2020 |
| EP | 0568902 A2 | 11/1993 |
| EP | 0718873 A2 | 6/1996 |
| EP | 2208530 A1 | 7/2010 |
| EP | 2556815 A1 | 2/2013 |
| EP | 2722181 B1 | 10/2013 |
| EP | 2738386 A1 | 6/2014 |
| EP | 2207963 B1 | 7/2015 |
| EP | 2205869 B1 | 12/2017 |
| EP | 3527242 A1 | 8/2019 |
| EP | 3297708 | 2/2022 |
| FR | 2839712 A1 | 11/2003 |
| GB | 2248891 A | 4/1992 |
| GB | 2266751 A | 11/1993 |
| JP | 2004314641 A | 11/2004 |
| JP | 5117804 B2 | 1/2013 |
| JP | 2019132278 A | 8/2019 |
| JP | 2017064525 A | 3/2020 |
| JP | 2020044843 A | 3/2020 |
| WO | 1990015929 | 12/1990 |
| WO | 1991007591 | 5/1991 |
| WO | 1991014281 A1 | 9/1991 |
| WO | 1992001829 A1 | 2/1992 |
| WO | 1992004569 A1 | 3/1992 |
| WO | 1992019010 A1 | 10/1992 |
| WO | 993023740 A1 | 11/1993 |
| WO | 1996011025 A1 | 4/1996 |
| WO | 1996025619 A1 | 8/1996 |
| WO | 1997015339 | 10/1996 |
| WO | 1996035472 A1 | 11/1996 |
| WO | 1997002853 A1 | 1/1997 |
| WO | 1997028395 A1 | 8/1997 |
| WO | 1997029283 | 8/1997 |
| WO | 1997033094 A1 | 9/1997 |
| WO | 1998014707 A1 | 4/1998 |
| WO | 1998026818 A1 | 6/1998 |
| WO | 1998029661 A1 | 7/1998 |
| WO | 1999009321 A1 | 2/1999 |
| WO | 2001090577 A1 | 11/2001 |
| WO | 2003068133 A1 | 8/2003 |
| WO | 2006079739 A1 | 8/2006 |
| WO | WO 2004/084274 A3 | 12/2006 |
| WO | WO2007020029 A1 | 2/2007 |
| WO | 2007031968 A2 | 3/2007 |
| WO | 2007074425 A1 | 7/2007 |
| WO | 2007085993 A1 | 8/2007 |
| WO | 2007113708 A1 | 10/2007 |
| WO | 2007138227 A1 | 12/2007 |
| WO | 2008004148 A2 | 1/2008 |
| WO | 2008018024 A3 | 2/2008 |
| WO | 2008029051 A2 | 5/2008 |
| WO | 2009098314 A1 | 8/2009 |
| WO | 2010020891 A1 | 2/2010 |
| WO | WO 2010/027990 A1 | 3/2010 |
| WO | 2010046728 A1 | 4/2010 |
| WO | 2010136848 A1 | 12/2010 |
| WO | 2011007196 A1 | 1/2011 |
| WO | 2011064737 A2 | 6/2011 |
| WO | 2011070468 A1 | 6/2011 |
| WO | 2011098946 A1 | 8/2011 |
| WO | 2011161577 A1 | 12/2011 |
| WO | 2012073155 A2 | 6/2012 |
| WO | 2012085814 A2 | 6/2012 |
| WO | 2012117379 A2 | 7/2012 |
| WO | 2012168889 A1 | 12/2012 |
| WO | 2012176170 A1 | 12/2012 |
| WO | 2012176171 A1 | 12/2012 |
| WO | WO 2013/018011 A2 | 2/2013 |
| WO | 2013061296 A2 | 5/2013 |
| WO | 2013068900 A1 | 5/2013 |
| WO | 2013114331 A9 | 8/2013 |
| WO | 2013168107 A1 | 11/2013 |
| WO | 2014020501 A1 | 2/2014 |
| WO | 2014108860 A1 | 7/2014 |
| WO | 2014136090 A1 | 9/2014 |
| WO | 2015036947 A1 | 3/2015 |
| WO | 2015114534 A1 | 8/2015 |

(56) References Cited

FOREIGN PATENT DOCUMENTS

| WO | 2016030836 A1 | 3/2016 |
|----|---------------|--------|
| WO | 2016059589 A1 | 4/2016 |
| WO | 2016059614 A2 | 4/2016 |
| WO | 2016059616 A1 | 4/2016 |
| WO | 2017006293 A1 | 1/2017 |
| WO | 2018065954 A1 | 4/2018 |
| WO | 2018167543 A1 | 9/2018 |
| WO | 2018167727 A1 | 9/2018 |
| WO | 2019159121 A1 | 8/2019 |
| WO | WO 2019/219600 A1 | 11/2019 |
| WO | WO2019213271 A1 | 11/2019 |
| WO | 2020012308 A1 | 1/2020 |
| WO | 2020075042 A1 | 4/2020 |
| WO | 2020129002 A1 | 6/2020 |
| WO | 2020129008 A1 | 6/2020 |

OTHER PUBLICATIONS

William L. Benard et al: Towards Determining Cost, Quality and Turn Around Time of MEMS Devices Fabricated in a Distributed Prototyping Environment, Micromachining and Microfabrication Process Technology VI, Proceedings of SPIE vol. 4174 (2000), pp. 207-216.

Bharat Bhushan: Nanotribology and Nanomechanics of MEMS/NEMS and BioMEMS/BioNEMS Materials and Devices, Nanotribology and Nanomechanics, pp. 797-907.

Thomas E Buchheit et al: Fracture Strength Characterization for 25 Micron and 125 Micron Thick SOI-MEMS Structures, J. Micromech. Microeng. 25 (2015) 075018, pp. 1-11.

Wen-Teng Chang: Metal-Electrode-Sandwiched Quartz Crystal-Based Oscillator as Proximity Sensor, Sensors and Actuators A 171 (2011) 292-296.

Christopher Cheng et al: Thin Film PZT-Based PMUT Arrays for Deterministic Particle Manipulation, IEEE Transactions on Ultrasonics, Ferroelectrics, and Frequency Control, 2019, pp. 1-9.

Melodie Chen-Glasser et al: Piezoelectric Materials for Medical Applications, 2018, pp. 125-145.

Paul Brackwell: Achieving Interconnection With Pulse-Heated Bonding, Circuits Assembly, Apr. 2000, pp. 46-50.

Angelica Cobo et al: MEMS: Enabled Drug Delivery Systems, Adv. Healthcare Mater. 2015, 4, 969-982.

Robert F. Cook et al: Predicting Strength Distributions of MEMS Structures Using Flaw Size and Spatial Density, Microsystems & Nanoengineering (2019) 5:49, pp. 1-12.

D. Damjanovic et al: Electrostrictive and Piezoelectric Materials for Actuator Applications, Journal of Intelligent Material Systems and Structures vol. 3, Apr. 1992, pp. 190-208.

Damien Lamaison: Debiotech S.A. Switzerland: Innovative Medical Systems: Fabrication and Characterization of Microfluidic Chips for Implantable Pumps, 2018, pp. 1-59.

Tao Dong et al: A MEMS-Based Spiral Piezoelectric Energy Harvester, Proceedings of PowerMEMS 2008+ microEMS 2008, Sendai, Japan, Nov. 9-12, (2008), pp. 77-80.

W. Du et al: The Influence of Processing Parameters on Piezoelectric and Dielectric Properties of Dome-Shaped Composite PZT-Epoxy Actuators, Journal of Manufacturing Processes 57 (2020), pp. 48-60.

O. Elkhatib et al: Process Induced Stresses in Cavity SOI Wafers, pp. 1-10.

Jiandong Fang et al: Self-Assembly of PZT Actuators for Micropumps With High Process Repeatability, Journal of Microelectromechanical Systems, vol. 15, No. 4, Aug. 2006, pp. 871-878, Apr. 22, 2014.

Y.Q. Fu et al: Advances in Piezoelectric Thin Films for Acoustic Biosensors, Acoustofluidics and Lab-On-Chip Applications, Progress in Materials Science, 2017, pp. 1-167.

Sebastian Glinsek et al: Fully Transparent Friction-Modulation Haptic Device Based on Piezoelectric Thin Film, Adv. Funct. Mater. 2020, 2003539, pp. 1-8.

Peter Glynne-Jones et al: A Feasibility Study on Using Inkjet Technology, Micropumps, and MEMS as Fuel Injectors for Bipropellant Rocket Engines, pp. 1-15.

Nicolas Godard et al: Direct Patterning of Piezoelectric Thin Films By Inkjet Printing, Adv. Mater. Technol. 2018, 1800168, pp. 1-8.

Amy C. Richards Grayson et al: A BioMEMS Review: MEMS Technology for Physiologically Integrated Devices, Proceedings of the IEEE, vol. 92, No. 1, Jan. 2004, pp. 6-21.

Vinayak Hegde: Micro-Electro-Mechanical Systems—The Future Technology, but Today's Choice, Atria Institute of Technology, Apr. 20, 2009, pp. 1-37.

Harald Jacobsen et al: High-Rate Sputtering of Thick PZT Thin Films for MEMS, J Electroceram (2010) 25:198-202.

Isaku Kanno et al: Development of Deformable Mirror Composed of Piezoelectric Thin Films for Adaptive Optics, IEEE Journal of Selected Topics in Quantum Electronics, vol. 13, No. 2, Mar./Apr. 2007, pp. 155-161.

Brendan Koch et al: Microfabrication for Drug Delivery, Materials 2016, 9, 646, pp. 1-36.

Geoffrey Kotzar et al: Evaluation of MEMS Materials of Construction for Implantable Medical Devices, Biomaterials 23 (2002) 2737-2750.

Shaokang Li et al: Preparation of Diffuser-Type Micropumps Using PZT Thin Films Prepared By Metallo-Organic Compound Decomposition Process, Ferroelectrics, 383:1, 2009, pp. 144-150.

Sihua Li et al: Design, Fabrication and Characterization of a High Fill-Factor Micromirror Array for Wavelength Selective Switch Applications, Sensors and Actuators A 171 (2011) 274-282.

Jari Makinen et al: Thick-Film Silicon-On-Insulator Wafers Preparation and Properties, Handbook of Silicon Based MEMS Materials and Technologies, 2020, pp. 215-246.

Graham D. Martin et al: Inkjet Technology: What Next?, Fundamentals of Inkjet Printing: The Science of Inkjet and Droplets, First Edition, 2016, pp. 419-444.

Benedetto Vigna: What is Next for MEMS Actually, It's Actuators!, pp. 1-20.

Luis Abelardo Villarruel Mendoza et al: Recent Advances in Micro-Electro-Mechanical Devices for Controlled Drug Release Applications, Frontiers in Bioengineering and Biotechnology, Jul. 2020, vol. 8, Article 827, pp. 1-28.

Jianmin Miao: Silicon Micromachining, Encyclopedia of Microfluidics and Nanofluidics, 2014, pp. 1-12.

Miyachi Europe Corporation: Anisotropic Conductive Adhesive Bonding: A High-Quality Interconnection Technique, Anasotropic Conductive Adhesive Bonding Technology, pp. 1-6.

Katsuo Mogi et al: A Novel Fabrication Technique for Liquid-Tight Microchannels By Combination of a Paraffin Polymer and a Photo-Curable Silicone Elastomer, Materials 2016, 9, 621, pp. 1-8.

Matej Možek et al: Determination of Essential Parameters for Quality Control in Fabrication of Piezoelectric Micropumps, Quality Management and Quality Control—New Trends and Developments, 2019, pp. 1-19.

B. Neff et al: Development and Characterization of MEMS Membranes Based on Thin-Film PZT Actuators for Microfluidic Applications, 2018 19th International Conference on Thermal, Mechanical and Multi-Physics Simulation and Experiments in Microelectronics and Microsystems (EuroSimE), 2018, pp. 1-5.

Nam-Trung Nguyen et al: MEMS-Micropumps: A Review, Journal of Fluids Engineering, Jun. 2002, vol. 124, pp. 384-392.

Nam-Trung Nguyen et al: Design, Fabrication and Characterization of Drug Delivery Systems Based on Lab-On-A-Chip Technology, Advanced Drug Delivery Reviews, 2013, pp. 1-52.

Polacheck et al: Si Materials and Methods, pp. 1-5.

Adithya Krishnan Thota Radhakrishnan et al: Laminar-Turbulent Transition of a Non-Newtonian Fluid Flow, Journal of Hydraulic Research, 2020, pp. 1-16.

S.H. Rahul et al: Optimizing Inkjet Printing Process to Fabricate Thick Ceramic Coatings, Ceramics International (2016), pp. 1-7.

Thomas Velten et al: Packaging of BIO-MEMS: Strategies, Technologies, and Applications, IEEE Transactions on Advanced Packaging, vol. 28, No. 4, Nov. 2005, pp. 533-546.

(56) References Cited

OTHER PUBLICATIONS

M. Shavezipur et al: Fabrication Uncertainties and Yield Optimization in MEMS Tunable Capacitors, Sensors and Actuators A 147 (2008) 613-622.

Muhammad Shoaib et al: Effects of Edge Cracks on the Dynamics of Piezoelectric Cantilever Based MEMS Sensor, Aug. 2016, pp. 1-7.

Daniel Perttu: Aita BIO: Silex Process Flow, Silex Microsystems, 2016, pp. 1-32.

Silex Microsystems: Project Overview, 2016, pp. 1-2.

Maaike M. Visser Taklo: IR and MEMS Sensors, Sintef, pp. 1-31.

Christian Stiker: Characterization and Fabrication of Thin Film PZT Layer for Direction Finding MEMS Sensors, Calhoun: The NPS Institutional Archive, 2019, pp. 1-104.

Yu-Chuan Su et al: Packaging and Reliability Issues in Micro/Nano Systems, Springer Handbook of Nanotechnology, 2017, pp. 1505-1539.

Hongen Tu: Flexible MEMS: A Novel Technology to Fabricate Flexible Sensors and Electronics, Wayne State University Dissertations, Paper 1058, 2014, pp. 1-120.

Phan Trong Tue et al: Direct Integration of Piezoactuator Array With Active-Matrix Oxide Thin-Film Transistors Using a Low-Temperature Solution Process, Sensors and Actuators A 295 (2019) 125-132.

Ulvac Solutions: PZT Etch Process Update, 2012, pp. 1-14.

Henne Van Heeren: MEMS Recent Developments, Future Directions, 2007, pp. 1-55.

R. Vayrette et al: Size Dependent Fracture Strength and Cracking Mechanisms in Freestanding Polycrystalline Silicon Films With Nanoscale Thickness, Engineering Fracture Mechanics, 2016, pp. 1-14.

Alexander Wolter et al: Designing MEMS for Manufacturing, Optomechatronic Micro/Nano Components, Devices, and Systems, Proc. of SPIE vol. 5604, pp. 74-85.

Weiwei Xu: Fabrication, Characterization and Application of PZT-Silane Nano-Composite Thin-Film Sensors and Actuators, 2019, pp. 1-270.

H. G. Beom et al: Conducting Cracks in Dissimilar Piezoelectric Media, International Journal of Fracture 118: 285-301, 2002.

E. Defay et al: Stress and Stress Relaxation Study of Sputtered PZT Thin Films for Microsystems Applications, Mat. Res. Soc. Symp. Proc. vol. 594, 2000, pp. 237-242.

Lucy Edery-Azulay et al: The Integrity of Piezo-Composite Beams Under High Cyclic Electro-Mechanical Loads—Experimental Results, Smart Mater. Struct. 16 (2007) 1226-1238.

Chad M. Landis: Energetically Consistent Boundary Conditions for Electromechanical Fracture, International Journal of Solids and Structures 41 (2004) 6291-6315.

H. M. Lee et al: Crack Development in Pulsed Laser-Deposited PZT Thin Films, Mat. Res. Soc. Symp. Proc. vol. 285, 1993, pp. 409-413.

Wenyuan Li et al: On the Crack Face Boundary Conditions in Electromechanical Fracture and an Experimental Protocol for Determining Energy Release Rates, European Journal of Mechanics A/Solids 27 (2008) 285-301.

K. Y. Madhavi et al: Diaphragm Design for MEMS Pressure Sensors Using a Data Mining Tool, Proceedings of the World Congress on Engineering 2011 vol. II WCE 2011, Jul. 6-8, 2011, pp. 1-4.

Easo P. George et al: Materials for Smart Systems, Materials Research Society Symposium Proceedings vol. 360, 1995, pp. 1-546.

Yael Motola et al: M-Integral for Calculating Intensity Factors of Cracked Piezoelectric Materials Using the Exact Boundary Conditions, Journal of Applied Mechanics, Jan. 2009, pp. 1-37.

Paul Muralt et al: Fabrication and Characterization of PZT Thin Films for Micromotors, Integrated Ferroelectrics, 1995, vol. 11, pp. 213-220.

A.L. Olson et al: Fracture Behavior of Thin Film PZT on Silicon MEMS and Membranes, Mat. Res. Soc. Symp. Proc. vol. 750, 2003, pp. 1-6.

K. Srinivasa Rao et al: Design and Optimization of MEMS Based Piezoelectric Actuator for Drug Delivery Systems, Microsystem Technologies, Dec. 11, 2019, pp. 1-9.

S. Revathi et al: A Design Analysis of Piezoelectric-Polymer Composite-Based Valveless Micropump, International Journal of Modelling and Simulation, 2018, pp. 1-15.

J. Rungamornrat et al: Analysis of Cracks in 3D Piezoelectric Media With Various Electrical Boundary Conditions, Int J Fract, Feb. 6, 2015, pp. 1-21.

E. Zakar et al: Study of PZT Film Stress in Multilayer Structures for MEMS Devices, Mat. Res. Soc. Symp. Proc. vol. 605, 2000, pp. 287-292.

D.F. Bahr et al: Defects and Failure Modes in PZT Films for a MEMS Microengine, Mat. Res. Soc. Symp. Proc. vol. 657, 2001, pp. 1-6.

D.F. Bahr et al: Fracture of Piezoelectric MEMS Structures, pp. 1-6.

R. Ballarini: Recent Developments in Experimental and Theoretical Studies of the Mechanical Behavior of Polycrystalline Silicon for Microelectromechanical Systems, Mat. Res. Soc. Symp. Proc. vol. 546, 1999, pp. 3-14.

Chunfu Chen et al: Volumetric Displacement in Large Deflection of Symmetrically Layered Piezoelectric Plate Under Pretension, IOP Conf. Series: Materials Science and Engineering 735 (2020) 012030, pp. 1-9.

D. Choi et al: Residual Stress in Thick Low-Pressure Chemical-Vapor Deposited Polycrystalline SIC Coatings on Si Substrates, Journal of Applied Physics 97, 074904, 2005, pp. 1-10.

Qifeng Cui et al: Study on a Piezoelectric Micropump for the Controlled Drug Delivery System, Microfluid Nanofluid (2007) 3:377-390.

Yoshikazu Hishinuma et al: Piezoelectric Unimorph Microactuator Arrays for Single-Crystal Silicon Continuous-Membrane Deformable Mirror, Journal of Microelectromechanical Systems, vol. 15, No. 2, Apr. 2006, pp. 370-379.

International Frequency Sensor Association Publishing: Nanosensors and Nanodevices, Sensors & Transducers Journal vol. 110, Issue 11, Nov. 2009, pp. 1-22.

Xin Kang et al: Nonlinearity Analysis of Piezoelectric Micromachined Ultrasonic Transducers Based on Couple Stress Theory, Acta Mech. Sin. (2012) 28(1):104-111.

Yifeng Liu: Study of Size Reduction, Reliability and Lead Safety of an Intra-Cochlear Lead-Zirconate-Titanate Micro-Actuator, 2018, pp. 1-149.

Vahid Mohammadi et al: Piezoelectric Pressure Sensor Based on Enhanced Thin-Film PZT Diaphragm Containing Nanocrystalline Powders, InTech, Piezoelectric Materials and Devices—Practice and Applications, 2013, pp. 113-138.

Paul Muralt et al: Piezoelectric Micromachined Ultrasonic Transducers Based on PZT Thin Films, IEEE Transactions on Ultrasonics, Ferroelectrics, and Frequency Control, vol. 52, No. 12, Dec. 2005, pp. 2276-2288.

Xiaohui Xu et al: Design, Modeling and Fabrication Techniques of Bulk PZT Actuators for MEMS Deformable Mirrors, Proc. of SPIE vol. 6724, 2007, pp. 1-10.

Eui-Hyeok Yang et al: Thin-Film Piezoelectric Unimorph Actuator-Based Deformable Mirror With a Transferred Silicon Membrane, Journal of Microelectromechanical Systems, vol. 15, No. 5, Oct. 2006, pp. 1214-1225.

Ju-hwan Yang et al: Effects of Piezoelectric Constants and Thicknesses of Lead-Zirconate-Titanate Ceramics on the Performances of Inkjet Printheads, Journal of the Korean Physical Society, vol. 59, No. 5, Nov. 2011, pp. 3008-3013.

C. Zinck et al: Development and Characterization of Membranes Actuated By a PZT Thin Film for MEMS Applications, Sensors and Actuators A 115 (2004) 483-489.

J. Kohnle et al: A Unique Solution for Preventing Clogging of Flow Channels By Gas Bubbles, 2002, pp. 77-80.

N B Le et al: Investigation of Hydrophilic Modification for Bubble-Free Operation in Microfluidic Systems and Micropump Applications, Adv. Nat. Sci.: Nanosci. Nanotechnol. 1, 2010, 015006, pp. 1-8.

(56) References Cited

OTHER PUBLICATIONS

Kelly Siew Fong Lew et al: A Collapsing Bubble-Induced Micropump: An Experimental Study, Sensors and Actuators A 133, 2007, pp. 161-172.

Songjing Li et al: Modeling and Influence Study of Gas Bubbles on Characteristics of a Piezoelectric Valve-Less Micropump, Mar. 2012, pp. 1-7.

Jeffrey D. Zahn et al: Continuous On-Chip Micropumping for Microneedle Enhanced Drug Delivery, Biomedical Microdevices 6:3, 2004, pp. 183-190.

T. Zhang et al: Microfluidic Valves Based on TiO2 Coating With Tunable Surface Wettability Between Super Hydrophilic and Super Hydrophobic, Transducers' 11, Jun. 2011, pp. 306-309.

Smits: Piezoelectric micropump with three valves working peristaltically, Sensors and Actuators A: Physical, vol. 21, Issues 1-3, Feb. 1990, pp. 203-206.

Ine L. Jernelv et al: A Review of Optical Methods for Continuous Glucose Monitoring, Applied Spectroscopy Reviews, 2018, pp. 1-31.

Marte Kierulf ÅM et al: Effect of Sensor Location on Continuous Intraperitoneal Glucose Sensing in an Animal Model, PLOS ONE 13(10): e0205447, Oct. 9, 2018, pp. 1-21.

Tadej Battelino et al: Clinical Targets for Continuous Glucose Monitoring Data Interpretation—Recommendations From the International Consensus on Time in Range, Diabetes Care 2019, 42, pp. 1593-1603.

Michael S. Boyne et al: Timing of Changes in Interstitial and Venous Blood Glucose Measured With a Continuous Subcutaneous Glucose Sensor, Diabetes, vol. 52, Nov. 2003, pp. 2790-2794.

Giacomo Cappon et al: Wearable Continuous Glucose Monitoring Sensors: A Revolution in Diabetes Treatment, Electronics 2017, 6, 65, pp. 1-16.

Somasekhar R. Chinnadayyala et al: Editors' Choice—Review—In Vivo and in Vitro Microneedle Based Enzymatic and Non-Enzymatic Continuous Glucose Monitoring Biosensors, ECS Journal of Solid State Science and Technology, 2018, 7 (7) Q3159-Q3171.

Claudio Cobelli et al: Interstitial Fluid Glucose is Not Just a Shifted-In-Time but a Distorted Mirror of Blood Glucose: Insight From an in Silico Study, Diabetes Technology & Therapeutics, vol. 18, No. 8, 2016, pp. 1-7.

Diabetes Technology Meeting: Abstracts, 2017.

Sean T. Doherty et al: Time-Series Analysis of Continuously Monitored Blood Glucose: The Impacts of Geographic and Daily Lifestyle Factors, Journal of Diabetes Research vol. 2015, Article ID 804341, pp. 1-7.

Faranak Foroughi et al: Microwave-Assisted Synthesis of Graphene Modified CUO Nanoparticles for Voltammetric Enzyme-Free Sensing of Glucose at Biological PH Values, Microchimica Acta, Dec. 18, 2017, pp. 1-9.

Chao-June Huang et al: Integrated Microfluidic Systems for Automatic Glucose Sensing and Insulin Injection, Sensors and Actuators B 122 (2007), pp. 461-468.

Xian Huang et al: A Capacitive MEMS Viscometric Sensor for Affinity Detection of Glucose, Journal of Microelectromechanical Systems, vol. 18, No. 6, Dec. 2009, pp. 1246-1254.

Xian Huang et al: A Capacitively Based MEMS Affinity Glucose Sensor, Transducers 2009, Denver, CO, USA, Jun. 21-25, 2009, pp. 1457-1460.

Xian Huang et al: A MEMS Affinity Glucose Sensor Using a Biocompatible Glucose-Responsive Polymer, Sensors and Actuators B 140, 2009, pp. 603-609.

Xian Huang et al: A MEMS Affinity Glucose Sensor Using Permittivity Measurements, Thirteenth International Conference on Miniaturized Systems for Chemistry and Life Sciences, Nov. 2009, pp. 451-453.

X. Huang et al: A MEMS Sensor for Continuous Monitoring of Glucose in Subcutaneous Tissue, 2009, pp. 352-355.

X. Huang et al: A MEMS Differential Dielectric Sensor for Continuous Glucose Monitoring, MEMS 2012, pp. 910-913.

Xian Huang et al: A MEMS Differential Viscometric Sensor for Affinity Glucose Detection in Continuous Glucose Monitoring, Journal of Micromechanics and Microengineering, 2013, 23, pp. 1-10.

Xian Huang et al: A MEMS Dielectric Affinity Glucose Biosensor, Journal of Microelectromechanical Systems, vol. 23, No. 1, Feb. 2014, pp. 14-20.

S. Iguchi et al: Soft-MEMS Glucose Sensor With Functional Polymers, J. Photopolym. Sci. Technol., vol. 23, No. 2, 2010, pp. 167-170.

Peter G. Jacobs et al: Measuring Glucose at the Site of Insulin Delivery With a Redox-Mediated Sensor, Biosensors and Bioelectronics 165, 2020, 112221, pp. 1-9.

Farbod Khoshnoud et al: Recent Advances in MEMS Sensor Technology: Biomedical Applications, IEEE Instrumentation & Measurement Magazine, Feb. 2012, pp. 8-14.

Hiroyuki Kudo et al: A Flexible and Wearable Glucose Sensor Based on Functional Polymers With Soft-MEMS Techniques, Biosensors and Bioelectronics 22, 2006, pp. 558-562.

Siqi Li et al: Development of Novel Glucose Sensing Fluids With Potential Application to Microelectromechanical Systems-Based Continuous Glucose Monitoring, Journal of Diabetes Science and Technology, vol. 2, Issue 6, Nov. 2008, pp. 1066-1074.

D. Li et al: A Microfluidic System With Volume Sensor and Dielectric Glucose Sensor for Continuous Glucose Monitoring, Transducers, Jun. 2013, 16-20, pp. 365-368.

Li Wang et al: A MEMS Thermal Biosensor for Metabolic Monitoring Applications, Journal of Microelectromechanical Systems, vol. 17, No. 2, Apr. 2008, pp. 318-327.

A. Nisar et al: MEMS-Based Micropumps in Drug Delivery and Biomedical Applications, Sensors and Actuators B 130, 2008, pp. 917-942.

Min Pan et al: A Novel Glucose Sensor System With Au Nanoparticles Based on Microdialysis and Coenzymes for Continuous Glucose Monitoring, Sensors and Actuators A 108 (2003) 258-262.

PercuSense: Integrated Sensor and Infusion Set Initial Development, pp. 1-15.

G. Piechotta et al: Novel Micromachined Silicon Sensor for Continuous Glucose Monitoring, Biosensors and Bioelectronics 21, 2005, pp. 802-808.

P.N. Prabhakaran et al: Design and Analysis of Capacitive MEMS Viscometric Sensor for CGM, www.ijetae.com, International Journal of Emerging Technology and Advanced Engineering, vol. 2, Issue 11, 2012, pp. 135-138.

Zhihua Pu et al: A Continuous Glucose Monitoring Device By Graphene Modified Electrochemical Sensor in Microfluidic System, Biomicrofluidics 10, 011910, 2016.

M. Mujeeb-U-Rahman et al: A Novel Needle-Injectable Millimeter Scale Wireless Electrochemical Glucose Sensing Platform for Artificial Pancreas Applications, Scientific Reports, 2019, 9:17421, pp. 1-11.

Partha Pratim Ray et al: Continuous Glucose Monitoring: a Systematic Review of Sensor Systems and Prospects, Sensor Review, 2018.

Nagesh Samyuktha et al: Application of MEMS Based Capacitive Sensor for Continuous Monitoring of Glucose, pp. 1-4.

David W. Schmidtke et al: Measurement and Modeling of the Transient Difference Between Blood and Subcutaneous Glucose Concentrations in the Rat After Injection of Insulin, Proc. Natl. Acad. Sci. USA vol. 95, pp. 294-299, Jan. 1998, Medical Sciences.

Afroza Shirin et al: Optimal Regulation of Blood Glucose Level in Type I Diabetes Using Insulin and Glucagon, PLOS ONE 14(3): e0213665, Mar. 20, 2019, pp. 1-23.

Surya P. Singh et al: Evaluation of Accuracy Dependence of Raman Spectroscopic Models on the Ratio of Calibration and Validation Points for Non-Invasive Glucose Sensing, Analytical and Bioanalytical Chemistry, Jul. 25, 2018.

Jan Soupal et al: Glycemic Outcomes in Adults With T1D Are Impacted More By Continuous Glucose Monitoring Than By Insulin Delivery Method: 3 Years of Follow-Up From the Comisair Study, Diabetes Care, Oct. 10, 2019, pp. 1-7.

(56) References Cited

OTHER PUBLICATIONS

Giovanni Sparacino et al: Italian Contributions to the Development of Continuous Glucose Monitoring Sensors for Diabetes Management, Sensors 2012, 12, 13753-13780.

Kwok-Siong Teh et al: MEMS Sensor Material Based On Polypyrrole-Carbon Nanotube Nanocomposite: Film Deposition and Characterization, Journal of Micromechanics and Microengineering, 15, 2005, pp. 2019-2027.

J. Toledo et al: Flow-Through Sensor Based on Piezoelectric MEMS Resonator for the In-Line Monitoring of Wine Fermentation, Sensors and Actuators B 254, 2018, pp. 291-298.

H. P. Tripathy et al: A Simulation Approach to Study the Effect of Ultrasonic MEMS Based Receiver for Blood Glucose Sensing Applications, IEEE Sensors Letters, vol. 2(3), 2017, pp. 1-4.

Anthony P. F. Turner et al: Diabetes Mellitus: Biosensors for Research and Management, Biosensors 1, 1985, pp. 85-115.

Yasuhiro Uwadaira et al: Noninvasive Blood Glucose Measurement, Nutritional and Therapeutic Interventions for Diabetes and Metabolic Syndrome, 2018, pp. 489-504.

Sandeep Kumar Vashist: Non-Invasive Glucose Monitoring Technology in Diabetes Management: A Review, Analytica Chimica Acta 750, 2012, pp. 16-27.

G. Velho et al: Stability of Electrode Potentials in Needle-Type Glucose Sensors Influence of Needle Material, Diabetes, American Diabetes Association, 1989, 38 (2), pp. 164-171.

Joseph Wang: Glucose Biosensors: 40 Years of Advances and Challenges, Electroanalysis 2001, 13, No. 12, pp. 983-988.

Jicheng Yu et al: Glucose-Responsive Insulin Patch for the Regulation of Blood Glucose in Mice and Minipigs, Nature Biomedical Engineering, Nov. 27, 2019, pp. 499-506.

Ruochong Zhang et al: Noninvasive Electromagnetic Wave Sensing of Glucose, Sensors, 2019, 19, 1151, pp. 1-20.

Yongjun Zhao et al: A MEMS Viscometric Sensor for Continuous Glucose Monitoring, Journal of Micromechanics and Microengineering, 17, 2007, pp. 2528-2537.

Hongyuan Zhao et al: Microchip Based Electrochemical-Piezoelectric Integrated Multi-Mode Sensing System for Continuous Glucose Monitoring, Sensors and Actuators B 223, 2016, pp. 83-88.

Yi Zheng et al: Noninvasive Blood Glucose Detection Using a Miniature Wearable Raman Spectroscopy System, Chinese Optics Letters, 15(8), 083001, 2017, pp. 1-5.

Stefan Zimmermann et al: A Microneedle Based Glucose Monitor: Fabricated on a Wafer-Level Using In-Device Enzyme Immobilization, The 12th International Conference on Solid State Sensors, Actuators and Microsystems, Jun. 2003, pp. 99-102.

Xianli Zong et al: ZNO Nanorod-Based Fet Biosensor for Continuous Glucose Monitoring, Sensors and Actuators B, 2017, pp. 1-19.

Actel Corporation: Low-Power FPGAS in Home-Based Medical Devices, Oct. 2008, pp. 1-4.

Miguel Amaral et al: In Vitro Zinc-Air Battery Evaluation for US in Intraoral Medical Devices, Journal of Medical Devices, vol. 8, Mar. 2014, pp. 1-6.

Keith F. Blurton et al: Metal-Air Batteries: Their Status and Potential—A Review, Journal of Power Sources, 4, 1979, pp. 263-279.

Helene Andersson et al: A Valve-Less Diffuser Micropump for Microfluidic Analytical Systems, Sensors and Actuators B 72, 2001, pp. 259-265.

T. Ariman et al: Microcontinuum Fluid Mechanics—A Review, Inr. J. Engng Sci., 1973, vol. 11, pp. 905-930.

Arun Attri et al: Ph-Dependent Self-Association of Zinc Free Insulin Characterized By Concentration Gradient Statis Light Scattering, Biophys Chem. May 2010, 148(1-3): 28-33, pp. 1-13.

Haim H. Bau et al: Experimental Observations of Liquid Flow in Micro Conduits, American Institute of Aeronautics and Astronautics, Jan. 2001, pp. 1-9.

Alexander Bell et al: Scavenged Body Heat Powered Infusion Pump, J. Micromech. Microeng. 23, 2013, 114019, pp. 1-9.

Cara T Cantwell et al: Modular Reservoir Concept for MEMS-Based Transdermal Drug Delivery Systems, J. Micromech. Microeng. 24, vol. 8976, 2014, 117001, pp. 1-6.

Eric Chappel et al: High Precision Innovative Micropump for Artificial Pancreas, Proceedings of SPIE—The International Society for Optical Engineering, Feb. 2014.

Qifeng Cui et al: Modeling and Numerical Analysis of a Circular Piezoelectric Actuator for Valveless Micropumps, Journal of Intelligent Material Systems and Structures, Sep. 2008, 19, pp. 1195-1205.

Sylvain Girardot et al: All Insulin Pumps Are Not Equivalent: a Bench Test Assessment for Several Basal Rates, Diabetes Technology and Therapeutic, pp. 1-31.

Lise Hojbjerre et al: Effect of Steel and Teflon Infusion Catheters on Subcutaneous Adipose Tissue Blood Flow and Infusion Counter Pressure in Humans, Diabetes Technology & Therapeutics vol. 11, No. 5, 2009, pp. 301-306.

Toru Inaba et al: All-Electron Density Functional Calculation on Insulin With Quasi-Canonical Localized Orbitals, Journal of Computational Chemistry, vol. 26, No. 10, Mar. 2005, pp. 987-993.

Dolly Jacob et al: Insulin Solution Stability and Biocompatibility With Materials Used for an Implantable Insulin Delivery Device Using Reverse Phase HPLC Methods, Appl. Sci. 2019, 9, 4794, pp. 1-10.

Sangyong Jon et al: Construction of Nonbiofouling Surfaces By Polymeric Self-Assembled Monolayers, Langmuir, The ACS Journal of Surfaces and Collids, vol. 19, No. 24, Nov. 2003, pp. 9989-9993.

Niels C. Kaarsholm et al: Ionization Behavior of Native and Mutant Insulins: PK Perturbation of B13-GLU in Aggregated Species, Archives of Biochemistry and Biophysics vol. 283, No. 2, December, pp. 496-502, 1990.

Alp Kacar et al: A Novel Artificial Pancreas: Energy Efficient Valveless Piezoelectric Actuated Closed-Loop Insulin Pump for T1DM, Appl. Sci. 2020, 10, 5294, pp. 1-18.

Hanne M. Kinnunen et al: A Novel in Vitro Method to Model the Fate of Subcutaneously Administered Biopharmaceuticals and Associated Formulation Components, Journal of Controlled Release 214, 2015, pp. 94-102.

Gjermund Kittilsland et al: A Sub-Micron Particle Filter in Silicon, Sensors and Actuators, A21-A23, 1990, pp. 904-907.

Michelle M. Knoll et al: Air Occlusion in Insulin Pumps of Children and Adolescents With Type 1 Diabetes, J Pediatr Endocrinol Metab 2019, pp. 1-6.

Jennifer L. Knopp et al: A Finite Element Model for Insulin Adsorption in ICU Infusion Sets, IEEE, 2019, pp. 1682-1685.

Tzong-Shyng Leu et al: Design and Operation of a Bio-Inspired Micropump Based on Blood-Sucking Mechanism of Mosquitoes, Modern Physics Letters B, vol. 32, Nos. 12 & 13, 2018, 1840027, pp. 1-5.

Yu-Chih Lin et al: Experimental and Numerical Investigation of Resonance Characteristics of Novel Pumping Element Driven By Two Piezoelectric Bimorphs, Appl. Sci. 2019, 9, 1234, pp. 1-20.

Caitlin L. Maikawa et al: Stable Monomeric Insulin Formulations Enables By Supramolecular Pegylation of Insulin Analogues, Adv. Therap. 2019, 1900094, pp. 1-9.

Christelle Mathe et al: Structural Determinants for Protein Adsorption/Non-Adsportion to Silica Surface, PLOS ONE, Nov. 2013, vol. 8, Issue 11, e81346, pp. 1-13.

Gerard A. Maugin: Continuum Mechanics Through the Twentieth Century: a Concise Historical Perspective, Solid Mechanics and Its Applications, vol. 196, 2013, pp. 1-320.

Elaine Mcvey et al: Evaluation of Intradermal and Subcutaneous Infusion Set Performance Under 24-Hour Basal and Bolus Conditions, Journal of Diabetes Science and Technology 2015, vol. 9(6), pp. 1282-1291.

Matej Mozek et al: Determination of Essential Parameter for Quality Control in Fabrication of Piezoelectric Micropumps, Quality Management and Quality Control—New Trends and Developments, pp. 1-19.

Majid Nabavi: Steady and Unsteady Flow Analysis in Microdiffusers and Micropumps: a Critical Review, Microfluid Nanofluid, 2009, 7, pp. 599-619.

(56) References Cited

OTHER PUBLICATIONS

Shiori Nakazawa et al: Analysis of Oligomeric Stability of Insulin Analogs Using Hydrogen Deuterium Exchange Mass Spectrometry, Anal. Biochem. 420, 2012, pp. 61-67.

Marjan A. Nejad et al: Insulin Adsorption on Crystalline SiO2— Comparison Between Polar and Nonpolar Surfaces Using Accelerated Molecular Dynamics Simulations, Chemical Physics Letters 670, 2017, pp. 77-83.

Zhenhai Pan et al: Direct Measurement of Microscale Flow Structures Induced By Inertial Focusing of Single Particle and Particle Trains in a Confined Microchannel, Physics of Fluids 30, 102005, 2018, pp. 1-11.

Ian Papautsky et al: Laminar Fluid Behavior in Microchannels Using Micropolar Fluid Theory, Sensors and Actuators 73, 1999, pp. 101-108.

J Pfahler et al: Liquid Transport in Micron and Submicron Channels, Sensors and Actuators, A21-A23, 1990, pp. 431-434.

Cecilia Prudkin-Silva et al: Combined Experimental and Molecular Simulation Study of Insulin—Chitosan Complexation Driven By Electrostatic Interactions, J. Chem. Inf. Model. 2020, 60, pp. 854-865.

P Nageswara Rao et al: Fabrication of Microchannels on Stainless Steel By Wet Chemical Etching, J. Micromech. Microeng. 17, 2007, N99-N106.

Eric Renard et al: Lower Rate of Intial Failures and Reduced Occurrence of Adverse Events With a New Catheter Model for Continuous Subcutaneous Insulin Infusion: Prospective, Two-Period, Observational, Multicenter Study, Diabetes Technology & Therapeutics vol. 12, No. 10, 2010, pp. 769-773.

Remi Revellin et al: Characterization of Diabatic Two-Phase Flows in Microchannels: Flow Parameter Results for R-134A in a 0.5MM Channel, International Journal of Multiphase Flow 32, 2006, pp. 755-774.

A. Shabanian et al: A Novel Piezo Actuated High Stroke Membrane for Micropumps, Microelectronic Engineering, Mar. 2016, pp. 1-8.

P. R. Shorten et al: Insulin Transport Within Skeletal Muscle Transverse Tubule Networks, Biophysical Journal vol. 93, Nov. 2007, pp. 3001-3007.

Woo Young Sim et al: A Phase-Change Type Micropump With Aluminum Flap Valves, J. Micromech. Microeng. 13, 2003, pp. 286-294.

Gabriela Voskerician et al: Biocompatibility and Biofouling of MEMS Drug Delivery Devices, Biomaterials 24, 2003, pp. 1959-1967.

Yi-Chun Wang et al: Loss Characteristics and Flow Rectification Property of Diffuser Valves for Micropump Applications, International Journal of Heat and Mass Transfer 52, 2009, pp. 328-336.

Bin Wang et al: An Experimental Study of Pulsed Micro-Flows Pertinent to Continuous Subcutaneous Insulin Infusion Therapy, Exp Fluids, 2011, 51, pp. 65-74.

Xue Yan Wang et al: High Flow-Rate Piezoelectric Micropump With Two Fixed Ends Polydimethylsiloxane Valves and Compressible Spaces, Sensors and Actuators A 218, 2014, pp. 94-104.

Roger D. Whitley et al: Effects of Protein Aggregation in Lsocratic Nonlinear Chromatography, AlChE Journal, vol. 37, No. 4, Apr. 1991, pp. 555-568.

Peter Wilding et al: Manipulation and Flow of Biological Fluids in Straight Channels Micromachines in Silicon, Clinical Chemistry, vol. 40, No. 1, 1994, pp. 43-47.

Jason Wong et al: A Subcutaneous Insulin Pharmacokinetic Model for Computer Simulation in a Diabetes Decision Support Role-Model Structure and Parameter Identification, Journal of Diabetes Science and Technology vol. 2, Issue 4, Jul. 2008, pp. 658-671.

Jennifer E.I. Wright et al: Electrochemical Impedance Spectroscopy and Quartz Crystal Nanobalance (EQCN) Studies of Insulin Adsorption on PT, Journal of Electroanalytical Chemistry 564, 2004, pp. 185-197.

Yang Ye et al: Valve Improvement for High Flow Rate Piezoelectric Pump With PDMS Film Valves, Sensors and Actuators A, 2018, pp. 1-18.

Michael M. Zedelmair et al: Numerical Simulation of Insulin Depot Formation in Subcutaneous Tissues Comparing Different Cannula Geometries, Nov. 2016, pp. 1-8.

Ershuai Zhang et al: Tissue Response to Subcutaneous Infusion Catheter, Journal of Diabetes Science and Technology, pp. 1-7.

W. D. Lougheed et al: Insulin Aggregation in Artificial Delivery Systems, Diabetologia 19, 1980, pp. 1-9.

Nelson B. Phillips et al: Insulin Fibrillation and Protein Design: Topological Resistance of Single-Chain Analogs to Thermal Degradation With Application to a Pump Reservoir, Journal of Diabetes Science and Technology vol. 6, Issue 2, Mar. 2012, pp. 277-288.

Regine Bousquet-Rouaud et al: Factors Involved in Catheter Obstruction During Long-Term Peritoneal Insulin Infusion, Diabetes Care, vol. 16, No. 5, May 1993, pp. 801-805.

V. Feingold et al: Effect of Contact Material on Vibration-Induced Insulin Aggregation, Diabetologia, 1984, 27, pp. 373-378.

Dolly Jacob: Investigation Into Reliability and Performance of an Implantable Closed-Loop Insulin Delivery Device, Dec. 2014, pp. 1-328.

S.H. Mollmann et al: Adsorption of Human Insulin and ASPB28 Insulin on a PTFE-Like Surface, Journal of Colloid and Interface Science 286, 2005, pp. 28-35.

Scott D. Sharrow et al: 14-Day in Vitro Chemical Stability of Insulin Lispro in the Minimed Paradigm Pump, Diabetes Technology & Therapeutics vol. 14, No. 3, 2012, pp. 264-270.

T. Lemke et al: A High Performance Bidirectional Micropump Utilizing Advanced Low Voltage Piezo Multilayer Actuator Technology for a Novel Artificial Sphincter System, IFMBE Proceedings 22, 2008, pp. 1517-1518.

M. Rabold et al: The Concealed Blister Test: An Implementable Test Method for a Non-Destructive Strength-Characterization of Full-Wafer-Bonds, ECS Transactions, 16 (8), 2008, pp. 465-472.

M. Rabold et al: Surface-Energy Characterization of Full-Wafer Bonds Using the Concealed Blister Test Method, Electrochemical and Solid-State Letters, 12(5), 2009, H176-H178.

G. Biancuzzi et al: An Efficient Low-Voltage Micropump for an Implantable Sphincter System, IFMBE Proceedings 22, 2008, pp. 2360-2363.

G. Biancuzzi et al: Low Power Electronics for Square-Wave Piezoactuator Driving, Proceedings of the ASME 2009 International Mechanical Engineering Congress & Exposition IMECE 2009, Nov. 2009, pp. 1-8.

G Biancuzzi et al: Design and Simulation of Advanced Charge Recovery Piezoactuator Drivers, J. Micromech. Microeng. 20, 2010, 105022, pp. 1-12.

Giovanni Biancuzzi et al: Performance of Piezoelectric Micropumps Actuated By Charge Recovery, Procedia Chemistry 1, 2009, pp. 698-701.

Giovanni Biancuzzi et al: A Dynamic Linearization Concept for Piezoelectric Actuators, IEEE Transactions on Ultrasonics, Ferroelectrics, and Frequency Control, vol. 58, No. 4, Apr. 2011, pp. 689-697.

Giovanni Biancuzzi: Advanced Piezoactuator Driving: Modeling and Application to Piezoelectric Microactuation, Sep. 2011, pp. 3-166.

Muhammad bin Mansoor et al: Parametric Modeling and Experimental Characterization of a Nonlinear Resonant Piezoelectric Actuator Designed for Turbulence Manipulation, Sensors and Actuators A, Feb. 2017, pp. 1-15.

Detlef Bonfert et al: Sensing Properties of Carbon Nanotube Based Thick Film Layers on Foils, 2013 IEEE 19th International Symposium for Design and Technology in Electronic Packaging, pp. 25-30.

Binal P Bruno et al: Properties of Piezoceramic Materials in High Electric Field Actuator Applications, Smart Mater. Struct. 28, 2019, 015029, pp. 1-14.

Blanca Cervantes et al: Cytotoxicity Evaluation of Anatase and Rutile TiO2 Thin Films on CHO-K1 Cells in Vitro, Materials 2016, 9, 619, pp. 1-11.

Arne Simon Dannenberg: Einweg-Mikro-Membranpumpen Mit Trennbarer Aktorik Zur Insulindosierung, 2016, pp. 1-147.

(56)        References Cited

OTHER PUBLICATIONS

A. Doll et al: A Piezoelectric Bidirectional Micropump for a Medical Application, Proceeding of IMECE04-61083, Nov. 2004, pp. 1-9.
Alexander Doll et al: Low Temperature Plasma-Assisted Wafer Bonding and Bond-Interface Stress Characterization, 2004, pp. 665-668.
Alexander Doll et al: Versatile Low Temperature Wafer Bonding and Bond Strength Measurement By a Blister Test Method, Microsyst Technol, 2006, 12: pp. 418-429.
A. Doll et al: A High Performance Bidirectional Micropump for a Novel Artificial Sphincter System, Sensors and Actuators A 130-131, 2006, pp. 445-453.
Alexander Doll: Development of a High-Performance Micropump for a Sphincter Prosthesis 2007, pp. 1-191.
Alexander F. Doll et al: A Novel Artificial Sphincter Prosthesis Driven By a Four-Membrane Silicon Micropump, Sensors and Actuators A 139, 2007, pp. 203-209.
A. Doll et al: Characterization of Active Silicon Microvalves With Piezoelectric Membrane Actuators, Microelectronic Engineering 84, 2007, pp. 1202-1206.
M. Feil et al: Ultra Thin ICS and MEMS Elements: Techniques for Wafer Thinning, Stress-Free Separation, Assembly and Interconnection, Microsystem Technologies 9, 2003, pp. 176-182.
Jan Felba et al: Properties of Conductive Microstructures Containing Nano Sized Silver Particles, 2009 11th Electronics Packaging Technology Conference, pp. 879-883.
H. Feth et al: Design and Characterization of a Low-Voltage Piezoelectrically Actuated Polymer Membrane, Transducers '11, 2011, pp. 470-473.
H. Feth et al: Design, Fabrication and Characterization of a Piezoelectrically Actuated Bidirectional Polymer Micropump, Microsyst Technol, 2013.
Christoph Friese et al: Piezoelectric Microactuators in Polymer-Composite Technology, The 12th International Conference on Solid State Sensors, Actuators and Microsystem, Jun. 2003, pp. 1007-1010.
Ranjan Ganguly et al: Field-Assisted Self-Assembly of Superparamagnetic Nanoparticles for Biomedical, MEMS and BioMEMS Applications, Advances in Applied Mechanics, vol. 41, pp. 1-43.
A. Geipel et al: Pressure-Independent Micropump With Piezoelectric Valves for Low Flow Drug Delivery Systems, MEMS 2006, pp. 786-789.
A. Geipel et al: A Novel Two-Stage Backpressure-Independent Micropump: Modeling and Characterization, J. Micromech. Microeng. 17, 2007, pp. 949-959.
A. Geipel et al: An Implantable Active Microport Based On a Self-Priming High-Performance Two-Stage Micropump, Sensors and Actuators A 145-146, 2008, pp. 414-422.
A. Geipel et al: Design of an Implantable Active Microport System for Patient Specific Drug Release, Biomed Microdevices, 2008, 10, pp. 469-478.
Andreas Geipel: Novel Two-Stage Peristaltic Micropump Optimized for Automated Drug Delivery and Integration Into Polymer Microfluidic Systems, 2008, pp. 1-175.
P. Gkotsis et al: Mechanical Characterization of Functional Piezoelectric Thin Films Using Tensile and Bulge Testing, 2011, pp. 1-48.
Frank Goldschmidtboeing et al: Strategies for Void-Free Liquid Filling of Micro Cavities, J. Micromech. Microeng. May 16, 2006, pp. 1321-1330.
F. Goldschmidtboeing et al: Capillary Filling of Micro-Reservoirs With Various Cross Sections, The 12th International Conference on Solid State Sensors, Actuators and Microsystems, Transducers '03, 2003, pp. 1883-1886.
Frank Goldschmidtböing et al: Numerical Simulation of Free Jet Formation and Breakdown By the Volume-Of-Fluid Method, Microfluidics, BioMEMS, and Medical Microsystems, Proceedings of SPIE vol. 4982, 2003, pp. 272-281.

F Goldschmidtboing et al: A Generic Analytical Model for Micro-Diaphragm Pumps With Active Valves, J. Micromech. Microeng. 15, 2005, pp. 673-683.
Frank Goldschmidtböing et al: Design of Micro Diaphragm Pumps With Active Valves, Proceedings of FEDSM2006-98506, Jul. 2006, pp. 1-9.
Frank Goldschmidtböing et al: Silicon Microfabrication for Microfluidics, Advanced Micro and Nanosystems vol. 5. Micro Process Engineering, 2006, pp. 321-351.
F. Goldschmidtboeing et al: A Miniaturized Pressure Independent Drug Delivery System for Metronomic Cancer Therapy, ECIFMBE 2008, IFMBE Proceedings 22, pp. 2356-2359, 2008.
M. Herz et al: A Novel High Performance Micropump for Medical Applications, Actuator 2008, pp. 1-4.
M. Herz et al: An Industrialised Silicon Micropump for Precise Liquid Dosing, European Meeting on Microflow Metrology, Jun. 24, 2009.
M. Herz et al: Modeling, Fabrication and Characterization of a High-Performance Micropump, 2010, pp. 1083-1086.
Markus Herz et al: Design of Ideal Circular Bending Actuators for High Performance Micropumps, Sensors and Actuators A 163, 2010, pp. 231-239.
Markus Ham Heart: Optimizing the Delivery Rate of a Piezoelectric High-Performance Micropump, 2011, pp. 1-118.
Till Huesgen et al: Optimization and Characterization of Wafer-Level Adhesive Bonding With Patterned Dry-Film Photoresist for 3D MEMS Integration, Sensors and Actuators A 162, 2010, pp. 137-144.
C. Jenke et al: Flow Rate Influencing Effects of Micropumps, Sensors and Actuators A 276, 2018, pp. 335-345.
JewelPUMP: A New Diabetic Life Style, pp. 1-3.
Bernadette Kinzel et al: A Novel Micropump Driver Used in Environmental Sensor Applications, 2016, pp. 1-3.
Norbert Kockmann et al: Fluid Dynamics and Transfer Processes in Bended Microchannels, Heat Transfer Engineering, 2005, 26:3, pp. 71-78.
Christof Landesberger et al: New Dicing and Thinning Concept Improves Mechanical Reliability of Ultra Thin Silicon, 2001 International Symposium on Advanced Packaging Materials, pp. 92-97.
T. Lemke et al: High Performance Micropumps Utilizing Multilayer Piezo Actuators, pp. 589-592.
Thomas Lemke et al: Fabrication of Normally-Closed Bidirectional Micropumps in Silicon-Polymer Technology Featuring Photopatternable Silicone Valve Lips, Sensors and Actuators A 168, 2011, pp. 213-222.
Lemke: Design of Microsystems vol. 6, 2012, pp. 1-194.
Florian Lemke et al: Multiphysics Simulation of the Aspherical Deformation of Piezo-Glass Membrane Lenses Including Hysteresis, Fabrication and Nonlinear Effects, 2019, Smart Mater. Struct., 28, 055024, pp. 1-13.
Didier Maillefer et al: A High-Performance Silicon Micropump for an Implantable Drug Delivery System, 1999, pp. 541-546.
Muhammad bin Mansoor et al: Design, Characterization and Sensitivity Analysis of a Piezoelectric Ceramic/Metal Composite Transducer, Micromachines 2017, 8, 271, pp. 1-10.
Muhammad bin Mansoor: Nonlinear Resonant Piezoelectric Actuators for Turbulence Manipulation, May 2019, pp. 1-185.
S. Hoda Moosavi et al: Cost Effective MEMS Fabrication of a Nanowire Characterization Platform With Solder Coated Electrodes, Sensors and Actuators A, 2016, pp. 1-8.
Nagarajan Palavesam et al: Electrical Behaviour of Flip-Chip Bonded Thin Silicon Chip-On-Foil Assembly During Bending, 2015 IEEE 21 international Symposium/or Design and Technology in Electronic Packaging (SIITME), 2015, pp. 367-372.
P. Pertsch et al: Reliability of Piezoelectric Multilayer Actuators, Contribution to the Actuator 2006 conference, 2006, pp. 1-3.
Rabold: Non-Destructive Adhesion Strength Characterization of Full-Wafer Bond Joints, Technical measurement 73, 2006, 1, pp. 43-50.
M. Rabold et al: Low Temperature Wafer Bonding: Plasma Assisted Silicon Direct Bonding Vs. Silicon-Gold Eutectic Bonding, ECS Transactions, 16 (8), 499-506, 2008.

(56)          References Cited

OTHER PUBLICATIONS

M. Rabold et al: Surface-Energy Characterization of Full-Wafer Bonds Using the Concealed Blister Test Method, Electrochemical and Solid-State Letters, 12 (5), H176-H178, 2009.

M Richter et al: Development of a Multi-Material Micropump, Proc. IMechE vol. 220 Part C: J. Mechanical Engineering Science, 2006, pp. 1619-1624.

M. Richter et al: Miniaturized Drug Delivery System Tudos With Accurate Metering of Microliter Volumes, AMA Conferences 2013—Sensor 2013, OPTO 2013, IRS 2013, pp. 420-425.

Olaf Ruthmann et al: The First Teleautomatic Low-Voltage Prosthesis With Multiple Therapeutic Applications: A New Version of the German Artificial Sphincter System, Artificial Organs 34(8), pp. 635-641.

Oleg Sakolski et al: A Feedforward Compensated High-Voltage Linear Regulator With Fast Response, High-Current Sinking Capability, IEEE Solid-State Circuits Letters, 2020, pp. 1-4.

Hans-J. Schrag et al: Development of a Novel, Remote-Controlled Artificial Bowel Sphincter Through Microsystems Technology, Artificial Organs, 2006, 30(11), pp. 855-862.

A. Shabanian et al: A Novel Piezo Actuated High Stroke Membrane for Micropumps, Microelectronics Engineering, 2016, pp. 1-8.

A. Shabanian et al: Low-Cost, High-Performance and Modular Valves and Pumps Using High-Stroke Actuators for Fluid Handling, pp. 1-2.

Ardavan Shabanian et al: The Deformable Valve Pump (DVP), Transducers 2017, 2017, pp. 1777-1780.

A. Shabanian et al: Low Fluidic Resistance Valves Utilizing Buckling Actuators, MikroSystemTechnik Kongress 2017, 2017, pp. 211-214.

Florian Thoma et al: A Highly Integrated Dosing System for Drug Delivery Applications, 17th International Conference on Miniaturized Systems for Chemistry and Life Sciences, pp. 826-828.

Florian Thoma et al: Stress-Free Bonding Technology With Pyrex for Highly Integrated 3D Fluidic Microsystems, Micromachines 2014, 5, pp. 783-796.

Florian Thoma et al: A New Concept of a Drug Delivery System With Improved Precision and Patient Safety Features, Micromachines 2015, 6, pp. 80-95.

F. Trenkle et al: Normally-Closed Peristaltic Micropump With Re-Usable Actuator and Disposable Fluidic Chip, Procedia Chemistry 1, 2009, pp. 1515-1518.

F. Trenkle et al: Normally-Closed Peristaltic Micropump With Re-Usable Actuator and Disposable Fluidic Chip, Sensors and Actuators B 154, 2011, pp. 137-141.

Trenkle: A Normally-Closed, Backpressure Independent Peristaltic Micropump Featuring a Modular Setup, 2011, pp. 1-115.

H. Van Brussel et al: Assembly of Microsystems, Annals of the CIRP vol. 49/2/2000, pp. 451-472.

M Wischke et al: Assessing the Elastostriction and the Electrostriction Parameter of Bulk PZT Ceramics, Smart Mater. Struct., 19, 2010, 085003, pp. 1-7.

P. Woias et al: A Silicon Micropump With a High Bubble Tolerance and Self-Priming Capability, 1998, pp. 383-386.

Jung In Yang: Reliability and Aging in Patterned Pb(Zr0.52Ti0.48)O3 FILMS, 2016, pp. 1-182.

Meiling Zhu et al: Optimization Design of Multi-Material Micropump Using Finite Element Method, Sensors and Actuators A: Physical, vol. 149, Issue 1, Jan. 15, 2009, pp. 130-135.

Meiling Zhu et al: Modelling and Simulation of Piezoelectric Actuation and Reliability of Micropumps, Multi-Material Micro Manufacture, 2006, pp. 263-266.

Starting Parameters, pp. 1-4.

Steven R. Anton et al: Bending Strength of Piezoelectric Ceramics and Single Crystals for Multifunctional Load-Bearing Applications, IEEE Transactions on Ultrasonics, Ferroelectrics, and Frequency Control, vol. 59, No. 6, Jun. 2012, pp. 1085-1092.

Ayankola O. Ayansiji et al: Constitutive Relationship and Governing Physical Properties for Magnetophoresis, PNAS Latest Articles, 2020, pp. 1-7.

Ronan Daly et al: Inkjet Printing for Pharmaceutics—A Review of Research and Manufacturing, International Journal of Pharmaceutics, 2015, pp. 1-14.

A. C. E. Dent et al: Tensile Strength of Active Fibre Composites—Prediction and Measurement, Ferroelectrics, 368:209-215, 2008.

B. Derby: Inkjet Printing Ceramics: From Drops to Solid, Journal of the European Ceramic Society 31 (2011) 2543-2550.

Shuxiang Dong et al: Analytical Solutions for the Traverse Deflection of a Piezoelectric Circular Axisymmetric Unimorph Actuator, IEEE Transactions on Ultrasonics Ferroelectrics and Frequency Control, vol. 54, No. 6, Jun. 2007, pp. 1240-1249.

Beray Erol et al: The Effect of the Chelator Characteristics on Insulin Adsorption in Immobilized Metal Affinity Chromatography, Process Biochemistry 83, 2019, pp. 104-113.

Mostafa Habibi et al. Stability Analysis of an Electrically Cylindrical Nanoshell Reinforced With Graphene Nanoplatelets, Composites Part B, 2019, pp. 1-41.

Yi-Chu Hsu et al: An Experimental and Numerical Investigation Into the Effects of the PZT Actuator Shape in Polymethylmethacrylate (PMMA) Peristaltic Micropumps, Microsyst Technol (2009) 15:565-571.

M G Kibria et al: Comprehensive Investigation of Sequential Plasma Activated Si/Si Bonded Interfaces for Nano-Integration on the Wafer Scale, Nanotechnology 21 (2010) 134011, pp. 1-10.

Norbert Kockmann et al: Convective Mixing and Chemical Reactions in Microchannels With High Flow Rates, Sensors and Actuators B 117 (2006) 495-508.

J.G. Liu et al: A Constitutive Model for Modeling of the Deformation Behavior in Microforming With a Consideration of Grain Boundary Strengthening, Computational Materials Science 55 (2012) 85-94.

Chuan Luo et al: Effects of Added Mass on Lead-Zirconate-Titanate Thin-Film Microactuators in Aqueous Environments, Journal of Vibration and Acoustics, Dec. 2016, vol. 138.

Yingying Ma et al: Fluorescent Silicon Nanoparticles Inhibit the Amyloid Fibrillation of Insulin, Journal of Materials Chemistry B, 2019.

Xiaolei Xiao et al: A Waveform Design Method for Piezoelectric Inkjet Printhead With Doppler Vibration Test and Numerical Simulation, Microelectronic Engineering 196 (2018) 13-19.

Yuvaraja M et al: Comparative Study on Vibration Characteristics of a Flexible GFRP Composite Beam Using SMA and PZT Actuators, Procedia Engineering 64 (2013) 571-581.

Roland Zengerle et al: Simulation of Microfluid Systems, J. Micromech. Microeng. 4 (1994) 192-204.

J. Ulrich et al: Simulation of a Bidirectional Pumping Microvalve Using FEM, Proc. Eurosensors X, Sep. 8-11, 1996, pp. 1241-1244.

M. Stehr et al: The Selfpriming Vamp, 1997 International Conference on Solid-State Sensors and Actuators, Transducers '97, 1997, pp. 351-352.

Jens Ducrée et al: Microfluidics, MEMS: Design, Analysis, and Applications, pp. 667-727.

D. Mark et al: Microfluidic Lab-On-A-Chip Platforms: Requirements, Characteristics and Applications, Microfluidics Based Microsystems: Fundamentals and Applications, 2010, pp. 305-376.

K Kalkandjiev et al: Microfluidics in Silicon/Polymer Technology as a Cost-Efficient Alternative to Silicon/Glass, J. Micromech. Microeng. 21 (2011) 025008, pp. 1-8.

T. Brettschneider et al: Integration of CMOS Biosensor Into a Polymeric Lab-On-A-Chip System, World Academy of Science, Engineering and Technology 80, 2013, pp. 424-428.

M. Richter et al: Robust Design of Gas and Liquid Micropumps, Sensors and Actuators A 68 (1998) 480-486.

Ansgar Wego et al: Fluidic Microsystems Based on Printed Circuit Board Technology, J. Micromech. Microeng. 11 (2001) 528-531.

Wolfgang F. Richter et al: Mechanistic Determinants of Biotherapeutics Absorption Following SC Administration, The AAPS Journal, vol. 14, No. 3, Sep. 2012, pp. 559-570.

Merle Allerdißen et al: Microfluidic Microchemomechanical Systems, Advances in Science and Technology vol. 81, 2013, pp. 84-89.

Peter Woias: Micropumps—Past, Progress and Future Prospects, Sensors and Actuators B 105 (2005) 28-38.

(56) References Cited

OTHER PUBLICATIONS

Jesús Berián et al: A Wearable Closed-Loop Insulin Delivery System Based on Low-Power Socs, Electronics 2019, 8, 612, pp. 1-19.

Bharat Bhushan: Nanotribology and Nanomechanics of MEMS/NEMS and BioMEMS/BioNEMS Materials and Devices, Nanotribology and Nanomechanics, 2017, pp. 797-907.

Jiandong Fang et al: Self-Assembly of PZT Actuators for Micropumps With High Process Repeatability, Journal of Microelectromechanical Systems, vol. 15, No. 4, Aug. 2006, pp. 871-878.

Tingting Tan et al: Structure and Optical Properties of HfO2 Thin Films on Silicon After Rapid Thermal Annealing, Optical Materials 32 (2010) 432-435.

Matthew Hurley: Stick to Skin: a New Way for Medical Wearables, 3M Medical Materials & Technologies, 2019, pp. 1-4.

Charlene Vance et al: The Engineer's Guide to Wearables: Lessons Learned From Design Mishaps, 3M Medical Materials & Technologies, 2019, pp. 1-24.

Adhesives Research: Skin-Friendly Innovative Solutions, 2019, pp. 1-6.

Priya Thota: MED 5750A: Wear-Time Comparison of Three Pressure-Sensitive Acrylic Skin Adhesives, Vancive Medical Technologies, 2017, pp. 1-10.

ESSR—European Search Report for corresponding European patent application EP20877277A.

Yagmur Akin Yildirim et al: Piezoelectric Membrane Actuators for Micropump Applications Using PVDF-TRFE, Journal of Microelectromechanical Systems, 2017, pp. 1-9.

Raffaele Ardito et al: On the Application of Piezolaminated Composites to Diaphragm Micropumps, Composite Structures 99 (2013) 231-240.

Hamid Asadi Dereshgi et al: Displacement Analysis of a Piezoelectric Based Multi-Layered Micropump Diaphragm, Iranian Journal of Science and Technology, Transactions of Mechanical Engineering, May 9, 2020, pp. 1-14.

Zunqiang Fan et al: Study on the Large Flow Rate Piezoelectric Mini-Pump With Metal Check Valve, Proceedings of the 2009 IEEE International Conference on Mechatronics and Automation, pp. 4294-4298.

Xiuhua He et al: Dynamics Modeling and Vibration Analysis of a Piezoelectric Diaphragm Applied in Valveless Micropump, Journal of Sound and Vibration 405 (2017) 133-143.

Ling-Sheng Jang et al: Parameter Extraction From BVD Electrical Model of PZT Actuator of Micropumps Using Time-Domain Measurement Technique, Microfluid Nanofluid (2009) 7:559-568.

Sanjay Kumar Jha et al: Desgin and Fabrication of a Three Dimensional Valveless Micropump With Shape Deposition Manufacturing Process (SDM), International Journal of Research in Engineering & Applied Sciences, vol. 2, Issue 2 (Feb. 2012), pp. 805-824.

Jianke Kang et al: A Self-Priming, High Performance, Check Valve Diaphragm Micropump Made From SOI Wafers, J. Micromech. Microeng. 18 (2008) 125021, pp. 1-8.

Veronika Kovacova: Study of Correlations Between Microstructure and Piezoelectric Properties of PZT Thin Films, Université Grenoble Alpes, 2016, pp. 1-206.

Chuan Luo et al: Development of a Lead-Zirconate-Titanate (PZT) Thin-Film Microactuator Probe for Intracochlear Applications, Sensors and Actuators A 201 (2013) 1-9.

Chuan Luo et al: Effects of Added Mass on Lead-Zirconate-Titanate Thin-Film Microactuators in Aqueous Environments, Journal of Vibration and Acoustics, Dec. 2016, vol. 138, pp. 1-10.

Yu Ting Ma et al: Note: A Valve-Type Piezoelectric Reciprocating Pump With Secondary Resonant Vibrator, Review of Scientific Instruments 87, 016104 (2016), pp. 1-4.

B. Neff et al: Development and Characterization of MEMS Membranes Based on Thin-Film PZT Actuators for Microfluidic Applications, 2018 19th International Conference on Thermal, Mechanical and Multi-Physics Simulation and Experiments in Microelectronics and Microsystems (EuroSimE), IEEE, 2018, pp. 1-5.

Hyunsu Park: Toward Reliable Implantable Devices: Addressing Biotic and Abiotic Failure Modes in Microscale Medical Devices, Dissertation, Weldon School of Biomedical Engineering, May 2020, pp. 1-108.

Christian Stiker: Characterization and Fabrication of Thin Film PZT Layer for Direction Finding MEMS Sensors, Thesis, Calhoun: The NPS Institutional Archive, Dec. 2019, pp. 1-83.

Xue Yan Wang et al: A Compact and High Flow-Rate Piezoelectric Micropump With a Folded Vibrator, Smart Mater. Struct. 23 (2014) 115005, Sep. 19, 2014, pp. 1-11.

Chia-Che Wu et al: Effects of Corner Frequency on Bandwidth and Resonance Amplitude in Designing PZT Thin-Film Actuators, Sensors and Actuators A 125 (2006) 178-185.

Eui-Hyeok (EH) Yang et al: Thin-Film Piezoelectric Unimorph Actuator-Based Deformable Mirror With a Transferred Silicon Membrane, Journal of Microelectromechanical Systems, vol. 15, No. 5, Oct. 2006, pp. 1214-1225.

Sophie Borot et al: Accuracy of a New Patch Pump Based on a Microelectromechanical System (MEMS) Compared to Other Commercially Available Insulin Pumps: Results of the First in Vitro and in Vivo Studies, Journal of Diabetes Science and Technology 2014, vol. 8(6) 1133-1141.

Robert D. Butterfield et al: Performance of a Continuous Subcutaneous Insulin Infusion (CSII) Pump With Acoustic Volume and Flow Sensing in Simulated High-Consequence Situations, IEEE Open Journal of Engineering in Medicine and Biology, p. 1-7.

Katharina Laubner et al: Comparative Dose Accuracy of Durable and Patch Insulin Pumps Under Laboratory Conditions, Diabetes Technology & Therapeutics vol. 21, No. 7, 2019, pp. 371-378.

Howard Zisser et al: Novel Methodology to Determine the Accuracy of the Omnipod Insulin Pump: A Key Component of the Artificial Pancreas System, Journal of Diabetes Science and Technology vol. 5, Issue 6, Nov. 2011, pp. 1509-1518.

Yasser Aboelkassem: A Ghost-Valve Micropumping Paradigm for Biomedical Applications, Biomed Eng Lett (2015) 5:45-50.

Akam Aboubakri et al: Modeling of a Passive-Valve Piezoelectric Micro-Pump: A Parametric Study, Micromachines 2020, 11, 752, pp. 1-13.

Anthony K. Au et al: Microvalves and Micropumps for BioMEMS, Micromachines 2011, 2, 179-220.

Gia Thinh Bui et al: Optimization of Micropump Performance Utilizing a Single Membrane With an Active Check Valve, Micromachines 2018, 9, 1, pp. 1-10.

Zubair Butt et al: Characterizing Barium Titanate Piezoelectric Material Using the Finite Element Method, Transactions on Electrical and Electronic Materials vol. 18, No. 3, pp. 163-168, Jun. 25, 2017.

L. Cornaggia et al: Passive Flow Control Valve for Protein Delivery, Cogent Engineering (2017), 4: 1413923, pp. 1-20.

Eric Chappel: Design and Characterization of a Passive Flow Control Valve Dedicated to the Hydrocephalus Treatment, Cogent Engineering (2016), 3: 1247612, pp. 1-13.

E. Chappel et al: Hybrid Hydrodynamic Characteristic for Hydrocephalus Valve: A Numerical Investigation Using Electrical Equivalent Networks, Cogent Engineering (2017), 4:1415103, pp. 1-16.

Luc Conti et al: Silicon-To-Silicon Anodic Bonding Via Intermediate Borosilicate Layer for Passive Flow Control Valves, Jul. 2018, pp. 1-5.

Po-Jui Chen et al: Floating-Disk Parylene Microvalves for Self-Pressure-Regulating Flow Controls, Journal of Microelectromechanical Systems, vol. 17, No. 6, Dec. 2008, pp. 1352-1361.

Song Chen et al: A Normally-Closed Piezoelectric Micro-Valve With Flexible Stopper, AIP Advances 6, 045112 (2016), pp. 1-10.

Chiang-Ho Cheng et al: Characteristic Studies of the Piezoelectrically Actuated Micropump With Check Valve, Microsyst Technol, Jun. 19, 2013, pp. 1-9.

S. Derakhshan et al: Performance Improvement and Two-Phase Flow Study of a Piezoelectric Micropump With Tesla Nozzle-Diffuser Microvalves, Journal of Applied Fluid Mechanics, vol. 12, No. 2, pp. 341-350, 2019.

Ii Doh et al: A Passive Flow-Rate Regulator Using Pressure-Dependent Autonomous Deflection of Parallel Membrane Valves, 2009, pp. 573-576.

(56) References Cited

OTHER PUBLICATIONS

Chappel Eric et al: Experimental Characterization and Modelling of Microfluidic Radial Diffusers for Passive Self-Regulating Valves, Global Journal of Engineering and Technology Advances, 2019, 01(01), 010-021.

Torsten Gerlach: Microdiffusers as Dynamic Passive Valves for Micropump Applications, Sensors and Actuators A 69 (1998) 181-191.

D.T. Graham et al: The Effects of Freezing on Commercial Insulin Suspensions, International Journal of Pharmaceutics, 1 (1978) 315-322.

Arun Gunda et al: Proportional Microvalve Using a Unimorph Piezoelectric Microactuator, Micromachines 2020, 11, 130, pp. 1-15.

Xiuhua He et al: The Analysis of Internal Transient Flow and the Performance of Valveless Piezoelectric Micropumps With Planar Diffuser/Nozzles Elements, Microsyst Technol, Oct. 19, 2015, pp. 1-15.

Honeywell: Micropressure Board Mount Pressure Sensors, MPR Series—Compact, High Accuracy, Compensated/Amplified, 32332628, Issue C, Sensing and Internet of Things, pp. 1-19.

Hamza Landari et al: Biocompatible Compact Micropump With Integrated Unidirectional Microvalves for Low Pressure Microfluidic Applications, Sensors and Actuators A, Mar. 29, 2018, pp. 1-33.

Tao Li et al: Compact, Power-Efficient Architectures Using Microvalves and Microsensors, for Intrathecal, Insulin, and Other Drug Delivery Systems, Advanced Drug Delivery Reviews 64 (2012) 1639-1649.

Wei-Qiang Liao et al: Large Piezoelectric Effect in a Lead-Free Molecular Ferroelectric Thin Film, Journal of the American Chemical Society, Nov. 16, 2017, pp. 1-7.

Jun Su Lee et al: Design and Pressure Analysis for Bulk-Micromachined Electrothermal Hydraulic Microactuators Using a PCM, Sensors and Actuators A 133 (2007) 294-300.

J. Minase et al: A Review, Supported By Experimental Results, of Voltage, Charge and Capacitor Insertion Method for Driving Piezoelectric Actuators, Precision Engineering (2010), pp. 1-10.

Hugo Nguyen et al: Solder Sealing Method for Paraffin-Filled Microcavities, Journal of Micromechanics and Microengineering, Sep. 2006, pp. 1-9.

Sam Ogden et al: Review on Miniaturised Paraffin Phase Change Actuators, Valves, and Pumps, Microfluidics and Nanofluidics, Nov. 2013, pp. 1-47.

Kwang W Oh et al: A Review of Microvalves, J. Micromech. Microeng. 16 (2006) R13-R39.

Jong M Park et al: A Piezoelectric Microvalve for Cryogenic Applications, J. Micromech. Microeng. 18 (2008) 015023, pp. 1-10.

My Pham et al: Development of a Peristaltic Micropump With Lightweight Piezo-Composite Actuator Membrane Valves, Int'l J. of Aeronautical & Space Sci. 12(1), 69-77 (2011).

Jin-yuan Qian et al: Actuation Mechanism of Microvalves: A Review, Micromachines 2020, 11, 172, pp. 1-39.

T-Q. Truong et al: Simulation and Optimization of Tesla Valves, Nanotech 2003, vol. 1, pp. 1-5.

Li-Yu Tseng et al: Investigation of a Piezoelectric Valveless Micropump With an Integrated Stainless-Steel Diffuser/Nozzle Bulge-Piece Design, Smart Mater. Struct. 22 (2013) 085023, pp. 1-12.

Ulvac, Inc.: CMOS-Integratable High-Performance Piezoelectric PZT Film Fabrication for Piezo-MEMS Applications, 2015, pp. 1-12.

Alexander Vinogradov et al: A Comparison of Axisymmetric Models of Multilayer Piezo Actuators for the Creation of Annular Strain Waves, Journal of Engineering and Applied Sciences 13 (4): 940-953, 2018.

R. P. Welle et al: Peltier-Actuated Microvalves: Performance Characterization, Lab-on-a-Chip: Platforms, Devices, and Applications, Proceedings of SPIE vol. 5591, pp. 158-166.

Richard P. Welle et al: Standoff Pressures and Thermal Characterization of the Peltier-Actuated Microvalve, 2006 International Conference on Thermoelectrics, 2006, IEEE, pp. 332-337.

Bozhi Yang et al: A Latchable Microvalve Using Phase Change of Paraffin Wax, Sensors and Actuators A 134 (2007) 194-200.

Yang Ye et al: Valve Improvement for High Flow Rate Piezoelectric Pump With PDMS Film Valves, Sensors and Actuators A, Sep. 25, 2018, pp. 1-18.

R. Bermejo et al: Mechanical Characterization of PZT Ceramics for Multilayer Piezoelectric Actuators, J. Ceram. Sci. Tech., 03(04) 159-168 (2012).

F. Casset et al: Optimization of Electrodes Design for PZT Thin-Film Actuated Membranes, Procedia Engineering 47 (2012) 108-111.

Chun-Fu Chen et al: Transition Behavior in Large Deflection of Simply Supported Plate With Piezoelectric Patches Under Pretension, IEEE, 2018, pp. 177-181.

Jongsoo Choi et al: Thin-Film Piezoelectric and High-Aspect Ratio Polymer Leg Mechanisms for Millimeter-Scale Robotics, Int J Intell Robot Appl (2017) 1:180-194.

Jongsoo Choi et al: Dynamics of Thin-Film Piezoelectric Microactuators With Large Vertical Stroke Subject to Multi-Axis Coupling and Fabrication Asymmetries, J. Micromech. Microeng. 28 (2018) 015014, pp. 1-12.

Maxime Delhorme et al: Monte Carlo Simulations of a Clay Inspired Model Suspension: The Role of Charge Anisotropy, 2010, pp. 1-16.

Yao Fu: Design of a Hybrid Magnetic and Piezoelectric Polymer Microactuator, Dec. 2005, pp. 1-211.

Frank Goldschmidtboeing et al: Strategies for Void-Free Liquid Filling of Micro Cavities, J. Micromech. Microeng. 16 (2006) 1321-1330.

F. Goldschmidtböing et al: A Novel Self-Heating Paraffin Membrane Micro-Actuator, MEMS 2008, Tucson, AZ, USA, Jan. 13-17, 2008, IEEE, 2008, pp. 531-534.

B A Griffin et al: The Electromechanical Behavior of Piezoelectric Thin Film Composite Diaphragms Possessing In-Plane Stresses, J. Micromech. Microeng. 27 (2017) 045017, pp. 1-12.

Y. C. Hsu et al: Equivalent Electrical Network for Performance Characterization of Piezoelectric Peristaltic Micropump, Microfluid Nanofluid (2009) 7:237-248.

Yuanlin Hu et al: Deflection of Circular Diaphragm-Type Piezoactuators Coupling With Gas Compression in Micropumps, Microsyst Technol, Mar. 13, 2017, pp. 1-13.

Yuanlin Hu et al: Non-Linear Deflection of a Circular Diaphragm-Type Piezoactuator Under Loads of Voltage and Pressure, Sensors and Actuators A 268 (2017) 91-100.

Michael A. Huff et al: Fabrication, Packaging, and Testing of a Wafer-Bonded Microvalve, IEEE, 1992, pp. 194-197.

Michael A. Huff et al: Design of Sealed Cavity Microstructures Formed By Silicon Wafer Bonding, Journal of Microelectromechanical Systems, vol. 2. No. 2, Jun. 1993, pp. 74-81.

Dean G. Johnson et al: Towards an Implantable, Low Flow Micropump That Uses No Power in the Blocked-Flow State, Micromachines 2016, 7, 99, pp. 1-16.

Mohith S et al: Performance Analysis of Valveless Micropump With Disposable Chamber Actuated Through Amplified Piezo Actuator (APA) for Biomedical Application, Mechatronics 67 (2020) 102347, pp. 1-15.

Samira Kaviani et al: A Modeling and Vibration Analysis of a Piezoelectric Micro-Pump Diaphragm, C. R. Mecanique 342 (2014) 692-699.

Daejoong Kim et al: High Flow Rate Per Power Electroosmotic Pumping Using Low Ion Density Solvents, Sensors and Actuators A 141 (2008) 201-212.

Hamza Landari et al: Biocompatible Compact Micropump With Integrated Unidirectional Microvalves for Low Pressure Microfluidic Applications, Sensors and Actuators A, 2018, pp. 1-34.

Lotte Langkjær et al: Iontophoresis of Monomeric Insulin Analogues in Vitro: Effects of Insulin Charge and Skin Pretreatment, Journal of Controlled Release 51 (1998) 47-56.

R.F. Mann et al: Henry's Law and the Solubilities of Reactant Gases in the Modelling of Pem Fuel Cells, Journal of Power Sources 161 (2006) 768-774.

(56) References Cited

OTHER PUBLICATIONS

Zahid Mehmood et al: Material Selection for Micro-Electro-Mechanical-Systems (MEMS) Using Ashby's Approach, Materials & Design, 2018, pp. 1-46.

Katja Meinel et al: Piezoelectric Scanning Micromirror With Built-In Sensors Based on Thin Film Aluminum Nitride, IEEE, 2020, pp. 1-8.

Paul Muralt: PZT Thin Films for Microsensors and Actuators: Where Do We Stand?, IEEE Transactions on Ultrasonics, Ferroelectrics, and Frequency Control, vol. 47, No. 4, Jul. 2000, pp. 903-915.

Christo N. Nanev et al: Steering a Crystallization Process to Reduce Crystal Polydispersity; Case Study of Insulin Crystallization, Journal of Crystal Growth (2016), pp. 1-6.

Nam-Trung Nguyen et al: Fundamentals and Applications of Microfluidics, Second Edition, 2006, pp. 1-497.

Cuong H. Nguyen et al: Comparison of Microactuators Based on Piezoelectric Layered Plates With D31 and D33 Coupling, Proc. of SPIE vol. 9799, 2016, pp. 1-10.

Jin-Goo Park et al: Interfacial and Electrokinetic Characterization of IPA Solutions Related to Semiconductor Wafer Drying and Cleaning, Journal of the Electrochemical Society, 153 (9) G811-G814 (2006).

Behzad Parsi et al: Vibration Analysis of a Double Circular PZT Actuator for a Valveless Micropump, Proceedings of the Canadian Society for Mechanical Engineering International Congress 2018, pp. 1-6.

Muhammad Rizwanur Rahman et al: On the Effect of Relaxation Time in Interfacial Tension Measurement, Colloids and Surfaces A 574 (2019) 239-244.

Zhiyong Tang et al: Manipulate Microfluid With an Integrated Butterfly Valve for Micropump Application, Sensors and Actuators A 306 (2020) 111965, pp. 1-9.

Yanjie Wang et al: Design and Fabrication of an IPMC Actuated Micro-Pump With Inner Petal-Shaped Diaphragm, 2018 3rd International Conference on Advanced Robotics and Mechatronics (ICARM), IEEE, 2018, pp. 667-672.

Tao Wang et al: Study of the Vortex Based Virtual Valve Micropump, J. Micromech. Microeng., 2018, pp. 1-8.

Herman Wijshoff: the Dynamics of the Piezo Inkjet Printhead Operation, Physics Reports 491 (2010) 77-177.

Chenye Yang et al: Compact, Planar, Translational Piezoelectric Bimorph Actuator With Archimedes' Spiral Actuating Tethers, J. Micromech. Microeng. 26 (2016) 124005, pp. 1-10.

Rohit D. Bankar et al: Computational Analysis of a Piezo-Electrically Actuated Valve-Less Micropump for Micro-Fluidic Applications, International Journal of New Technology and Research (IJNTR), vol. 5, Issue 4, Apr. 2019, pp. 51-55.

Bestley Joe et al: A Systematic Review on the Research Headway of Piezoelectric Diaphragms for Micro Electromechanical Applications, 2016 International Conference on Control, Instrumentation, Communication and Computational Technologies (ICCICCT), IEEE, 2016, pp. 319-327.

Qifeng Cui et al: Modeling and Numerical Analysis of a Circular Piezoelectric Actuator for Valveless Micropumps, Journal of Intelligent Material Systems and Structures, vol. 19—Oct. 2008, pp. 1195-1205.

W. D. Lougheed et al: Insulin Aggregation in Artificial Delivery Systems, Diabetologia 19, 1-9 (1980).

William D. Lougheed et al: Stability of Insulin Lispro in Insulin Infusion Systems, Diabetes Care, vol. 20, No. 7, Jul. 1997, pp. 1061-1065.

H.K. Ma et al: Development of a Piezoelectric-Driven Miniature Pump for Biomedical Applications, Sensors and Actuators A 234 (2015) 23-33.

Luiz E. G. Martins et al: Development of a Low-Cost Insulin Infusion Pump: Lessons Learned From an Industry Case, 2015 IEEE 28th International Symposium on Computer-Based Medical Systems, IEEE, 2015, pp. 338-343.

Marjan A. Nejad et al: Insulin Adsorption on Crystalline SiO2: Comparison Between Polar and Nonpolar Surfaces Using Accelerated Molecular-Dynamics Simulations, Chemical Physics Letters 670 (2017) 77-83.

Asim Nisar et al: Three Dimensional Transient Multifield Analysis of a Piezoelectric Micropump for Drug Delivery System for Treatment of Hemodynamic Dysfunctions, Cardiovasc Eng (2008) 8:203-218.

Vishal Singhal et al: Low Reynolds Number Flow Through Nozzle-Diffuser Elements in Valveless Micropumps, Sensors and Actuators A 113 (2004) 226-235.

John Walsh et al: Infusion Sets 2015: Your Critical Link to Success on a Pump, Advanced Metabolic Care and Research, 2015, pp. 1-9.

Thomas Altendorfer-Kroath et al: Insulin Distribution in Human Adipose Tissue Via a Novel Insulin Infusion Catheter, Diabetes Technology & Therapeutics, 2019, pp. 1-13.

Lars Arendt-Nielsen et al: Pain Following Controlled Cutaneous Insertion of Needles With Different Diameters, Somatosensory and Motor Research, 2006, 23(1/2), pp. 37-43.

Petros C. Benias et al: Structure and Distribution of an Unrecognized Interstitium in Human Tissues, Scientific Reports, 2018, 8:4947, pp. 1-10.

Workalemahu M. Berhanu et al: Controlling the Aggregation and Rate of Release in Order to Improve Insulin Formulation: Molecular Dynamics Study of Full-Length Insulin Amyloid Oligomer Models, Journal of Molecular Modeling 2012 18:1129-1142.

Regine Bousquet-Rouaud et al: Factors Involved in Catheter Obstruction During Long-Term Peritoneal Insulin Infusion, Diabetes Care vol. 16, No. 5, 1993, pp. 801-807.

Fernando Casanova et al: Effect of Needle Insertion Speed on Tissue Injury, Stress, and Backflow Distribution for Convection-Enhanced Delivery in the Rat Brain, PLOS ONE vol. 9, No. 4, 2014, Article e94919, pp. 1-15.

Dr. Eric Chappel et al: Debiotech S.A. Switzerland Innovative Medical Systems: Low-Cost Disposable Wearable Injector Platform for Large Volumes of Viscous Drugs, 2019, pp. 68-72.

Trine S. Clausen et al: Effect of Insulin Catheter Wear-Time on Subcutaneous Adipose Tissue Blood Flow and Insulin Absorption in Humans, Diabetes Technology & Therapeutics vol. 11, No. 9, 2009, pp. 575-580.

ConvaTec: Clinical Evaluation Report, pp. 1-43.

Dorothee Deiss et al: Insulin Infusion Set Use: European Perspectives and Recommendations, Diabetes Technology & Therapeutics, vol. 18, No. 9, 2016, pp. 1-8.

Ivan Dimitrov et al: In Vitro Dissolution of Insulin Crystal Polymorphs at Model Conditions Relevant to in Vivo Environment, Dissolution Technologies, 2013, pp. 11-16.

Henrik Egekvist et al: Pain and Mechanical Injury of Human Skin Following Needle Insertions, European Journal of Pain (1999)3:41-49.

Henrik Egekvist et al: Regional Variations in Pain to Controlled Mechanical Skin Traumas From Automatic Needle Insertions and Relations to Ultrasonography, Skin Research and Technology, 5, 1999, pp. 247-254.

Gabriella Eisler et al: In Vivo Investigation of the Tissue Response to Commercial Teflon Insulin Infusion Sets in Large Swine for 14 Days: The Effect of Angle of Insertion on Tissue Histology and Insulin Spread Within the Subcutaneous Tissue, BMJ Open Diabetes Research & Care 2019; 7:e000881, pp. 1-8.

Victor Feingold et al: Effect of Contact Material on Vibration-Induced Insulin Aggregation, Diabetologia 27, 1984, pp. 373-378.

Michael A. Gibney et al: Skin and Subcutaneous Adipose Layer Thickness in Adults With Diabetes at Sites Used for Insulin Injections: Implications for Needle Length Recommendations, Current Medical Research & Opinion vol. 26, No. 6, 2010, pp. 1519-1530.

Harvinder S. Gill et al: Does Needle Size Matter?, Journal of Diabetes Science and Technology vol. 1, Issue 5, Sep. 2007, pp. 725-729.

Jasmin R. Hauzenberger et al: Detailed Analysis of Insulin Absorption Variability and the Tissue Response to Continuous Subcutaneous Insulin Infusion Catheter Implantation in Swine, Diabetes Technology & Therapeutics vol. 19, No. 11, 2017, pp. 641-650.

(56) References Cited

OTHER PUBLICATIONS

Jasmin R. Hauzenberger et al: Systematic in Vivo Evaluation of the Time-Dependent Inflammatory Response to Steel and Teflon Insulin Infusion Catheters, Scientific Reports, 8:1132, 2018, pp. 1-13.

Lutz Heinemann et al: Insulin Infusion Set: The Achilles Heel of Continuous Subcutaneous Insulin Infusion, Journal of Diabetes Science and Technology vol. 6, Issue 4, Jul. 2012, pp. 954-964.

Lutz Heinemann: Insulin Infusion Sets: A Critical Reappraisal, Diabetes Technology & Therapeutics vol. 18, No. 5, 2016, pp. 1-7.

Kristoffer Hendel et al: Impact of Infusion Set Materials and Designs on the Subcutaneous Response in People With Diabetes: A Rapid Review of the Literature, Journal of Diabetes Science and Technology vol. 17, 2, 2023, pp. 314-321.

Laurence Hirsch et al: Intramuscular Risk At Insulin Injection Sites—Measurement of the Distance From Skin to Muscle and Rationale for Shorter-Length Needles for Subcutaneous Insulin Therapy, Diabetes Technology & Therapeutics vol. 16, No. 12, 2014, pp. 867-873.

Oktay Akkus et al: Evaluation of Skin and Subcutaneous Adipose Tissue Thickness for Optimal Insulin Injection, Journal of Diabetes & Metabolism vol. 3, Issue 8, 2012, pp. 1-5.

Emiko Kohno et al: Effects of Ingredients and PH of Intravenous Solutions on Stability of Insulin, Jpn. J. Pharm. Health Care Sci. 36, 10, 2010, pp. 747-754.

Donatella Lopresti et al: Skin and Subcutaneous Thickness at Injecting Sites in Children With Diabetes: Ultrasound Findings and Recommendations for Giving Injection, Pediatric Diabetes, 2012, pp. 1-9.

Caitlin Maikawa et al: Stable Monomeric Insulin Formulations Enabled By Supramolecular Pegylation of Insulin Analogues, Advanced Therapeutics 3, 2020, pp. 1-9.

Maureen Mckay et al: A Comparison of Insulin Injection Needles on Patients' Perceptions of Pain, Handling, and Acceptability: A Randomized, Open-Label, Crossover Study in Subjects With Diabetes, Diabetes Technology & Therapeutics vol. 11, No. 3, 2009, pp. 195-201.

Elaine Mcvey et al: Evaluation of Intradermal and Subcutaneous Infusion Set Performance Under 24-Hour Basal and Bolus Conditions, Journal of Diabetes Science and Technology vol. 9, 6, 2015, pp. 1282-1291.

Masashi Miyakoshi et al: Comparison of Patient's Preference, Pain Perception, and Usability Between Micro Fine Plus 31-Gauge Needle and Microtapered Nanopass 33-Gauge Needle for Insulin Therapy, Journal of Diabetes Science and Technology vol. 1, Issue 5, 2007, pp. 718-724.

James J Norman et al: Faster Pharmacokinetics and Increased Patient Acceptance of Intradermal Insulin Delivery Using a Single Hollow Microneedle in Children and Adolescents With Type 1 Diabetes, Pediatric Diabetes 2013: 14: 459-465.

Matthew T. Novak et al: Subcutaneous Bolus Administration of Meta-Cresol Decreases Insulin Absorption in a Swine Model, BD Technologies and Innovation.

Parul J. Patel et al: Randomized Trial of Infusion Set Function: Steel Versus Teflon, Diabetes Technology & Therapeutics vol. 16, No. 1, 2014, pp. 15-19.

Andreas Pfützner et al: Using Insulin Infusion Sets in CSII for Longer Than the Recommended Usage Time Leads to a High Risk for Adverse Events: Results From a Prospective Randomized Crossover Study, Journal of Diabetes Science and Technology vol. 9(6), 2015, pp. 1292-1298.

Ivan Rabbone et al: Insulin Pump Breakdown and Infusion Set Failure in Italian Children With Type 1 Diabetes: 1-Year Prospective Observational Study With Suggestions to Minimize Clinical Impact, pp. 1-17.

Christian Hove Rasmussen et al: Insulin Aspart Pharmacokinetics: An Assessment of Its Variability and Underlying Mechanisms, European Journal of Pharmaceutical Sciences, 2014, pp. 1-11.

Eric Renard et al: Lower Rate of Initial Failures and Reduced Occurrence of Adverse Events With a New Catheter Model for Continuous Subcutaneous Insulin Infusion: Prospective, Two-Period, Observational, Multicenter Study, Diabetes Technology & Therapeutics vol. 12, No. 10, 2010, pp. 769-773.

Shuji Sato et al: Prevention of Insulin Self-Association and Surface Adsorption, Journal of Pharmaceutical Sciences vol. 72, No. 3, 1983, pp. 228-230.

Volkmar Schmid et al: Pilot Study for Assessment of Optimal Frequency for Changing Catheters in Insulin Pump Therapy-Trouble Starts on Day 3, Journal of Diabetes Science and Technology vol. 4, Issue 4, Jul. 2010, pp. 976-982.

Thorsten Siegmund et al: Comparison of Usability and Patient Preference for Insulin Pen Needles Produced With Different Production Techniques, Diabetes Technology & Therapeutics vol. 11, No. 8, 2009, pp. 523-528.

Kang Hee Sim et al: The Appropriateness of the Length of Insulin Needles Based on Determination of Skin and Subcutaneous Fat Thickness in the Abdomen and Upper Arm in Patients With Type 2 Diabetes, Diabetes Metabolism Journal, 2014, 38, pp. 120-133.

Tue Soeborg et al: Absorption Kinetics of Insulin After Subcutaneous Administration, European Journal of Pharmaceutical Sciences 36, 2009, pp. 78-90.

Maria Thomsen et al: Spatial Distribution of Soluble Insulin in Pig Subcutaneous Tissue: Effect of Needle Length, Injection Speed and Injected Volume, Pharmaceutical Sciences 79, 2015, pp. 96-101.

Gina Zhang et al: Development of the Extended Infusion Set and Its Mechanism of Action, Journal of Diabetes Science and Technology, 2022, pp. 1-6.

Bastian Bonhoeffer et al: Experimental Characterization and Simulation of a Piezo-Actuated Micro Dispensing Valve, Journal of Fluids Engineering, May 2017, vol. 139, p. 1-9.

Byung-Hun Kim et al: Hydrodynamic Responses of a Piezoelectric Driven MEMS Inkjet Print-Head, Sensors and Actuators A 210 (2014) 131-140.

Tong-Miin Liou et al: Effects of Actuating Waveform, Ink Property, and Nozzle Size on Piezoelectrically Driven Inkjet Droplets, Microfluid Nanofluid (2010) 8:575-586.

J. Minase et al: A Review, Supported By Experimental Results, of Voltage, Charge and Capacitor Insertion Method for Driving Piezoelectric Actuators, Precis Eng (2010), pp. 1-9.

Behzad Parsi et al: Vibration Analysis of a Double Circular PZT Actuator for a Valveless Micropump, Proceedings of the Canadian Society for Mechanical Engineering International Congress 2018, May 2018, pp. 1-6.

Muhammad Ali Shah et al: Design and Characteristic Analysis of a MEMS Piezo-Driven Recirculating Inkjet Printhead Using Lumped Element Modeling, Micromachines 2019, 10, 757, pp. 1-19.

Guler Bengusu Tezel et al: Flow Characterization of Viscoelastic Fluids Around Square Obstacle, Periodica Polytechnica Chemical Engineering, 63(1), pp. 246-257, 2019.

Tachung C. Yih et al: Modeling and Characterization of a Nanoliter Drug-Delivery MEMS Micropump With Circular Bossed Membrane, Nanomedicine: Nanotechnology, Biology, and Medicine 1 (2005) 164-175.

Shushan Wang et al: Fabrication and Characterization of MEMS Piezoelectric Synthetic Jet Actuators With Bulk-Micromachined PZT Thick Film, Microsyst Technol, Jul. 29, 2014, pp. 1-7.

A. M. Binnie et al: Experiments on the Flow of Swirling Water Through a Pressure Nozzle and an Open Trumpet, Proc. R. Soc. Lond. A, 1956, 235, pp. 78-89.

Bastian Bonhoeffer et al: Experimental Characterization and Simulation of a Piezo-Actuated Micro Dispensing Valve, Journal of Fluids Engineering, May 2017, vol. 139, pp. 1-9.

Ayodeji Demuren et al: Occlusion of Insulin Delivery Due to Bubble Formation in Infusion Pump Therapy, 11th International Conference on Heat Transfer, Fluid Mechanics and Thermodynamics, pp. 267-273.

Ranjitsinha R. Gidde et al: Fully Coupled Modeling and Design of a Piezoelectric Actuation Based Valveless Micropump for Drug Delivery Application, Microsystem Technologies, Jul. 2019, pp. 1-13.

Wolfgang Hilber: Stimulus-Active Polymer Actuators for Next-Generation Microfluidic Devices, Appl. Phys. A, 2016, 122:751, pp. 1-39.

(56)         References Cited

OTHER PUBLICATIONS

Jun Huang et al: Development and Performance Comparison of Valveless Piezoelectric Pumps With Asymmetrical Channels, Sensors and Actuators: A. Physical, Jul. 2020.

Artur Karaszkiewicz: Geometry and Contact Pressure of an 0-Ring Mounted in a Seal Groove, Ind. Eng. Chem. Res. 1990, 29, pp. 2134-2137.

Sohail A. Khan et al: Darcy-Forchheimer Hybrid (MoS2, SiO2 Nanofluid Flow With Entropy Generation, Computer Methods and Programs in Biomedicine, Oct. 2019, pp. 1-20.

Muhammad Ijaz Khan et al: Modeling and Numerical Simulation for Flow of Hybrid Nanofluid (SiO2/C3H8O2) and (MoS2/C3H8O2) With Entropy Optimization and Variable Viscosity, International Journal of Numerical Methods for Heat & Fluid Flow vol. 30 No. 8, 2020, pp. 3939-3955.

Byung-Hun Kim et al: Hydrodynamic Responses of a Piezoelectric Driven MEMS Inkjet Print-Head, Sensors and Actuators A 210, 2014, pp. 131-140.

Chandan Mishra et al: Cavitation in Flow Through a Micro-Orifice Inside a Silicon Microchannel, Physics of Fluids 17, 013601, 2005, pp. 1-15.

Md. Nur Alam Mondal: Flow Analysis of a Micro-Scale Dual Rotor Viscous Pump, Nov. 2018, pp. 1-139.

X.G. Qi et al: Modelling Laminar Pulsed Flow in Rectangular Microchannels, Chemical Engineering Science 63, 2008, pp. 2682-2689.

M. Kiran Raj et al: Hydrodynamics in Deformable Microchannels, Microfluid Nanofluid, 2017, 21:70, pp. 1-12.

Gyana Ranjan Rana et al: Hydrodynamics of a Confined Meniscus in a Square Capillary Tube at Low Capillary Numbers, Frontiers in Heat Pipes (FHP), 5, 7, 2014, pp. 1-12.

Liqing Ren et al: Electro-Viscous Effects on Liquid Flow in Microchannels, Department of Mechanical & Industrial Engineering, University of Toronto, Toronto, Ontario, Canada M5S 3G8, Sep. 2000, pp. 12-22.

P Vainshtein et al: On Electroviscous Effects in Microchannels, J. Micromech. Microeng. 12, 2002, pp. 252-256.

Luis Guillermo Villanueva et al: Mechanics for Fluidics and Bio-Devices, 2020, pp. 139-196.

Bin Wang et al: An Experimental Study of Pulsed Micro-Flows Driven By an Insulin Pump, American Institute of Aeronautics and Astronautics, 2010, pp. 1-10.

D. H. Wang et al: Modeling and Testing of the Static Deflections of Circular Piezoelectric Unimorph Actuators, Journal of Intelligent Material Systems and Structures, vol. 21, Nov. 2010, pp. 1603-1616.

Jiantao Wang et al: The Effect of Surface Wettability on the Performance of a Piezoelectric Membrane Pump, AIP Advances 8, 045010, 2018, pp. 1-9.

Liu Wang et al: Geometrical and Chemical-Dependent Hydrolysis Mechanisms of Silicon Nanomembranes for Biodegradable Electronics, ACS Appl. Mater. Interfaces, Apr. 2019, pp. 1-12.

Shulin Zeng et al: Fabrication and Characterization of Electroosmotic Micropumps, Sensors and Actuators B 79, 2001, pp. 107-114.

Yi-Chu Hsu et al: An Experimental and Numerical Investigation Into the Effects of the PZT Actuator Shape in Polymethylmethacrylate Peristaltic Micropumps, Microsyst Technol, 2009, 15, pp. 565-571.

Chandan Mishra et al: Cavitation in Flow Through a Micro-Orifice Inside a Silicon Microchannel, Physics of Fluids 17, 013601, 2005, pp. 1-16.

Majid Nabavi et al: Steady and Unsteady Flow Analysis in Microdiffusers and Micropumps: A Critical Review, Microfluid Nanofluid, 2009, 7, pp. 599-619.

Cara T Cantwell et al: Modular Reservoir Concept for MEMS-Based Transdermal Drug Delivery Systems, J. Micromech. Microeng. 24 (2014) 117001, pp. 1-6.

HCL: An Overview of the Plastic Material Selection Process for Medical Devices, 2013, pp. 1-26.

Antoniu Moldovan et al: Wetting Properties of Glycerol on Silicon, Native SiO2, and Bulk SiO2 By Scanning Polarization Force Microscopy, Journal of Adhesion Science and Technology, 28:13, 2014, 1277-1287.

Gabriela Voskerician et al: Biocompatibility and Biofouling of MEMS Drug Delivery Devices, Biomaterials 24 (2003) 1959-1967.

Hongbin Zhang et al: Anti-Fouling Coatings of Poly(Dimethylsiloxane) Devices for Biological and Biomedical Applications, J. Med. Biol. Eng. (2015) 35:143-155.

Faizan Ali et al: Silicon-Doped Hafnium Oxide Anti-Ferroelectric Thin Films for Energy Storage, Journal of Applied Physics 122, 144105, 2017, pp. 1-8.

Eunki Hong et al: Design of MEMS PZT Circular Diaphragm Actuators to Generate Large Deflections, Journal of Microelectromechanical Systems, vol. 15, No. 4, Aug. 2006, pp. 832-839.

Yu Jia et al: An Umbrella-Shaped Topology for Broadband MEMS Piezoelectric Vibration Energy Harvesting, Journal of Physics: Conference Series 1407, 2019, 012119, pp. 1-5.

Juliana Johari et al: Piezoelectric Micropump With Nanoliter Per Minute Flow for Drug Delivery Systems, Sains Malaysiana 40(3), 2011, pp. 275-281.

Min Li et al: Comparison of Chemical Stability and Corrosion Resistance of Group IV Metal Oxide Films Formed By Thermal and Plasma-Enhanced Atomic Layer Deposition, Scientific Reports, Jul. 2019, 9:10438, pp. 1-12.

Ningqi Luo et al: Flexible Piezoresistive Sensor Patch Enabling Ultralow Power Cuffless Blood Pressure Measurement, Adv. Funct. Mater. 2016, 26, pp. 1178-1187.

Zahid Mehmood et al: Material Selection for Optimum Design of MEMS Pressure Sensors, Microsystem Technologies, Oct. 2019, pp. 1-16.

Vasileios Mitrakos: Design, Development and Characterisation of Piezoresistive and Capacitive Polymeric Pressure Sensors for Use in Compression Hosiery, Dec. 2014, pp. 1-112.

Yang Nan et al: Shape and Size Dependent Piezoelectric Properties of Monolayer Hexagonal Boron Nitride Nanosheets, Nanoscale Adv., 2020, 2, pp. 470-477.

Peishuai Song et al: Recent Progress of Miniature MEMS Pressure Sensors, Micromachines 2020, 11, 56, pp. 1-38.

M. Srinagesh et al: Studies on Effect of Geometry of a Silicon Based Diaphragm on the Sensitivity of a MEMS Parallel Plate Capacitive Sensor Used in Pressure Measurement, International Journal of Electrical, Electronics and Computer Systems (IJEECS), 2015, vol. 3, Issue 6, pp. 24-27.

Ahn Vang Tran et al: Mechanical Structural Design of Piezoresistive Pressure Sensor for Low-Pressure Measurement: A Computational Analysis By Increases in the Sensor Sensitivity, Sensors 2018, 18, 2023, pp. 1-15.

Khairul Anuar Abd Wahid et al: Investigation on the Effect of Different Design of SCR on the Change of Resistance in Piezoresistive Micro Cantilever, Microsyst Technol, Apr. 4, 2013, pp. 1-5.

Chen Wu et al: Optimal Design of Sic Piezoresistive Pressure Sensor Considering Material Anisotropy, Rev. Sci. Instrum. 91, 015004, 2020, pp. 1-14.

Ethem Erkan Aktakka et al: High Stroke and High Deflection Bulk-PZT Diaphragm and Cantilever Micro Actuators and Effect of Pre-Stress on Device Performance, Journal of Microelectromechanical Systems, vol. 23, No. 2, Apr. 2014, pp. 438-451.

Morteza Amjadi et al: Parallel Microcracks-Based Ultrasensitive and Highly Stretchable Strain Sensors, ACS Appl. Mater. Interfaces 2016, 8, 5618-5626.

Ronja Anton et al: Nanoindentation Dataset of Silicon and Hafnia Doped Silicon Coatings Produced By Magnetron Sputtering, Data in Brief 31 (2020) 105800, pp. 1-6.

Errol B. Arkilic et al: Mass Flow and Tangential Momentum Accommodation in Silicon Micromachined Channels, J. Fluid Mech. (2001), vol. 437, pp. 29-43.

L. Bartholomew et al: Comparison of ALD of HfO2, SiO2, and HfXSi1-XO2 Thin Films Using Various Metal/Silicon Alkylamide Precursors and O3, ECS Transactions, 3 (15) 37-49 (2007).

(56) References Cited

OTHER PUBLICATIONS

Tadej Battelino et al: Continuous Glucose Monitoring and Metrics for Clinical Trials: An International Consensus Statement, Lancet Diabetes Endocrinol, Jan. 2023, vol. 11, 42-57.

Li Cao et al: Design and Simulation of an Implantable Medical Drug Delivery System Using Microelectromechanical Systems Technology, Sensors and Actuators A 94 (2001) 117-125.

Chia-Ling Chen et al: An Electrohydrodynamic Micropump for On-Chip Fluid Pumping on a Flexible Parylene Substrate, pp. 1-4.

P Dhananchezhiyan et al: Optimization of Multiple Micro Pumps to Maximize the Flow Rate and Minimize the Flow Pulsation, Procedia Technology 25 (2016) 1226-1233.

Satish K. Garg et al: Accuracy and Safety of Dexcom G7 Continuous Glucose Monitoring in Adults With Diabetes, Diabetes Technology & Therapeutics vol. 24, No. 6, 2022, pp. 373-380.

A. Ghoshal et al: Experimental Investigation of Damage Detection in Composite Material Structures Using a Laser Vibrometer and Piezoelectric Actuators, Journal of Intelligent Material Systems and Structures, vol. 14—Aug. 2003, pp. 521-537.

Gunnar Gnad: Control Concept for Piezoelectric Actuators, Jun. 10, 2005, pp. 1-147.

Alex Groisman et al: Microfluidic Memory and Control Devices, Science, New Series, vol. 300, No. 5621 (May 9, 2003), pp. 955-958.

Yanfang Guan: Performance Analysis of a Microfluidic Pump Based on Combined Actuation of the Piezoelectric Effect and Liquid Crystal Backflow Effect, Micromachines 2019, 10, 584, pp. 1-17.

Xiao He et al: How to Prevent Bubbles in Microfluidic Channels, Langmuir 2021, 37, 2187-2194.

Lipeng He et al: Thermal Management Analysis of Serial-Connection Three-Chamber Piezoelectric Pump, Journal of Mechanical Science and Technology 35 (10) 2021, pp. 4523-4530.

Shiuh-Chuan Her et al: Deflection of Cross-Ply Composite Laminates Induced By Piezoelectric Actuators, Sensors 2010, 10, 719-733.

Zhanhao Hu et al: Dipole Formation at Organic/Metal Interfaces With Pre-Deposited and Post-Deposited Metal, NPG Asia Materials (2017) 9, e379, pp. 1-7.

Hen-Wei Huang et al: An Automated All-In-One System for Carbohydrate Tracking, Glucose Monitoring, and Insulin Delivery, Journal of Controlled Release 343 (2022) 31-42.

Veronica Iacovacci et al: Towards Dosing Precision and Insulin Stability in an Artificial Pancreas System, Journal of Medical Devices, Jan. 8, 2019, pp. 1-38.

Noah T. Jafferis et al: Multilayer Laminated Piezoelectric Bending Actuators: Design and Manufacturing for Optimum Power Density and Efficiency, Smart Mater. Struct. 25 055033, 2016, pp. 1-18.

Dean Johnson: Integration Technologies for Implantable Microsystems, Thesis, Rochester Institute of Technology, 2013, pp. 1-137.

Damien Lamaison: Fabrication and Characterization of Microfluidic Chips for Implantable Pumps, Debiotech S.A., 2018, pp. 1-58.

R. A. Lawes: Manufacturing Costs for Microsystems/MEMS Using High Aspect Ratio Microfabrication Techniques, Microsyst Technol (2007) 13:85-95.

Junghoon Lee et al: Electrowetting and Electrowetting-On-Dielectric for Microscale Liquid Handling, Sensors and Actuators A 95 (2002) 259-268.

Jun Su Lee et al: Thermal Analysis for Bulk-Micromachined Electrothermal Hydraulic Microactuators Using a Phase Change Material, Sensors and Actuators A 135 (2007) 731-739.

Yang Li et al: Axisymmetric Bending Analysis of Functionally Graded One-Dimensional Hexagonal Piezoelectric Quasi-Crystal Circular Plate, Proc. R. Soc. A 476: 20200301, 2020, pp. 1-19.

Liwei Lin et al: A Simulation Program for the Sensitivity and Linearity of Piezoresistive Pressure Sensors, Journal of Microelectromechanical Systems, vol. 8, No. 4, Dec. 1999, pp. 514-522.

Guojun Liu et al: A Low Cost, High Performance Insulin Delivery System Based on PZT Actuation, Microsyst Technol, Feb. 1, 2014, pp. 1-8.

Xuerong Liu et al: Effect of Adhesive and Its Aging on the Performance of Piezoelectric Sensors in Structural Health Monitoring Systems, Metals 2020, 10, 1342, pp. 1-14.

Shivaleela Melennavar et al: Theoretical Analysis of the Design of Different Shape Diaphragm for Piezoresistive Pressure Sensor, International Journal of Engineering Research & Technology (IJERT), vol. 6 Issue 03, Mar. 2017, pp. 446-450.

Bartosz Mika: Design and Testing of Piezoelectric Sensors, Aug. 2007, pp. 1-97.

Model of a Hexagonal Plate, 2021, pp. 1-2.

Samir Mustapha et al: Bonding Piezoelectric Wafers for Application in Structural Health Monitoring—Adhesive Selection, Research in Nondestructive Evaluation, 26: 23-42, 2015.

Oliver Pabst et al: Measurement of Young's Modulus and Residual Stress of Thin SIC Layers for MEMS High Temperature Applications, Microsyst Technol (2012) 18:945-953.

Aria Saunders et al: Minimed 670G Hybrid Closed Loop Artificial Pancreas System for the Treatment of Type 1 Diabetes Mellitus: Overview of Its Safety and Efficacy, Expert Review of Medical Devices, 2019, pp. 1-28.

Che-Yi Shen et al: Fabrication and Drive Test of Piezoelectric PDMS Valveless Micro Pump, Journal of the Chinese Institute of Engineers, vol. 31, No. 4, pp. 615-623 (2008).

Soo Jai Shin et al: Three-Dimensional Simulation of a Valveless Pump, International Journal of Heat and Fluid Flow 31 (2010) 942-951.

S. Singh et al: Analytical Modeling, Simulations and Experimental Studies of a PZT Actuated Planar Valveless PDMS Micropump, Sensors and Actuators A 225 (2015) 81-94.

Jan G. Smits: Piezoelectric Micropump With Microvalves, IEEE 1989, pp. 92-94.

Jan G Smits: Piezoelectric Micropump With Three Valves Working Peristaltically, Sensors and Actuators, A21-A3 (1990) 203-206.

Jan G. Smits et al: The Effectiveness of a Piezoelectric Bimorph Actuator to Perform Mechanical Work Under Various Constant Loading Conditions, Ferroelectrics, 1991, vol. 119:1, 89-105.

Goran Stemme: Micro Fluid Sensors and Actuators, Sixth International Symposium on Micro Machine and Human Science, IEEE, 1995, pp. 45-52.

Stmicroelectronics: Stmicroelectronics Unveils Thin-Film Piezoelectric MEMS Technology to Drive Growth in Customization and Personalization, Sep. 23, 2014, pp. 1-2.

Dharmendra Tripathi et al: Electrokinetic Membrane Pumping Flow Model in a Microchannel, Phys. Fluids 32, 082004 (2020), pp. 1-12.

Xiaoyu Wang et al: Effect of Epoxy Resin on the Actuating Performance of Piezoelectric Fiber Composites, Sensors 2019, 19, 1809, pp. 1-10.

Richard Williams et al: Wetting of Thin Layers of SiO2 By Water, Applied Physics Letters, vol. 25, No. 10, Nov. 15, 1974, pp. 531-532.

Steven W. Wright et al: Thin Film High Dielectric Constant Metal Oxides Prepared By Reactive Sputtering, J. Vac. Sci. Technol. B 30(6), Nov./Dec. 2012, pp. 1-8.

Aaesha Alnuaimi et al: High Performance Graphene-Silicon Schottky Junction Solar Cells With HfO2 Interfacial Layer Grown By Atomic Layer Deposition, Solar Energy 164 (2018) 174-179.

Priscilla Kailian Ang et al: Solution-Gated Epitaxial Graphene as PH Sensor, J. Am. Chem. Soc. 2008, 130, 14392-14393.

Lassaad Barhoumi et al: Silicon Nitride Capacitive Chemical Sensor for Phosphate Ion Detection Based on Copper Phthalocyanine—Acrylate-Polymer, Electroanalysis 2017, 29, 1-11.

Fabjola Bilo et al: Atomic Layer Deposition to Prevent Metal Transfer From Implants: An X-Ray Fluorescence Study, Applied Surface Science 359 (2015) 215-220.

M. Braik et al: Development of a Capacitive Chemical Sensor Based on Co(II)-Phthalocyanine Acrylate-Polymer/HfO2/SiO2/Si for Detection of Perchlorate, J. Sens. Sens. Syst., 4, 17-23, 2015.

F. Campabadal et al: Electrical Characteristics of Metal-Insulator-Semiconductor Structures With Atomic Layer Deposited Al2O3, HfO2, and Nanolaminates on Different Silicon Substrates, Journal of Vacuum Science & Technology B 29(1), Jan./Feb. 2011, pp. 1-8.

Hector Garcia et al: Electrical Characterization of Atomic-Layer-Deposited Hafnium Oxide Films From Hafnium

(56) References Cited

OTHER PUBLICATIONS

Tetrakis(Dimethylamide) and Water/Ozone: Effects of Growth Temperature, Oxygen Source, and Postdeposition Annealing, Journal of Vacuum Science & Technology A 31(1), Jan./Feb. 2013, pp. 1-8.
Jaana Hautala et al: Atomic Layer Deposition—A Novel Method for the Ultrathin Coating of Minitablets, International Journal of Pharmaceutics, Jan. 2017, pp. 1-40.
Hyungsoon Im et al: Atomic Layer Deposition: A Versatile Technique for Plasmonics and Nanobiotechnology, J. Mater. Res., vol. 27, No. 4, Feb. 28, 2012, pp. 663-671.
Tommi O. Kääriäinen et al: Surface Modification of Acetaminophen Particles By Atomic Layer Deposition, International Journal of Pharmaceutics, Apr. 2017, pp. 1-51.
Kenry et al: Emerging Flexible and Wearable Physical Sensing Platforms for Healthcare and Biomedical Applications, Microsystems & Nanoengineering (2016) 2, 16043, pp. 1-19.
Chao-Sung Lai et al: PH Sensitivity Improvement on 8 NM Thick Hafnium Oxide By Post Deposition Annealing, Electrochemical and Solid-State Letters, 9 (3) G90-G92, 2006.
Chao-Sung Lai et al: Thickness Effects on PH Response of HfO2 Sensing Dielectric Improved By Rapid Thermal Annealing, Japanese Journal of Applied Physics vol. 45, No. 4B, 2006, pp. 3807-3810.
Chao-Sung Lai et al: Body Effect Minimization Using Single Layer Structure for PH-Isfet Applications, Sensors and Actuators B 143 (2010) 494-499.
Michael Lee et al: Impedance Characterization of the Capacitive Field-Effect PH-Sensor Based on a Thin-Layer Hafnium Oxide Formed By Atomic Layer Deposition, Sensors & Transducers, vol. 27, Special Issue, May 2014, pp. 233-238.
Gemma Martín et al: Transmission Electron Microscopy Assessment of Conductive-Filament Formation in Ni—HfO2—Si Resistive-Switching Operational Devices, Applied Physics Express 11, 014101 (2018), pp. 1-4.
Roger J. Narayan et al: Atomic Layer Deposition of TiO2 Thin Films on Nanoporous Alumina Templates: Medical Applications, JOM vol. 61 No. 6, Jun. 2009, pp. 12-16.
Changhyun Pang et al: Recent Advances in Flexible Sensors for Wearable and Implantable Devices, J. Appl. Polym. Sci. 2013, pp. 1429-1441.
J.M. Rafí et al: 2 MEV Electron Irradiation Effects on the Electrical Characteristics of Metal-Oxide-Silicon Capacitors With Atomic Layer Deposited Al2O3, HfO2 and Nanolaminated Dielectrics, Solid-State Electronics 79 (2013) 65-74.
Anatoliy N. Sokolov et al: Chemical and Engineering Approaches to Enable Organic Field-Effect Transistors for Electronic Skin Applications, Accounts of Chemical Research, pp. 361-371, Apr. 25, 2012, vol. 45, No. 3.
I-Shun Wang et al: Immobilization of Enzyme and Antibody on ALD-HfO2-EIS Structure By NH3 Plasma Treatment, Nanoscale Research Letters 2012, 7:179, pp. 1-6.
Sufi Zafar et al: Optimization of PH Sensing Using Silicon Nanowire Field Effect Transistors With HfO2 as the Sensing Surface, Nanotechnology 22 (2011) 405501, pp. 1-6.
Akam Aboubakri et al: Modeling of a Passive-Valve Piezoelectric Micro-Pump: A Parametric Study, Micromachines, Aug. 2020, 11, 752, pp. 1-14.
Shelly Aggarwal et al: Experimental Characterization of Piezoelectrically Actuated Micromachined Silicon Valveless Micropump, Microfluid Nanofluid (2017) 21:2, pp. 1-11.
Tatsuhiko Aizawa et al: Microforming of Stainless Steel Miniature Pump By Additive Sheet-Manufacturing, Materials Transactions, vol. 61, No. 2 (2020), pp. 266-271.
Yagmur Akin: Integrated Biocompatible Piezoelectric Micropump System With Nanoliter Volume Precision, Open Access Theses, Jul. 30, 2016, pp. 1-71.
A. Alipour et al: Design and Simulation of a Magnetohydrodynamic Micro-Pump to Provide Time Varying Tensile Force for Vibration Suppression in Viscoelastic Micro-Beams, Journal of Mechanical Science and Technology 33 (5) (2019) 2149-2159.

Raffaele Ardito et al: Intrinsic Dissipation in Microelectromechanical Systems, 9th. Int. Conf. on Thermal, Mechanical and Multiphysics Simulation and Experiments in Micro-Electronics and Micro-Systems, EuroSimE 2008, IEEE, 2008, pp. 1-8.
Ravi Kant Avvari: A Novel Two-Indenter Based Micro-Pump for Lab-On-A-Chip Application: Modeling and Characterizing Flows for a Non-Newtonian Fluid, Sasi Institute of Technology & Engineering, Feb. 16, 2020, pp. 1-20.
Javid Azimi-Boulali et al: A Study on the 3D Fuid Fow of MHD Micropump, Journal of the Brazilian Society of Mechanical Sciences and Engineering, Oct. 9, 2019, 41:478, pp. 1-15.
Rohit D. Bankar et al: Computational Analysis of a Piezo-Electrically Actuated Valve-Less Micropump for Micro-Fluidic Applications, International Journal of New Technology and Research (IJNTR), 2454-4116, vol. 5, Issue-4, Apr. 2019, pp. 51-55.
Qibo Bao et al: A Novel PZT Pump With Built-In Compliant Structures, Sensors 2019, 19, 1301, pp. 1-15.
Dr. Bernd Becker: A Normally-Closed, Backpressure Independent Peristaltic Micropump Featuring a Modular Setup, 2011, pp. 1-130.
Regine Behlert et al: Inspired By Nature: Efficient Piezoelectric MEMS Actuator Based on Wavelike Excitation, Transducers 2019—Eurosensors XXXIII, Berlin, Germany, Jun. 23-27, 2019, pp. 2344-2347.
Farideh Abhari et al: A Comprehensive Study of Micropumps Technologies, Int. J. Electrochem. Sci., 7 (2012) 9765-9780.
Roger Bodén: Microactuators for Powerful Pumps, Digital Comprehensive Summaries of Uppsala Dissertations from the Faculty of Science and Technology 578, pp. 1-50.
Chunfu Chen et al: Volumetric Displacement in Large Deflection of Symmetrically Layered Piezoelectric Plate Under Pretension, IOP Conf. Series: Materials Science and Engineering 735 (2020) 012030, MSEE 2019, pp. 1-9.
Chiang-Ho Cheng et al: Characteristic Studies of a Novel Piezoelectric Impedance Micropump, Microsyst Technol, Dec. 30, 2015, pp. 1-9.
Fraunhofer EMFT: Stainless Steel Micropumps for Medical-, Laboratory- and Analysis Technology, Fraunhofer Research Institution for Microsystems and Solid State Technologies EMFT, pp. 1-2.
Max M. Gong et al: Hand-Powered Microfluidics: A Membrane Pump With a Patient-To-Chip Syringe Interface, Biomicrofluidics 6, 044102 (2012), pp. 1-14.
Dean Johnson: Integration Technologies for Implantable Microsystems, Thesis, Rochester Institute of Technology, Jun. 5, 2013, pp. 1-123.
Sina Khalilian: Development of a Low Cost Micro-Pump, University of Calgary, Sep. 6, 2012, pp. 1-185.
Veer Surendra Sai University of Technology Burla, Odisha: E-Lecture Notes on Precision Engineering (PE), Department of Production Engineering, pp. 1-296.
Jae Hwan Lee: Drug Delivery Microdevice: Design, Simulation, and Experiments, Virginia Commonwealth University, 2013, pp. 1-148.
Hyunjoo J. Lee et al: MEMS Devices for Drug Delivery, Advanced Drug Delivery Reviews 128 (2018) 132-147.
Lin Li et al: Advancement of Electroosmotic Pump in Microflow Analysis: A Review, Analytica Chimica Acta, Feb. 9, 2019, pp. 1-70.
Ali Mahnama et al: A Study on Implantable Micropump Systems for Drug Delivery, Proceedings of the ECCOMAS Thematic International Conference on Simulation and Modeling of Biological Flows (SIMBIO 2011), Sep. 21-23, 2011, VUB, Brussels, Belgium, pp. 1-9.
Ellis Meng et al: Micro- and Nano-Fabricated Implantable Drug-Delivery Systems, Therapeutic Delivery (2012) 3(12), 1457-1467.
Christopher J. Morris et al: Low-Order Modeling of Resonance for Fixed-Valve Micropumps Based on First Principles, Journal of Microelectromechanical Systems, vol. 12, No. 3, Jun. 2003, pp. 325-334.
Majid Nabavi: Steady and Unsteady Flow Analysis in Microdiffusers and Micropumps: A Critical Review, Microfluid Nanofluid (2009) 7:599-619.
A. Nisar et al: MEMS-Based Micropumps in Drug Delivery and Biomedical Applications, Sensors and Actuators B 130 (2008) 917-942.

(56) References Cited

OTHER PUBLICATIONS

Manuel Ochoa et al: Polymeric Microdevices for Transdermal and Subcutaneous Drug Delivery, Advanced Drug Delivery Reviews 64 (2012) 1603-1616.

Joel S. Paustian et al: Induced Charge Electroosmosis Micropumps Using Arrays of Janus Micropillars, Lab Chip, 2014, 14, 3300-3312.

S. Revathi et al: Analytical Modelling and Numerical Simulation of 0-3 PZT/PVDF Composite Actuated Micropump, Advances in Materials and Processing Technologies, 2020, pp. 1-24.

Assaf Shaked et al: In Vitro and in Vivo Performance of a Pre-Filled, Electrochemically-Actuated Infusion System, Pharm Res, Jul. 29, 2015, pp. 1-9.

N. Schneeberger et al: Drug Delivery Micropump With Built-In Monitoring, Procedia Chemistry 1 (2009) 1339-1342.

E.A. Sideris et al: Pumps Operated By Solid-State Electromechanical Smart Material Actuators—A Review, Sensors and Actuators A 307 (2020) 111915, pp. 1-20.

Southwest Center for Microsystems Education (SCME): Micropumps Overview: Primary Knowledge Unit Participant Guide, pp. 1-14.

Mark Staples et al: Application of Micro- and Nano-Electromechanical Devices to Drug Delivery, Pharmaceutical Research, vol. 23, No. 5, May 2006, pp. 847-863.

Mark Staples: Microchips and Controlled-Release Drug Reservoirs, vol. 2, Jul./Aug. 2010, pp. 400-417.

Ming Tang et al: Design and Experimental Verification of a PZT Pump With Streamlined Flow Tubes, Appl. Sci. 2019, 9, 3881, pp. 1-15.

E. L. P. Uhlig et al: The Electro-Osmotic Actuation of Implantable Insulin Micropumps, Journal of Biomedical Materials Research, vol. 17, 931-943 (1983).

David C. Walther et al: Advances and Challenges in the Development of Power-Generation Systems at Small Scales, Progress in Energy and Combustion Science 37 (2011) 583-610.

Yu-Hisang Wang et al: Design and Analysis of Impedance Pumps Utilizing Electromagnetic Actuation, Sensors 2010, 10, 4040-4052.

Yao-Nan Wang et al: Micropumps and Biomedical Applications—A Review, Microelectronic Engineering, Apr. 5, 2018, pp. 1-67.

Jumril Yunas et al: Polymer-Based MEMS Electromagnetic Actuator for Biomedical Application: A Review, Polymers 2020, 12, 1184, pp. 1-21.

Mohammad Zaki et al: Implantable Drug Delivery System: a Review, International Journal of PharmTech Research, vol. 4, No. 1, pp. 280-292, Jan.-Mar. 2012.

Jan G. Smits: Piezoelectric Micropump With Three Valves Working Peristaltically, Sensors and Actuators A: Physical, vol. 21, Issues 1-3, 1990, pp. 203-206.

Joshua K. Herr et al: Characterizing Normal-Use Temperature Conditions of Pumped Insulin, Journal of Diabetes Science and Technology, 2014, vol. 8(4), pp. 850-854.

Bruce R. King et al: Changes in Altitude Cause Unintended Insulin Delivery From Insulin Pumps, Diabetes Care, vol. 34, Sep. 2011, pp. 1932-1933.

Takashi Murata et al: Safety of the Batteries and Power Units Used in Insulin Pumps: A Pilot Cross-Sectional Study By the Association for the Study of Innovative Diabetes Treatment in Japan, J Diabetes Investig vol. 9 No. 4, Jul. 2018, pp. 903-907.

Mark M. Uslan et al: Accessibility of Insulin Pumps for Blind and Visually Impaired People, Diabetes Technology & Therapeutics vol. 6, No. 5, 2004, pp. 621-634.

Jun Huang et al: A Valveless Piezoelectric Micropump Based on Projection Micro Litho Stereo Exposure Technology, IEEE, vol. 7, 2019, pp. 77340-77347.

Jacopo Baima et al: Surface Thermodynamics of Silicate Compounds: The Case of ZN 2 SiO 4 (001) Surfaces and Thin Films, Physical Chemistry Chemical Physics, Royal Society of Chemistry, 2019, 21 (24), pp. 13287-13295.

Eric Chappel et al: Infusion Micro-Pump Development Using MEMS Technology, Smart Systems Integration, Mesago, Mar. 2012, pp. 1-6.

Song Chen et al: The Structure of Wheel Check Valve Influence on Air Block Phenomenon of Piezoelectric Micro-Pump, Micromachines 2015, 6, 1745-1754.

W. S. Jackman et al: For Insulin Infusion: A Miniature Precision Peristaltic Pump and Silicone Rubber Reservoir, Diabetes Care, vol. 3 No. 2, Mar.-Apr. 1980, pp. 322-331.

Ling-Sheng Jang et al: A Stand-Alone Peristaltic Micropump Based on Piezoelectric Actuation, Biomed Microdevices (2007) 9:185-194.

Ling-Sheng Jang et al: Peristaltic Piezoelectric Micropump System for Biomedical Applications, Biomed Microdevices (2007) 9:619-626.

Ling-Sheng Jang et al: Effect of Actuation Sequence on Flow Rates of Peristaltic Micropumps With PZT Actuators, Biomed Microdevices (2009) 11:173-181.

Christoph Jenke et al: The Combination of Micro Diaphragm Pumps and Flow Sensors for Single Stroke Based Liquid Flow Control, Sensors 2017, 17, 755, pp. 1-19.

Kan Junwu et al: Design and Test of a High-Performance Piezoelectric Micropump for Drug Delivery, Sensors and Actuators A 121 (2005) 156-161.

* cited by examiner

PUMP /VALVE CHAMBER CROSS SECTION
102

PUMP AND VALVE ARE CONNECTED BY CHANNELS

EXAMPLE LAYOUT (ACTUATOR NOT SHOWN)

INLET / OUTLET

CHAMBER / CAVITY

INLET / OUTLET

NO VALVES

EXAMPLE LAYOUT (ACTUATORS NOT SHOWN)

INLET /
OUTLET

CHAMBER / CAVITY

INLET /
OUTLET

INLET /
OUTLET

NO VALVES

EXAMPLE LAYOUT (ACTUATORS NOT SHOWN)

INLET /
OUTLET

CHAMBER / CAVITY

INLET / OUTLET

FUNNELS                FUNNELS

Figures 8, 9, 10:
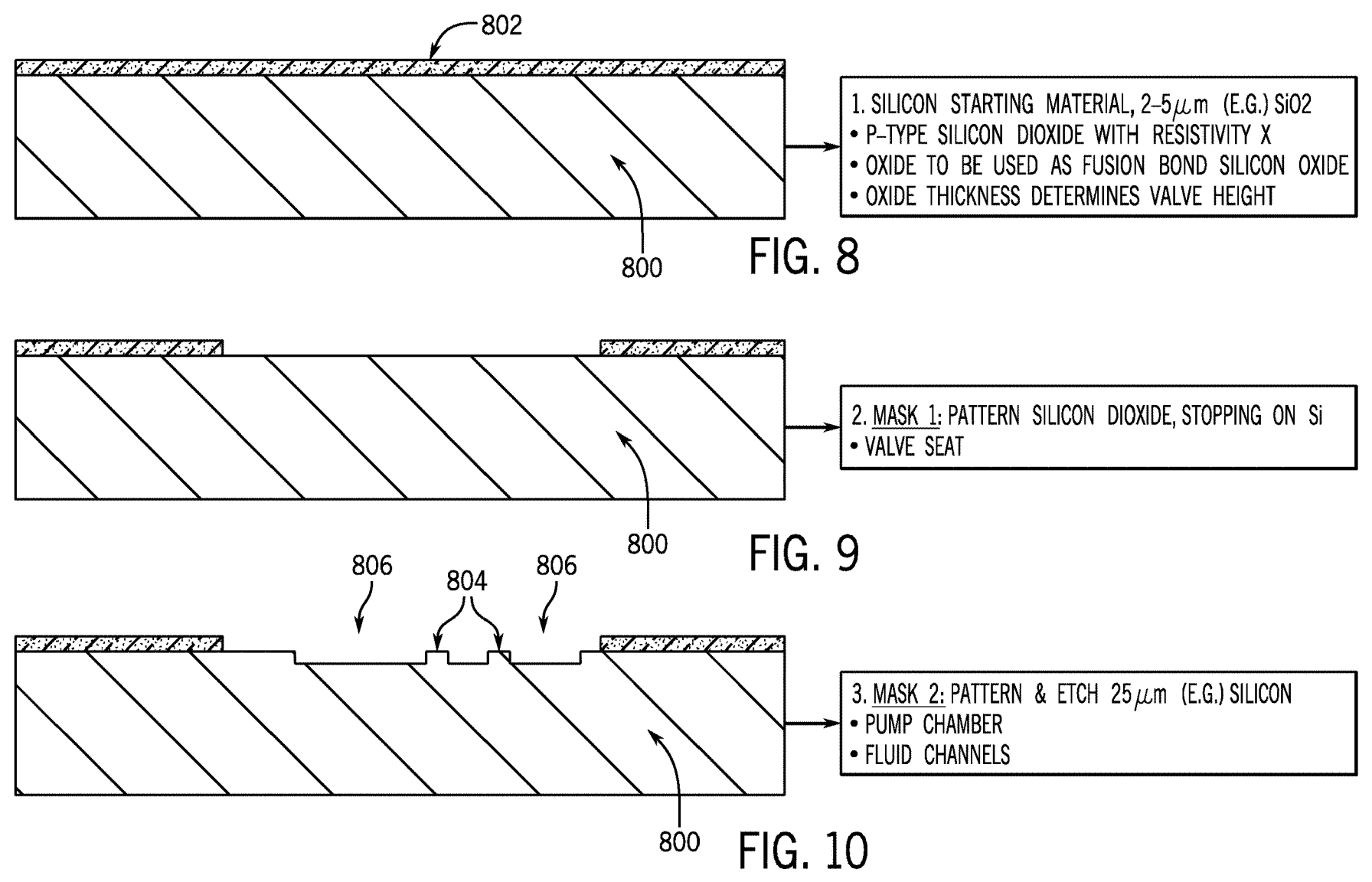

1. SILICON STARTING MATERIAL, 2-5$\mu$m (E.G.) SiO2
• P-TYPE SILICON DIOXIDE WITH RESISTIVITY X
• OXIDE TO BE USED AS FUSION BOND SILICON OXIDE
• OXIDE THICKNESS DETERMINES VALVE HEIGHT

2. MASK 1: PATTERN SILICON DIOXIDE, STOPPING ON Si
• VALVE SEAT

3. MASK 2: PATTERN & ETCH 25$\mu$m (E.G.) SILICON
• PUMP CHAMBER
• FLUID CHANNELS

4. MASK 3: PATTERN AND ETCH 150-300$\mu$m (E.G.) SILICON
- INLET/OUTLET
- GROW 10nm LINER OXIDE (NOT SHOWN)

5. FUSION BOND SOI WAFER
- $T_{si}$ 10 $\mu$m (E.G.)
- $T_{box}$ 1 $\mu$m (E.G.)

6. REMOVE HANDLE WAFER, STRIP BOX

810

800

812

802

7. 10–20nm THERMAL OXIDATION FOR BOTTOM SILICON DIOXIDE
• INSULATION SILICON DIOXIDE

800

8. 0.1nm PLATINUM (PT), 2 μm PZT
• Pt IS GROUND (GND) ELECTRODE

9. MASK 4: PATTERN AND ETCH PZT
• STOP ON Pt

10. MASK 5: PATTERN AND ETCH BOTTOM ELECTRODE
 • STOP ON OXIDE

11. DEPOSIT ILD / PASSIVATION, OXIDE / NITRIDE

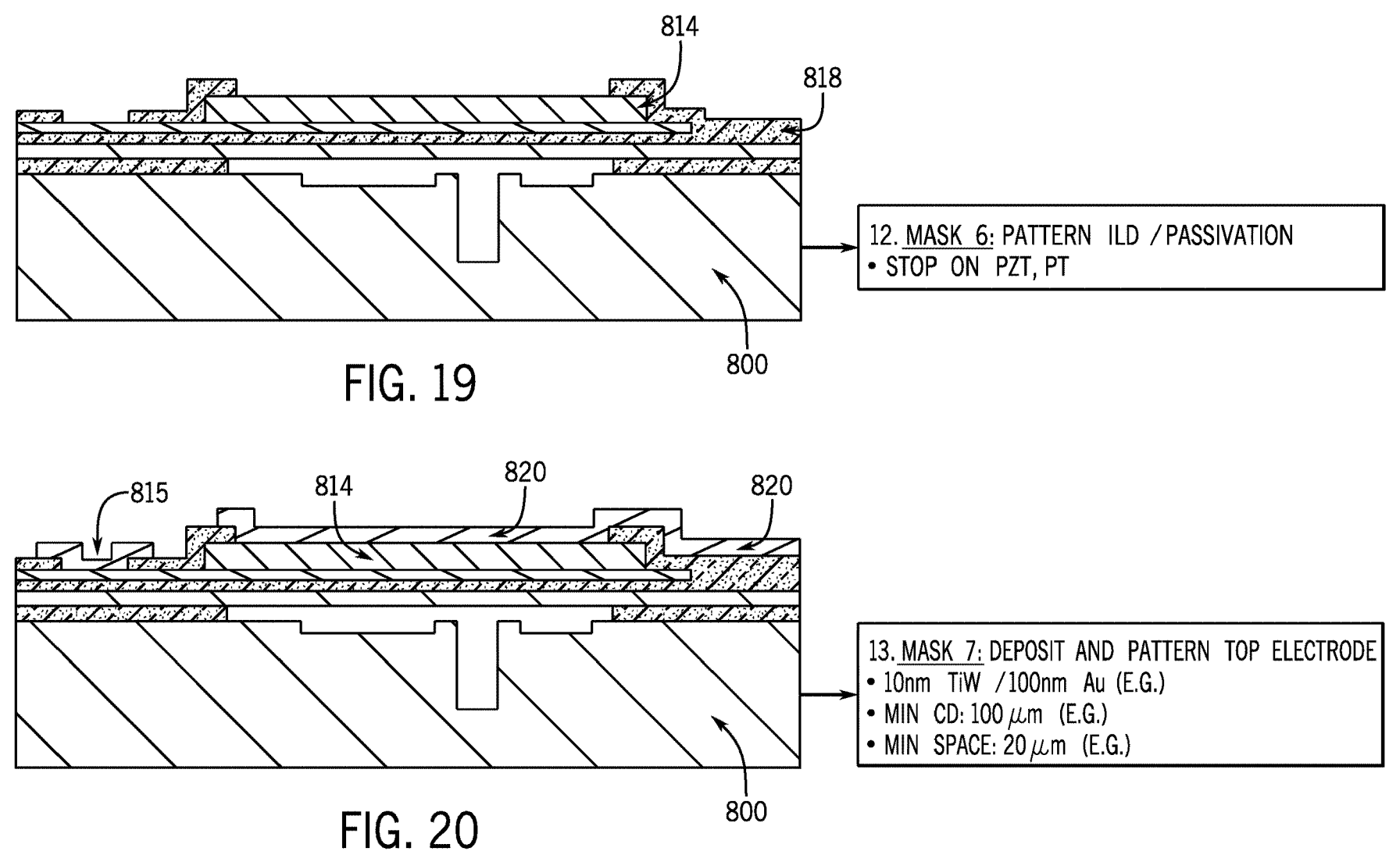

12. MASK 6: PATTERN ILD / PASSIVATION
  • STOP ON PZT, PT

FIG. 19

13. MASK 7: DEPOSIT AND PATTERN TOP ELECTRODE
  • 10nm TiW /100nm Au (E.G.)
  • MIN CD: 100 μm (E.G.)
  • MIN SPACE: 20 μm (E.G.)

FIG. 20

14. <u>MASK 8:</u> Au WIREBOND PADS
• PLATE 1μm Au ON PADS

15. BACKGRIND AND VIA REVEAL ETCH
• FINAL THICKNESS: 150-300 μm
• BACK-GRIND CANNOT CLEAR VIA
• SF6 BLANKET ETCH TO OPEN VIA
• DRY POLYMER CLEANUP MAY BE NEEDED

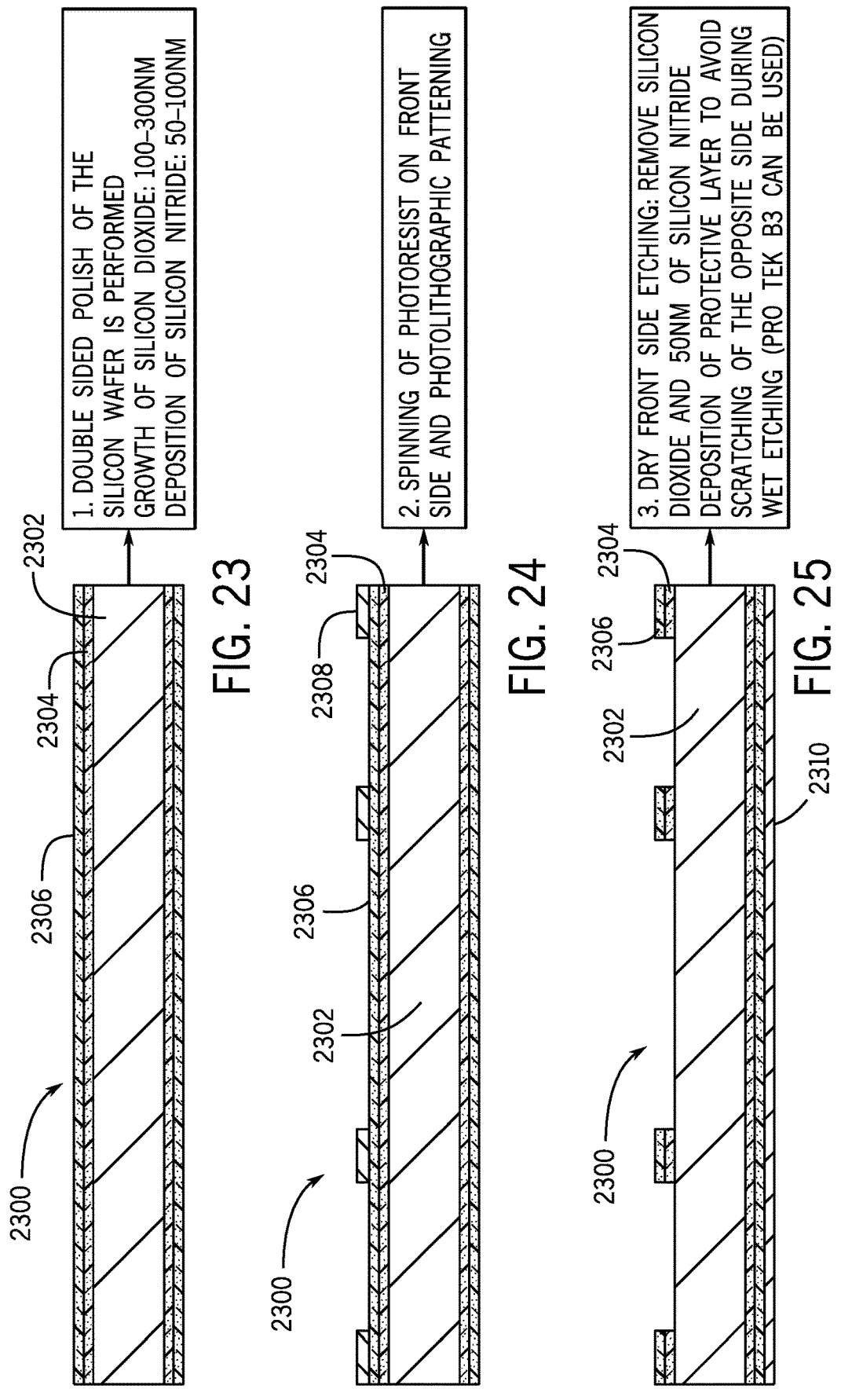

1. DOUBLE SIDED POLISH OF THE SILICON WAFER IS PERFORMED GROWTH OF SILICON DIOXIDE:100-300NM DEPOSITION OF SILICON NITRIDE: 50-100NM

FIG. 23

2. SPINNING OF PHOTORESIST ON FRONT SIDE AND PHOTOLITHOGRAPHIC PATTERNING

FIG. 24

3. DRY FRONT SIDE ETCHING: REMOVE SILICON DIOXIDE AND 50NM OF SILICON NITRIDE DEPOSITION OF PROTECTIVE LAYER TO AVOID SCRATCHING OF THE OPPOSITE SIDE DURING WET ETCHING (PRO TEK B3 CAN BE USED)

FIG. 25

4. WET ETCHING OF PUMP AND VALVE DIAPHRAGM WET CHEMICAL REMOVAL OF SILICON OXIDE AND SILICON NITRIDE

5. SPINNING OF PHOTORESIST ON THE REVERSE SIDE AND PHOTOLITHOGRAPHIC PATTERNING OXYGEN PLASMA AND PIRANHA CLEANING (HOT SULFURIC ACID) USED TO REMOVE PROTECTIVE LAYER

6. SILICON DEPTH ETCHING OF THE BACK SIDE

7. GROWTH OF SILICON OXIDE 400NM

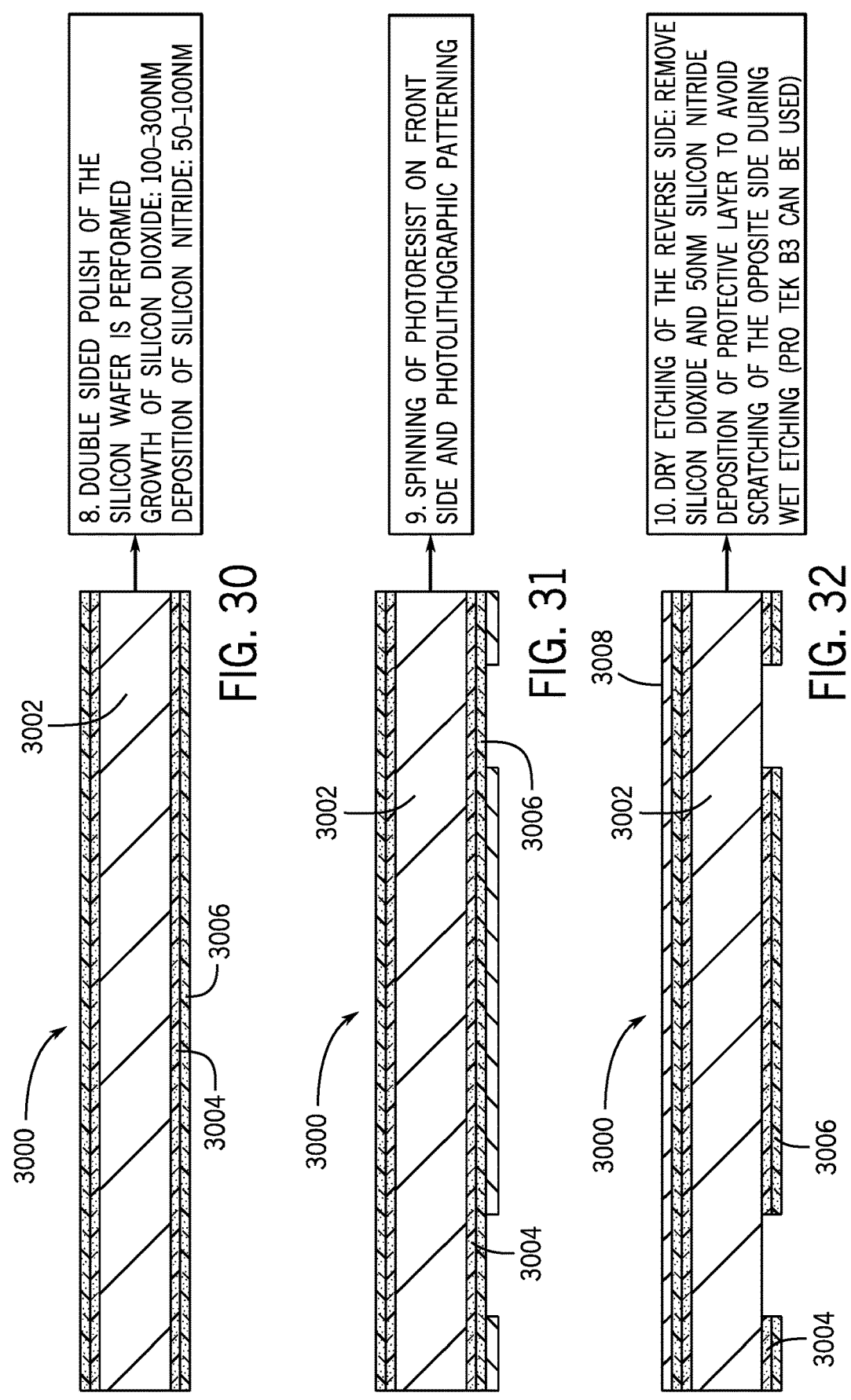

8. DOUBLE SIDED POLISH OF THE SILICON WAFER IS PERFORMED GROWTH OF SILICON DIOXIDE: 100–300NM DEPOSITION OF SILICON NITRIDE: 50–100NM

FIG. 30

9. SPINNING OF PHOTORESIST ON FRONT SIDE AND PHOTOLITHOGRAPHIC PATTERNING

FIG. 31

10. DRY ETCHING OF THE REVERSE SIDE: REMOVE SILICON DIOXIDE AND 50NM SILICON NITRIDE DEPOSITION OF PROTECTIVE LAYER TO AVOID SCRATCHING OF THE OPPOSITE SIDE DURING WET ETCHING (PRO TEK B3 CAN BE USED)

FIG. 32

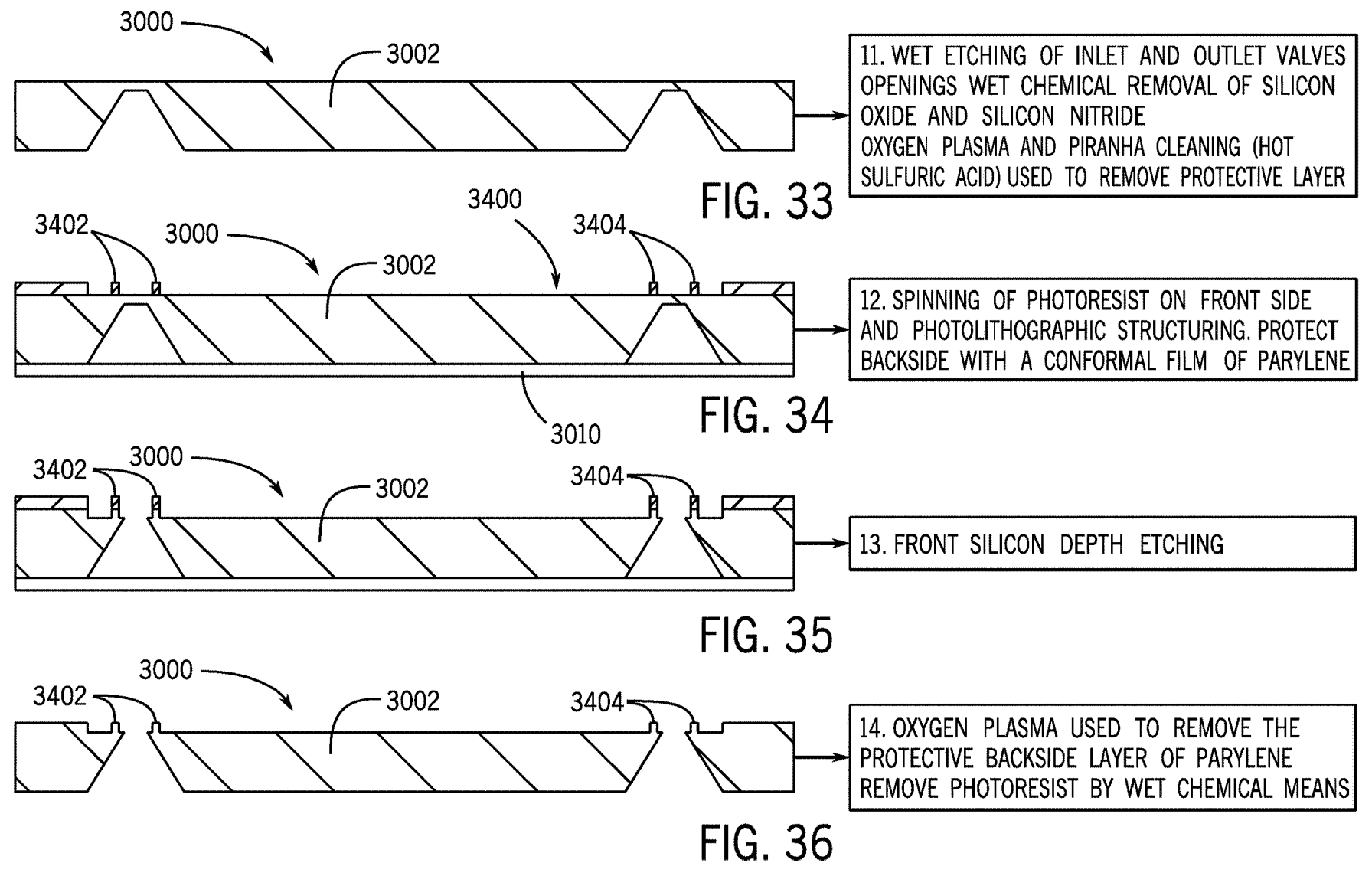

11. WET ETCHING OF INLET AND OUTLET VALVES OPENINGS WET CHEMICAL REMOVAL OF SILICON OXIDE AND SILICON NITRIDE OXYGEN PLASMA AND PIRANHA CLEANING (HOT SULFURIC ACID) USED TO REMOVE PROTECTIVE LAYER

FIG. 33

12. SPINNING OF PHOTORESIST ON FRONT SIDE AND PHOTOLITHOGRAPHIC STRUCTURING. PROTECT BACKSIDE WITH A CONFORMAL FILM OF PARYLENE

FIG. 34

13. FRONT SILICON DEPTH ETCHING

FIG. 35

14. OXYGEN PLASMA USED TO REMOVE THE PROTECTIVE BACKSIDE LAYER OF PARYLENE REMOVE PHOTORESIST BY WET CHEMICAL MEANS

FIG. 36

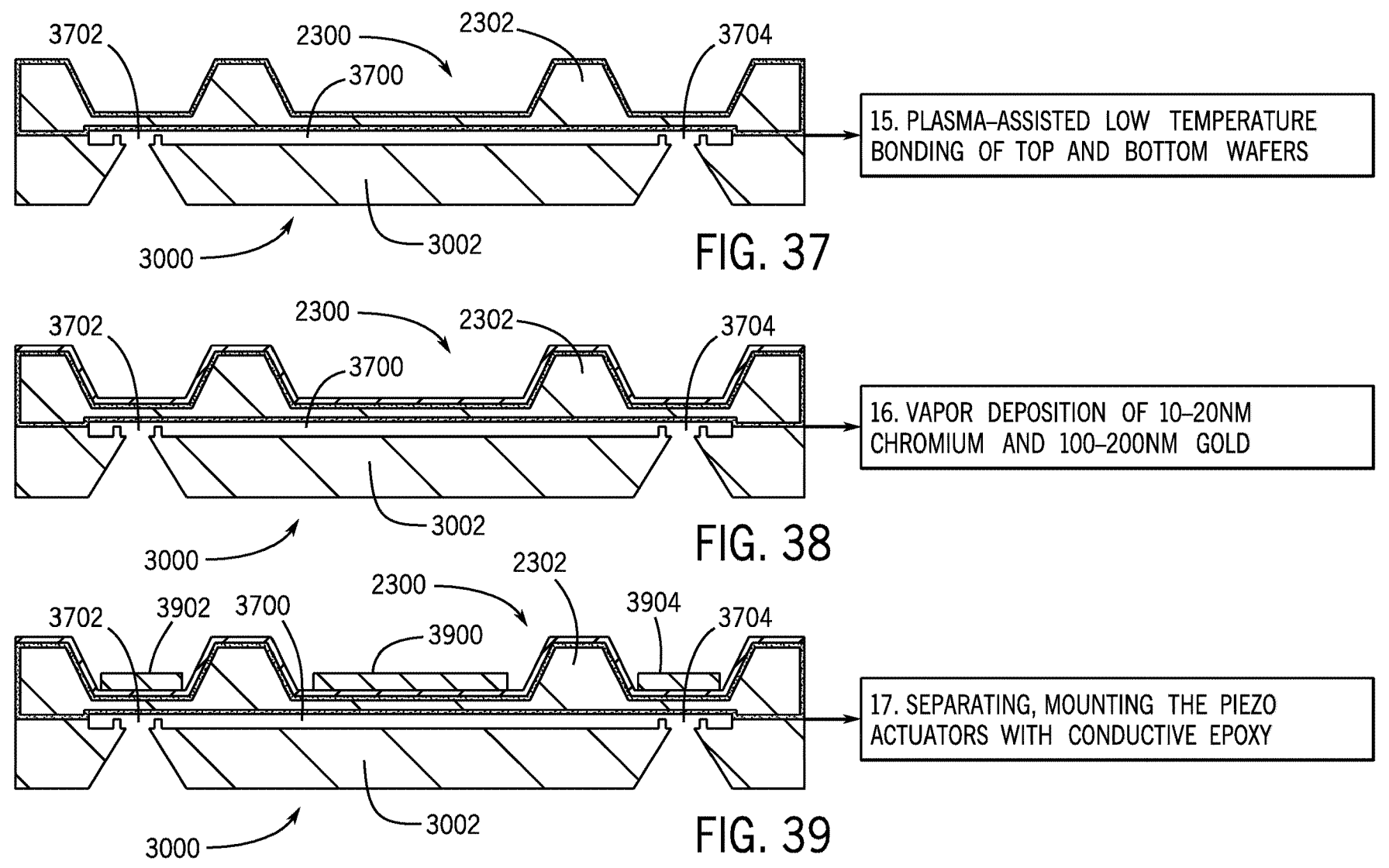

15. PLASMA-ASSISTED LOW TEMPERATURE BONDING OF TOP AND BOTTOM WAFERS

FIG. 37

16. VAPOR DEPOSITION OF 10-20NM CHROMIUM AND 100-200NM GOLD

FIG. 38

17. SEPARATING, MOUNTING THE PIEZO ACTUATORS WITH CONDUCTIVE EPOXY

FIG. 39

MICROPUMP AND METHOD OF FABRICATING THE SAME

CROSS-REFERENCE TO RELATED APPLICATIONS

This application claims priority to U.S. provisional application No. 62/940,191, filed Nov. 25, 2019 which is incorporated by reference herein.

FIELD OF THE INVENTION

The present invention relates to a micropump and a method of fabricating the same.

BACKGROUND OF THE INVENTION

Various infusion systems exist that utilize devices for delivering liquid medication or other therapeutic fluid to patients subcutaneously. For patients with diabetes mellitus, for example, conventional infusion systems incorporate various pumps that are used to deliver insulin to a patient. These pumps have the capability of delivering assorted fluid delivery profiles which include specified basal rates and bolus requirements. For example, these pumps include a reservoir to contain the liquid medication along with electromechanical pumping technology to deliver the liquid medication via tubing to a needle that is inserted subcutaneously into the patient.

Although such conventional pumps/infusion systems are adequate for their intended purpose, there remains a need for an independent, portable pump with low power consumption to simplify the set up and assembly of these systems. There is also a need to provide an improved method of fabricating these systems.

SUMMARY OF THE INVENTION

A micropump and method of fabricating the micropump are disclosed.

In accordance with an embodiment of the present disclosure, a method is disclosed of fabricating a MEMS device that includes one or more wafers configured as pump or valve, the pump or valve includes an inlet port to receive fluid and an outlet port to release the fluid within the pump or valve, the method comprising: growing silicon dioxide on a silicon layer of the one or more wafers to form a silicon dioxide layer on the silicon layer; depositing silicon nitride on the silicon dioxide layer of the one or more wafers to form a silicon nitride layer on the silicon dioxide layer; spinning a front side of the one or more wafers to create a pattern thereon defining an area for the pump or valve; dry etching the wafer at the area for the pump or valve to remove the silicon dioxide and silicon nitride layers to define an opening for the pump or valve; and wet etching the silicon layer to remove the silicon dioxide and silicon nitride layers at the area to create a membrane for the pump or valve to thereby displace the fluid or prevent fluid flow within the pump or valve.

In accordance with an embodiment of the present disclosure, a method is disclosed of fabricating a MEMS device that includes one or more wafers configured as pump or valve, the pump or valve includes an inlet port to receive fluid and an outlet port to release the fluid within the pump or valve, the method comprising, the method comprising: growing silicon dioxide on a silicon layer of the one or more wafers to form a silicon dioxide layer on the silicon layer;

depositing silicon nitride on the silicon dioxide layer of the one or more wafers to form a silicon nitride layer on the silicon dioxide layer; spinning a front side of the wafer to create a pattern thereon defining an area for the pump or valve; dry etching the wafer at the area for the pump or valve to remove the silicon dioxide and silicon nitride layers to define an opening for the pump or valve; and wet etching the silicon layer to remove the silicon dioxide and silicon nitride layers at the area to create inlet and outlet openings of the one or more wafers.

In accordance with an embodiment of the present disclosure, a method is disclosed of fabricating a MEMS device that includes first and second wafers configured together as a pump or valve, the pump or valve includes an inlet port to receive fluid, an outlet port to release the fluid within the pump or valve and a chamber, communicating with the inlet port and outlet port, for storing the fluid within the pump or valve, the method comprising: growing silicon dioxide on a silicon layer of the first wafer to form a silicon dioxide layer on the silicon layer; depositing silicon nitride on the silicon dioxide layer of the first wafer to form a silicon nitride layer on the silicon dioxide layer; spinning a front side of the first wafer to create a pattern thereon defining an area for the pump or valve; dry etching the first wafer at the area for the pump or valve to remove the silicon dioxide and silicon nitride layers to define the opening for the pump or valve; wet etching the silicon layer of the first wafer to remove the silicon dioxide and silicon nitride layers at the area to create a membrane for the pump or valve to thereby displace the fluid within the chamber or prevent fluid flow from moving through the inlet port, the chamber and the outlet port within the pump or valve; and growing silicon dioxide on a silicon layer of the second wafer to form a silicon dioxide layer on the silicon layer; depositing silicon nitride on the silicon dioxide layer of the second wafer to form a silicon nitride layer on the silicon dioxide layer; spinning a front side of the second wafer to create a pattern thereon defining an area for the pump or valve; dry etching the second wafer at the area for the pump or valve to remove the silicon dioxide and silicon nitride layers to define an opening for the pump or valve; wet etching the silicon layer to remove the silicon dioxide and silicon nitride layers at the area to create inlet and outlet openings of the second wafer; bonding the first and second wafers to define the chamber of the pump chamber or valve; and mounting piezoelectric actuators in the membrane of the pump or valve.

In accordance with an embodiment of the present disclosure, a cavity substrate is disclosed of a MEMS device configured as a pump or valve with an inlet port to receive fluid and an outlet port release the fluid within the pump or valve, the substrate comprising: first and second silicon layers, the first layer configured as a membrane; and a chamber defined by the layers for receiving fluid, configured to communicate with the inlet and outlet ports, the chamber further configured in a rectangular or oblong shape, wherein the second layer configured to support the membrane over the chamber, to thereby enable the membrane to move fluid from the chamber or prevent the fluid from moving through the chamber.

In accordance with an embodiment of the present disclosure, a method is disclosed of fabricating cavity substrate of a MEMS device that is configured as a valve with an inlet port to receive fluid and an outlet port to release the fluid within the valve, the method comprising: depositing silicon dioxide onto a silicon layer to form a silicon dioxide layer; patterning and etching the silicon dioxide layer using lithography and plasma etch to create a height of the valve;

patterning and etching the silicon layer to form a valve seat and a chamber of the cavity substrate; patterning and etching the silicon layer to create the inlet and outlet ports of the cavity substrate; fusion bonding a silicon on insulator wafer to the cavity substrate; removing a handle wafer to expose the silicon layer as a membrane; depositing a piezoelectric stack on silicon oxide layer, the piezoelectric stack includes a piezoelectric element and an electrode layer between the piezoelectric element and the silicon dioxide layer; pattering and etching the piezoelectric (PZT) element; patterning and etching the electrode layer up to the silicon dioxide layer; depositing an interlayer dielectric layer (ILD) or passivation layer; patterning the interlayer dielectric layer until it reaches the electrode layer and piezoelectric element; depositing and patterning the electrode layer on top of the piezoelectric element and pads on bottom electrode layer; electroplating gold pads; and back grinding, etching and polishing the silicon layer short of the opening in the silicon layer.

BRIEF DESCRIPTION OF DRAWINGS

FIGS. 8-22 depict several stages and steps of valve fabrication and corresponding structure.
FIGS. 23-39 depict several stages and steps of another pump and valve fabrication along with the corresponding pump and valve structure.

DETAILED DESCRIPTION OF THE INVENTION

Figures 1, 2:
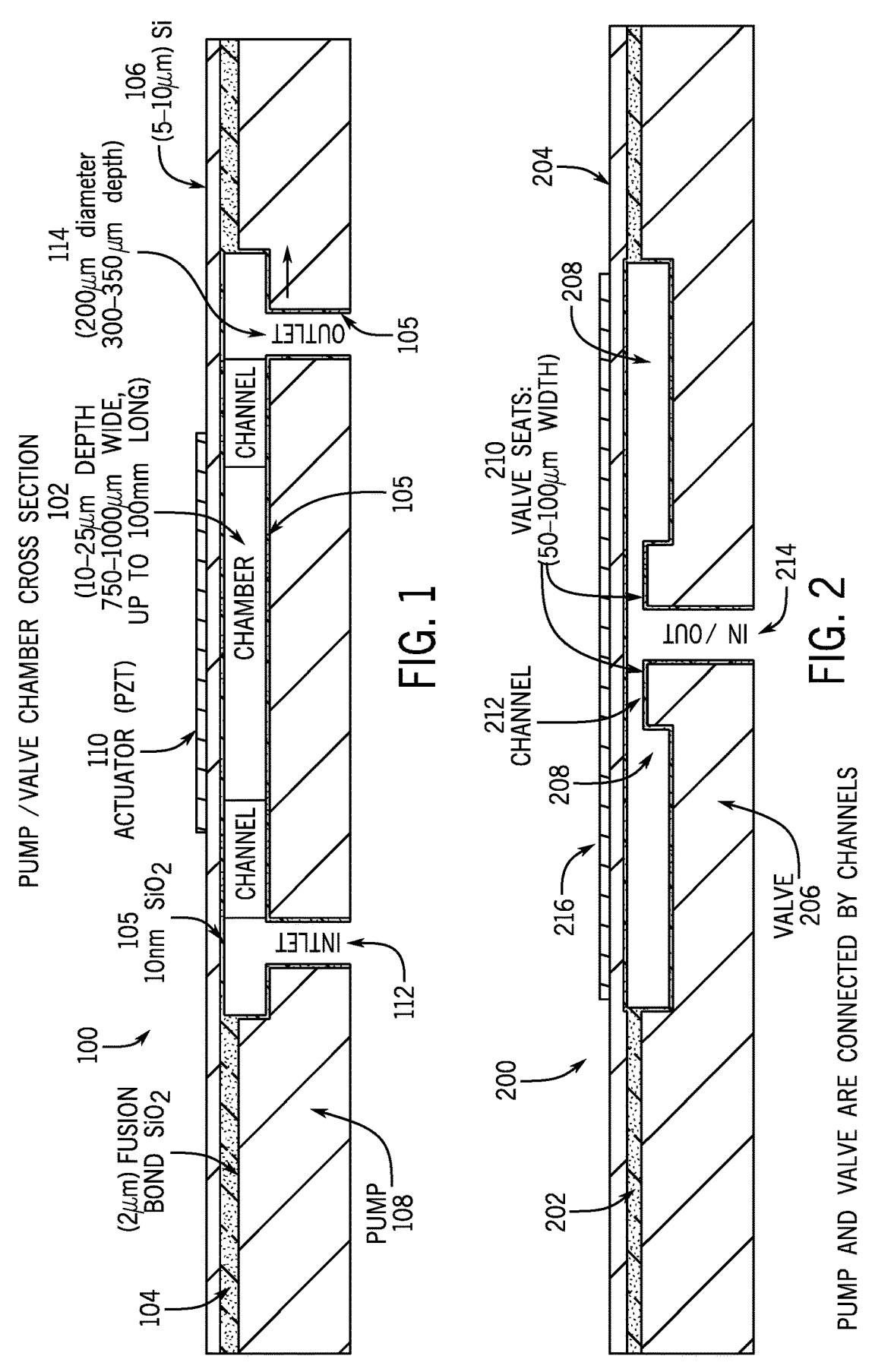
FIG. 1 depicts a cross sectional view of an example pump.
FIG. 2 depicts a cross sectional view of an example valve.

FIG. 1 depicts a cross sectional view of an example pump 100 as a micropump. Pump 100 is a MEMS (micro-electro-mechanical systems) device, as known to those skilled in the art, that can be used for pumping fluid, valves used for regulating flow, actuators used for moving or controlling the pump and valves and sensor used for sensing pressure. The MEMS device incorporates a piezoelectric transducer as known to those skilled in the art. (However, the MEMS devices may include a capacitive transducer or piezoresistive transducer) that acts as the active element for pumping fluid, but other MEMS structures or technology may be used to achieve desired results as known to those skilled in the art.). Pump 100 may be used in a drug infusion system for infusing a drug (i.e., medication) or other fluid to a patient (user). Medication may include small molecule pharmaceutical solutions, large molecule or protein drug solutions, saline solutions, blood or other fluids known to those skilled in the art. Insulin is an example fluid. However, pump 100 may be used in other environments known to those skilled in the art.

Pump 100 is configured to maximize pump efficiency per mm² (i.e., stroke volume per unit area per Watt). To this end, pump 100 is a cavity substrate that incorporates a chamber or cavity 102 that is configured as rectangular or oblong shaped, but it can be alternatively shaped as an elliptical, fillet, circular, square or other shaped pump cell known to those skilled in the art to achieve desired results. The structure and benefits of this chamber are described in detail below. (Note measurements shown in FIGS. 1-39 and described herein are example measurements. Those skilled in the art know that other values may be used for such measurements.)

Structurally, a silicon dioxide (SiO₂) layer 104 sits between silicon (Si) layers 106 and 108 as shown. Silicon dioxide layer 104 is used to fusion bond the silicon layers 106 and 108 (process details below). However, other techniques may be used to bond the silicon layers 106 and 108 as known to those skilled in the art. Silicon dioxide layer 105 lines the surface of chamber 102 as well as channels and inlet and outlet ports 112, 114 as shown. Chamber 102 communicates with inlet and outlet openings 112, 114 via the channels. Silicon layer 106 covers chamber 102 act upon the fluid within chamber 102 (i.e., to pump fluid—displace or draw fluid).

Silicon layer 106 functions as the membrane of the cavity substrate as known to those skilled in the art. Piezoelectric actuator 110 is layered on top of silicon layer 106 and it functions to pump or deform/bend silicon layer 106 to draw into or displace liquid contents from chamber 102 as known to those skilled in the art. It is the shape of the silicon layers 106 (and 206 below), i.e., the walls, along with the silicon dioxide layer 104 that define the shape of chamber 102 described hereinabove and the shape of inlet and outlets 112 and 114.

As indicated above, chamber 102 is configured as pump chamber (also known as a cavity or pump cell) that has a preferable width in the range of 200 μm-1 mm and a length of up to 10 mm, but other widths and lengths may be used as known to those skilled in the art. The maximum chamber 102 width is limited by manufacturing constraints (allowed sag, bow). By using a shaped cell as described hereinabove, area efficiency, i.e., fill factor—pump chamber (or valve chamber—below) area/total area, increases (over circular membranes) is optimized to reduce dead volume of the pumping chamber, with very little trade-off in reduction to stroke volume. This results in a larger compression ratio for the micropump and a larger per unit area and per watt of actuation power as known to those skilled in the art. To achieve the same net pumping efficiency with a rectangular or square piezoelectric chamber shape, more dead space (e.g., approximately 60-65% for rectangular as opposed to 80-85% packing efficiency for hexagonal piezoelectric transducer) must be incurred, and thus a lower compression ratio for the overall pump. Pump chambers (i.e., cavities or cells) may be arrayed in parallel or in series to increase total stroke volume.

As for fabrication (in brief), pump chamber 102 is completely sealed until the very last step in the fabrication process, thereby minimizing the propensity for defect or particle introduction during processing. That is, the pump and channels remain closed until the very end of fabrication processing. This is accomplished by dividing the final pump wafer thinning into two steps: a wafer grind/polish to within 25 μm of the inlet/outlet and a final blanket dry etch step to open up the inlet/outlet. This entire process is described in more detail below.

FIG. 2 depicts a cross sectional view of an example valve 200 (MEMS device). Valve 200 is also a cavity substrate that incorporates a silicon dioxide layer 202 between silicon layers 204 and 206 as shown. The silicon dioxide layer 202 is used to fusion bond the silicon layers 204 and 206 as described in more detail below. Silicon layer 204 functions as the membrane of the cavity substrate as known to those skilled in the art. Similar to the structure of pump 100 above, the shape of silicon layer 206 along with silicon oxide layer 202 define the shape of chamber 208 (or cavity) as a desired pump cell as described above.

Valve 200 includes two valve seats 210 that are defined by the shape of silicon layer 206 and silicon oxide layer 202 (liner). Valve seats 210 are configured to extend into chamber 208 and to define channel 212 and inlet/outlet 214. Piezoelectric actuator 216 is layered on top of silicon layer 204. Actuator 216 compresses against silicon layer 110 (membrane) to reach and seal valve seats 210 to discontinue flow through inlet/outlet 214 as known to those skilled in the art. (Note that a micropump may include any number of pumps and/or valves as described herein.)

Importantly, the fusion bond silicon oxide layer 202 thickness is configured to define the valve seat height (FIG. 9—Mask 1 in process flow below). The fusion bond silicon oxide is a thermally grown oxide that can be controlled very precisely (<3% total variation) from batch to batch. The silicon oxide is removed using a dry or wet etch in the active portion of the valve. The thickness of the silicon oxide will determine the clearance between the membrane and the valve seat.

Figure 3:
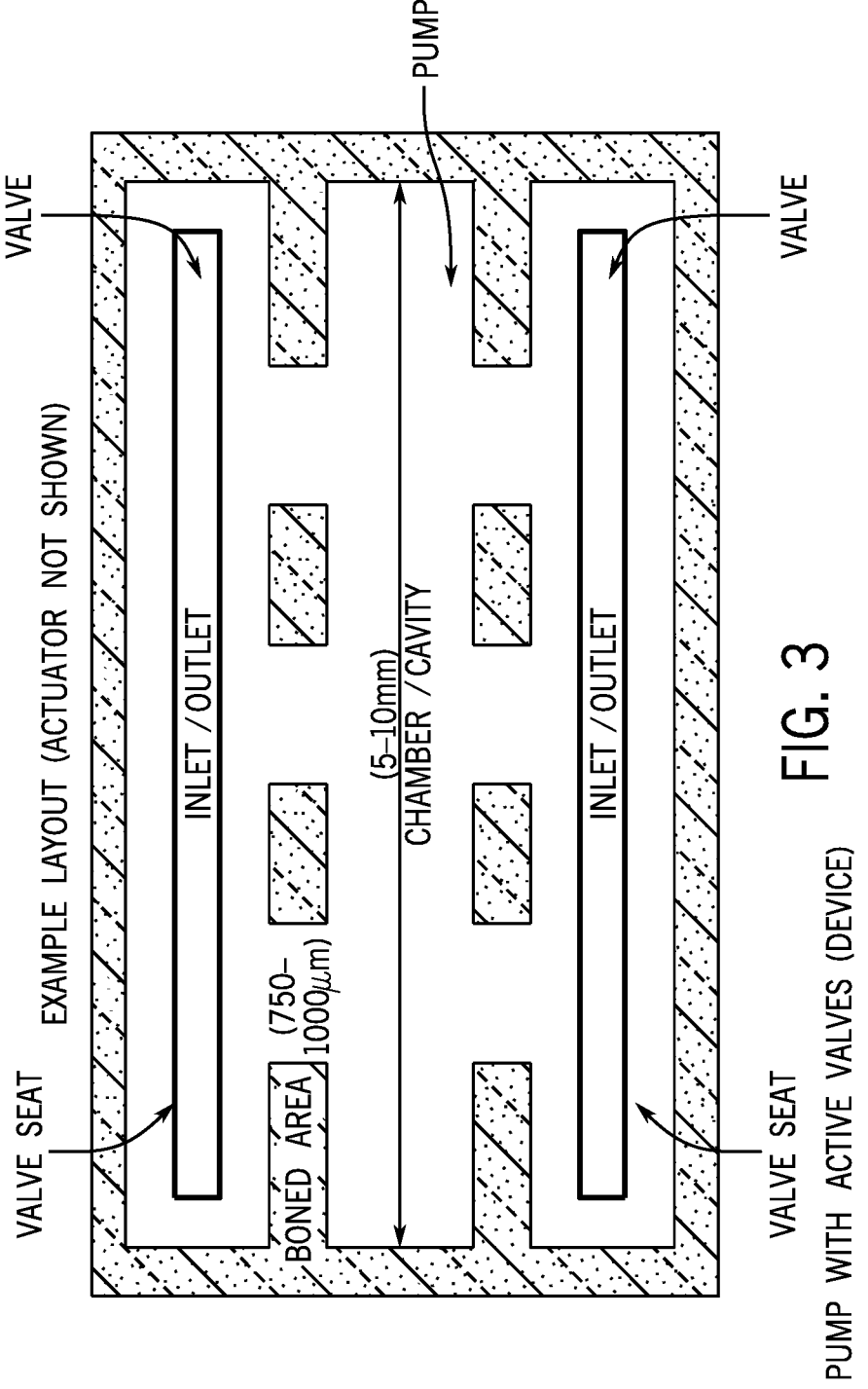
FIG. 3 depicts a top cross sectional view of an example pump in series with two valves.

FIG. 3 depicts a top cross sectional view of an example pump in series with two valves (layout in horizontal view). Specifically, there is one pump chamber (cavities or cells) connected to two active inlet/outlet valves. Each chamber (cavities or cell) has its own actuator (not shown). The valves also have actuators (not shown) as well as valve seats.

Figure 4:
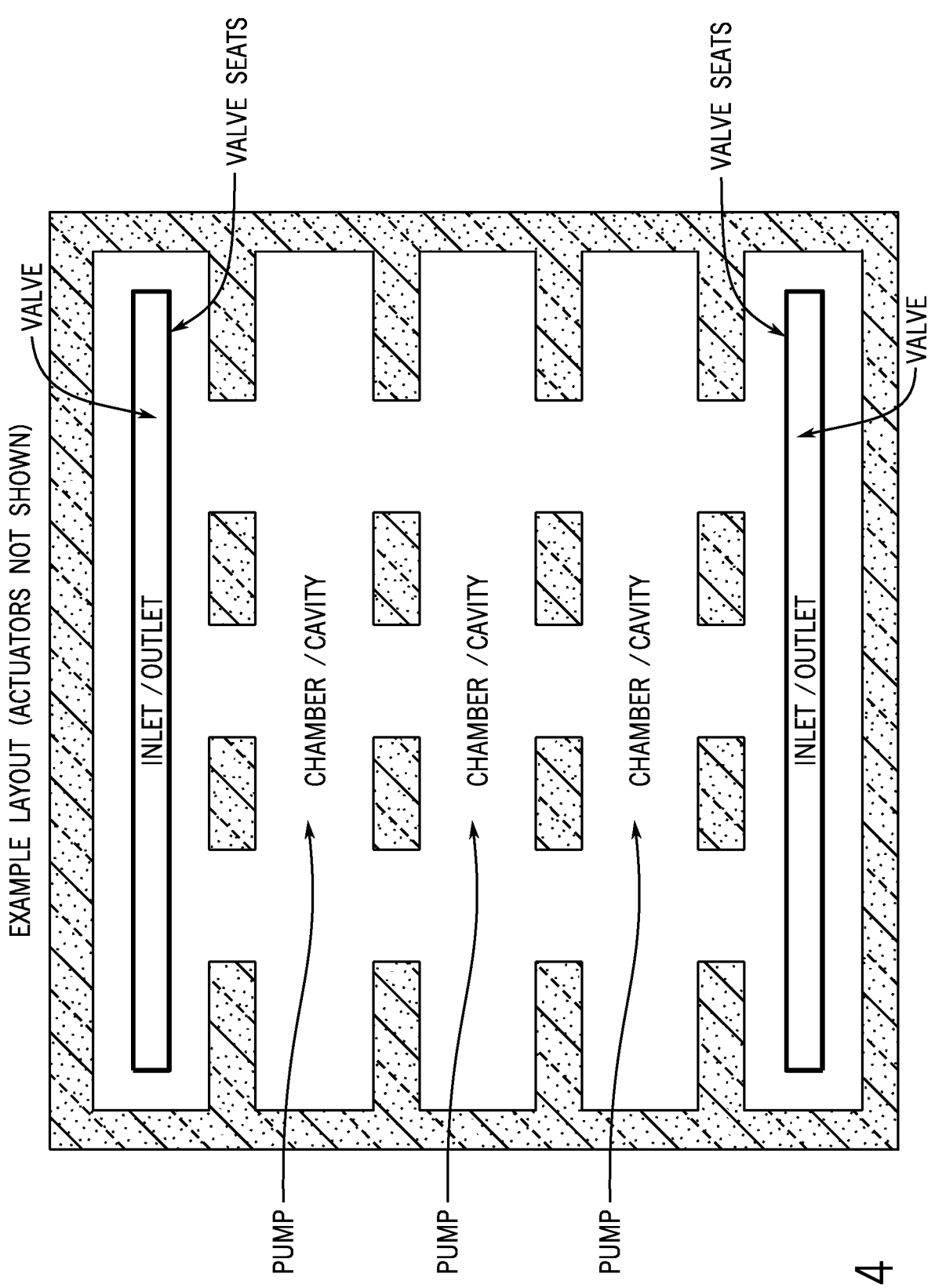
FIG. 4 depicts a top cross sectional view of several example pumps in series with active valves.

FIG. 4 depicts a top cross sectional view of several pumps (cells) in series with active valves. Specifically, three pumps are configured in series, each which includes a chamber along with an actuator (not shown). There are a total of three actuators for the pump (cells). Each inlet/outlet valve has its own actuator (not shown) as well as valve seats as shown.

Figure 5:
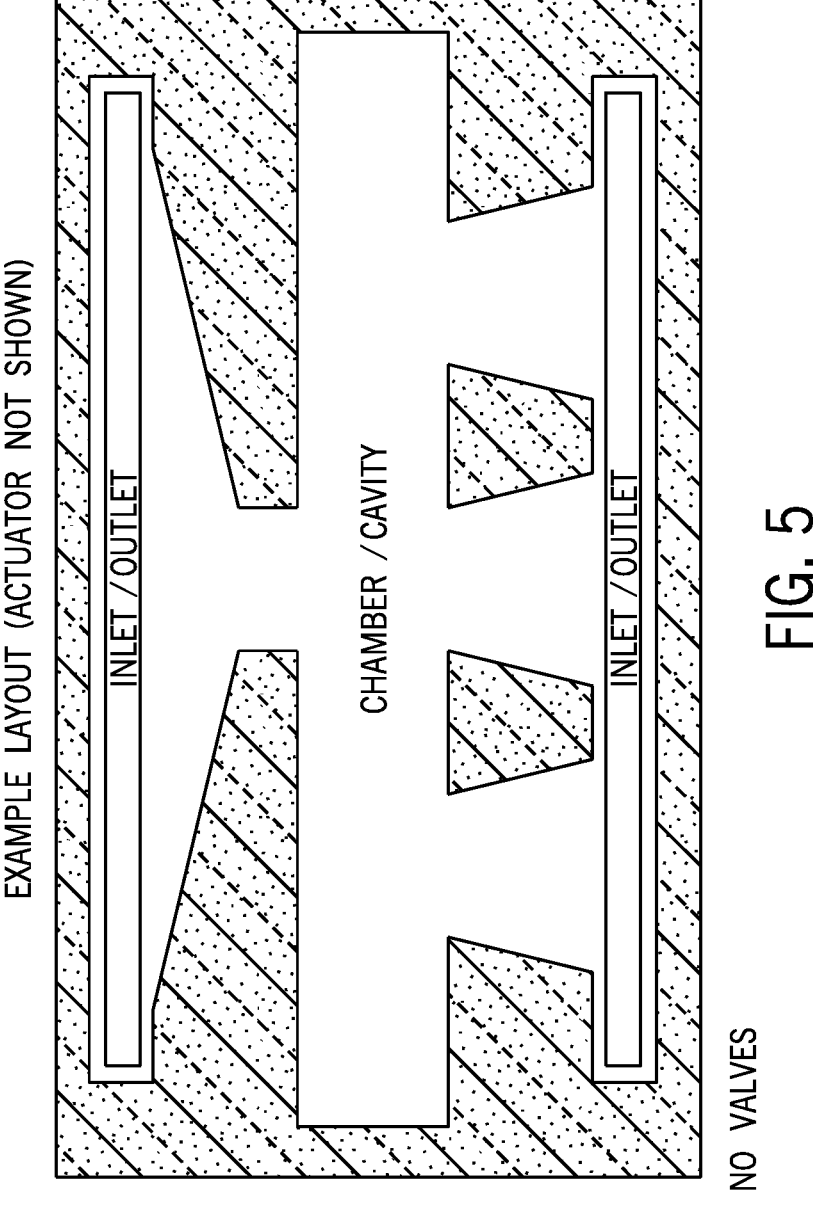
FIG. 5 depicts a top cross sectional view of another example pump.

FIG. 5 depicts a top cross sectional view of another example pump (positioned horizontally for viewing). This configuration has no valves. An actuator is configured over the chamber/cavity (not shown). The chamber shown leads to several funnels down to inlet/outlets. The funnels are shaped in such a way to create a rectifying flow behavior.

Figure 6:
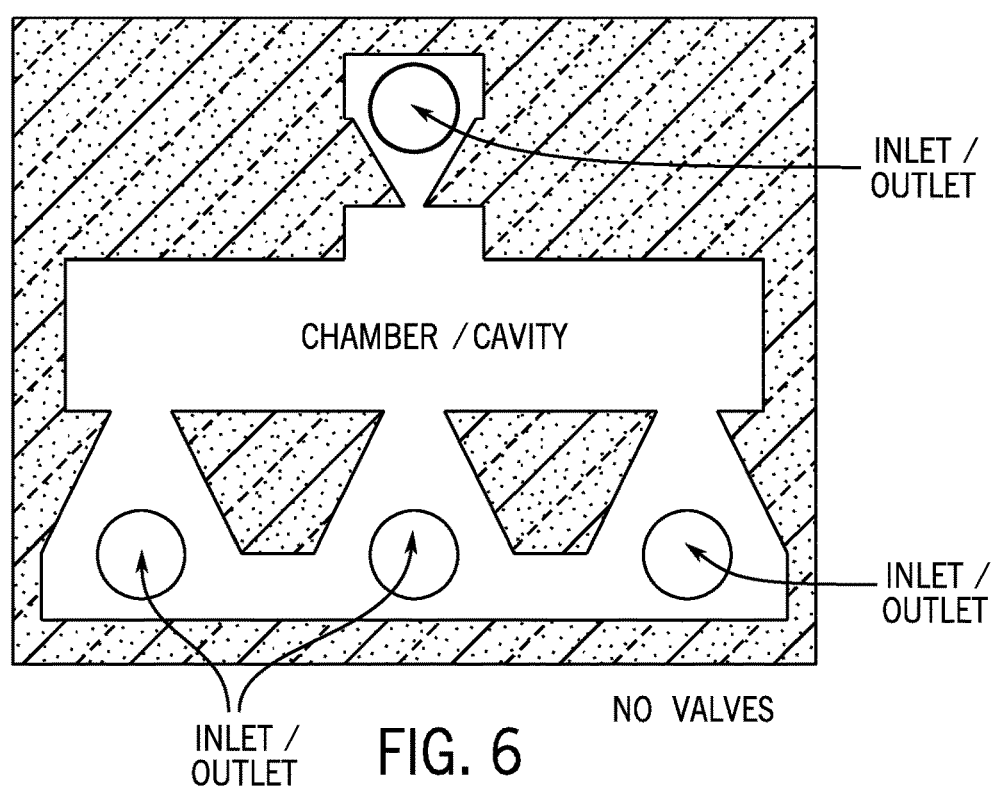
FIGS. 6 and 7 depict examples of two pumps.
Figure 7:
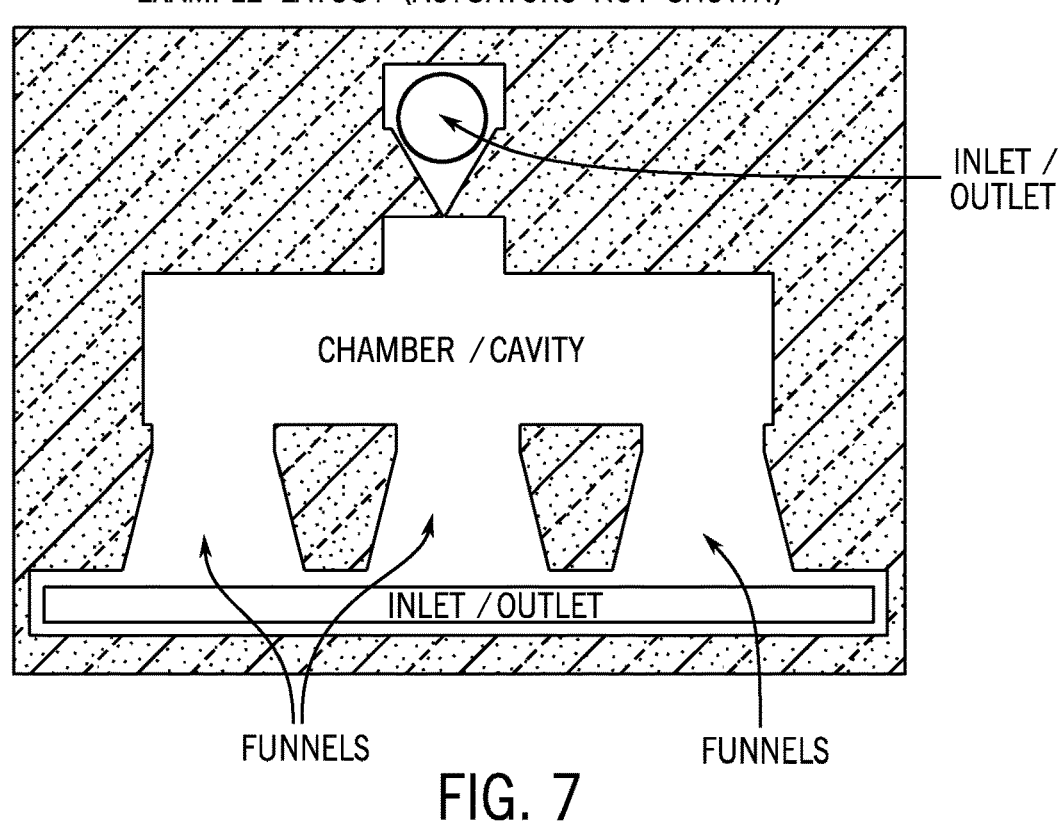

FIGS. 6 and 7 depict examples of two other pumps. In FIG. 6, a chamber communicates with several funnels that lead down to circular inlet and outlets. Actuators are used but not shown. In FIG. 7, the chamber leads to several funnels to a rectangular inlet/outlets. In the configurations with rectangular inlet/outlets, the pump is less prone to blocking due to air bubbles or particles.

FIGS. 8-22 depict several stages and steps of valve fabrication along with the corresponding valve structure. Cavity silicon on insulator substrate (CSOI) is initially created. To this end, the process proceeds to step 1 wherein a silicon material 800 is the starting material used to form a first silicon layer. Silicon dioxide is deposited onto silicon layer 800 to form a silicon dioxide layer 802 (SiO$_2$) as shown in FIG. 8. Approximately 2-5 μm of silicon dioxide may be used, but other measurements are possible as known by those skilled in the art. Note that the silicon dioxide thickness impacts valve height when in the open position.

The process proceeds to step 2 wherein silicon dioxide is patterned and etched, stopping at the silicon (using lithography and plasma etch) to create a valve height as shown in FIG. 9. At step 3, silicon layer 800 is patterned and etched to 5-20 μm (for example) to form a valve seat 804 and a chamber 806 as shown in FIG. 10. The process proceeds to step 4 wherein the silicon layer is patterned and etched approximately 150-300 μm (e.g.) to create inlet/outlet ports

Figures 11, 12:
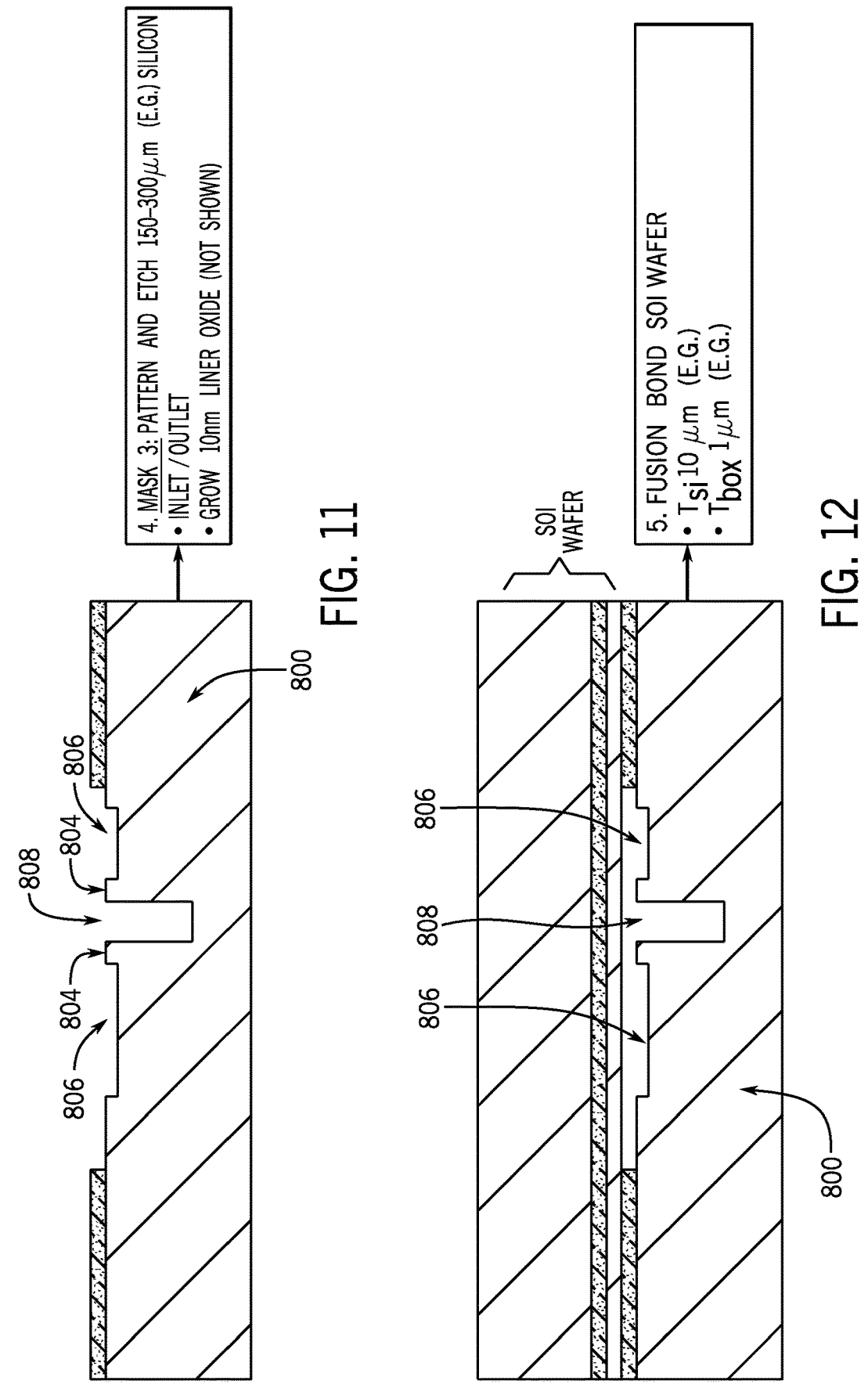

808 or vias as shown in FIG. 11. A 10 nm (e.g.) silicon dioxide liner for the chamber and channels is grown (not shown).

The process then proceeds to step 5 wherein a silicon on insulator wafer (SOI) is fusion bonded to the resulting patterned substrate as shown in FIG. 12. A thickness for the silicon may be 10 μm (for example) and the thickness of the buried oxide (BOX) may be 1 μm (e.g.). Next, the process proceeds to step 6 wherein the handle wafer is removed to expose the silicon (Si) membrane 810 as shown in FIG. 13.

Figures 13, 14:
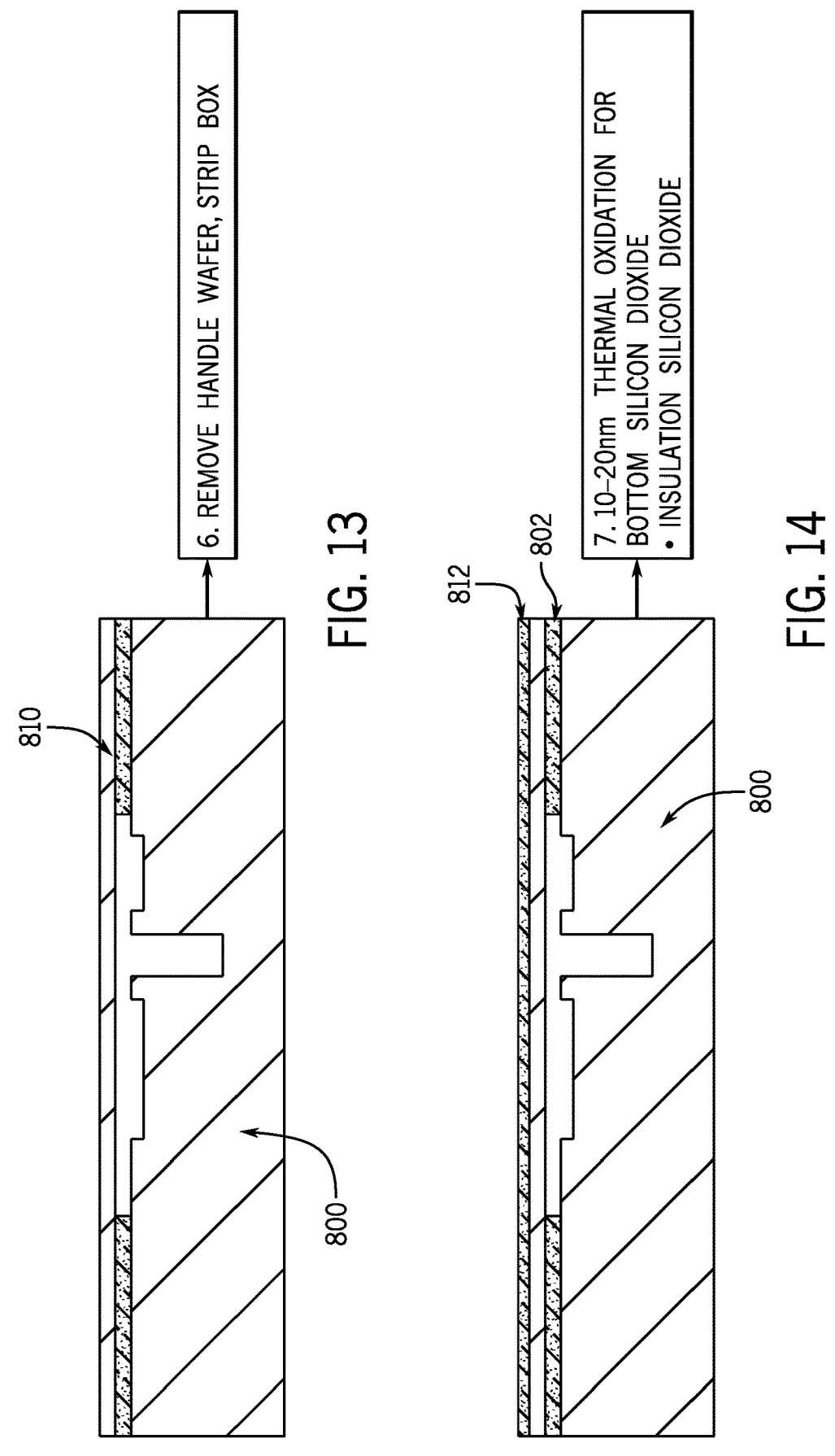
Figures 15, 16:
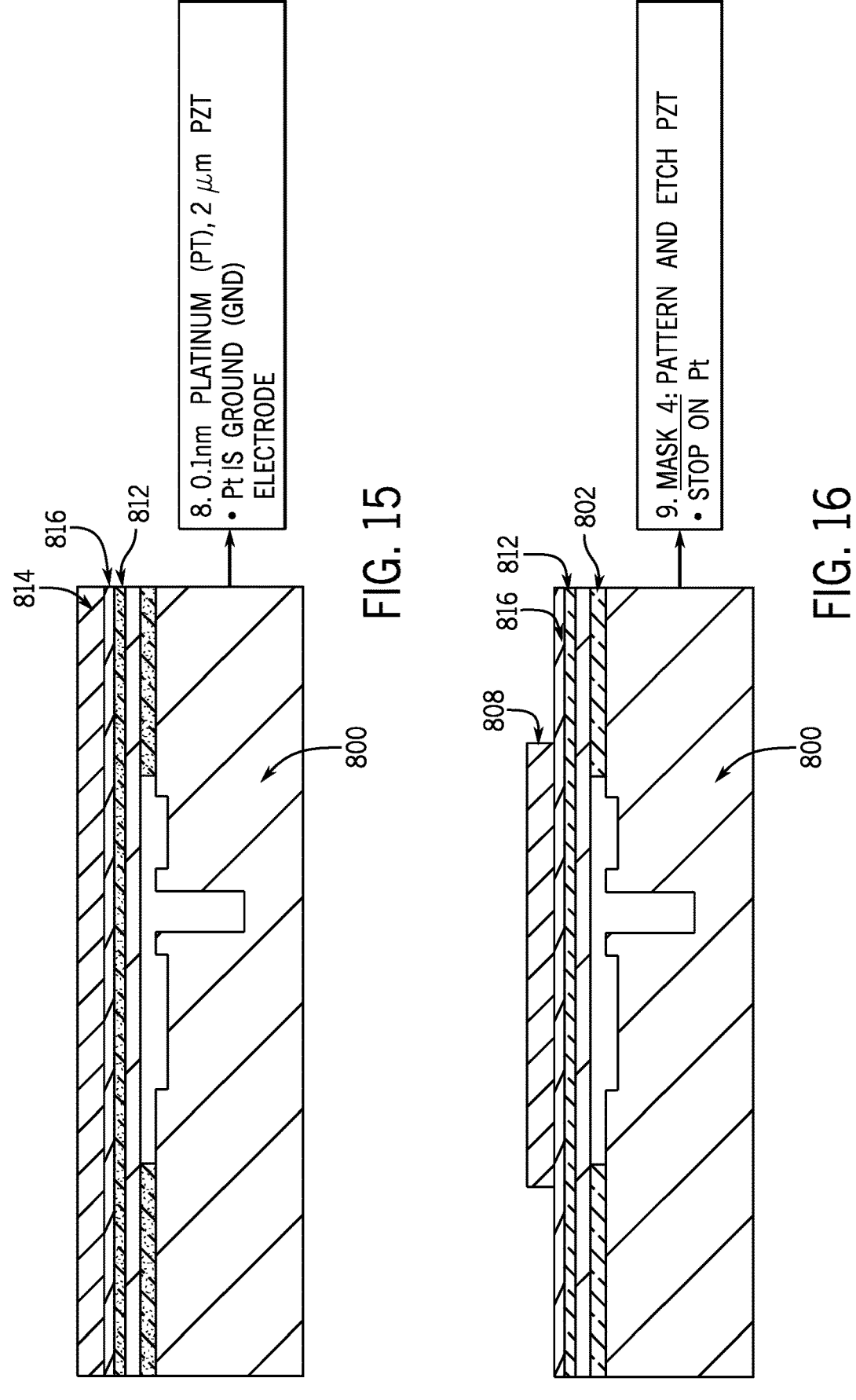

The process proceeds to step 7 wherein an isolation silicon oxide (e.g., 10-20 nm, thermal) layer 812 is grown on the membrane 810 as shown in FIG. 14. The process proceeds to step 8 wherein a piezoelectric stack is deposited on layer 812 as shown in FIG. 15. The piezoelectric stack includes a piezoelectric element 814 and an electrode layer 816 between the piezoelectric element 814 and the silicon dioxide layer 812. The electrode layer is a 0.1 μm (e.g.) of platinum (Pt) which will be configured as a ground (GND) electrode. Then, at step 9, the piezoelectric (e.g., PZT) element 814 is patterned and etched at step at FIG. 16, but etching stops at the electrode layer 816.

Figures 17, 18:
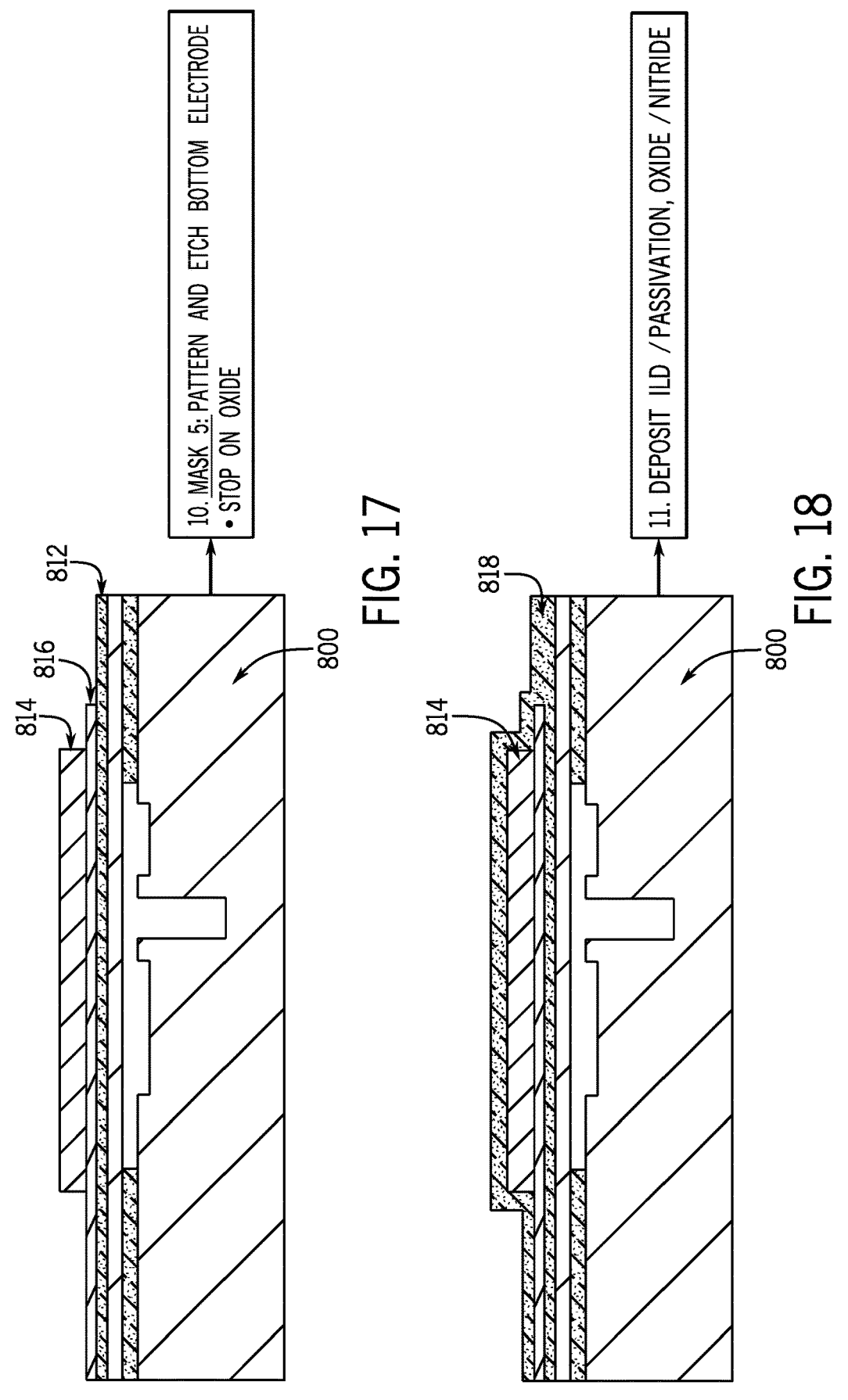

The process proceeds to step 10 wherein electrode layer 816 is patterned and etched, up to the silicon dioxide layer 812 as shown in FIG. 17 and then proceeds to step 11 wherein an interlayer dielectric layer (ILD) 818 or passivation is deposited (thickness 400 nm, e.g. as shown in FIG. 18. The process proceeds to step 12 wherein the interlayer dielectric 818 is patterned until it reaches electrode layer 816 and piezoelectric material 814 as shown in FIG. 19.

Figures 21, 22:
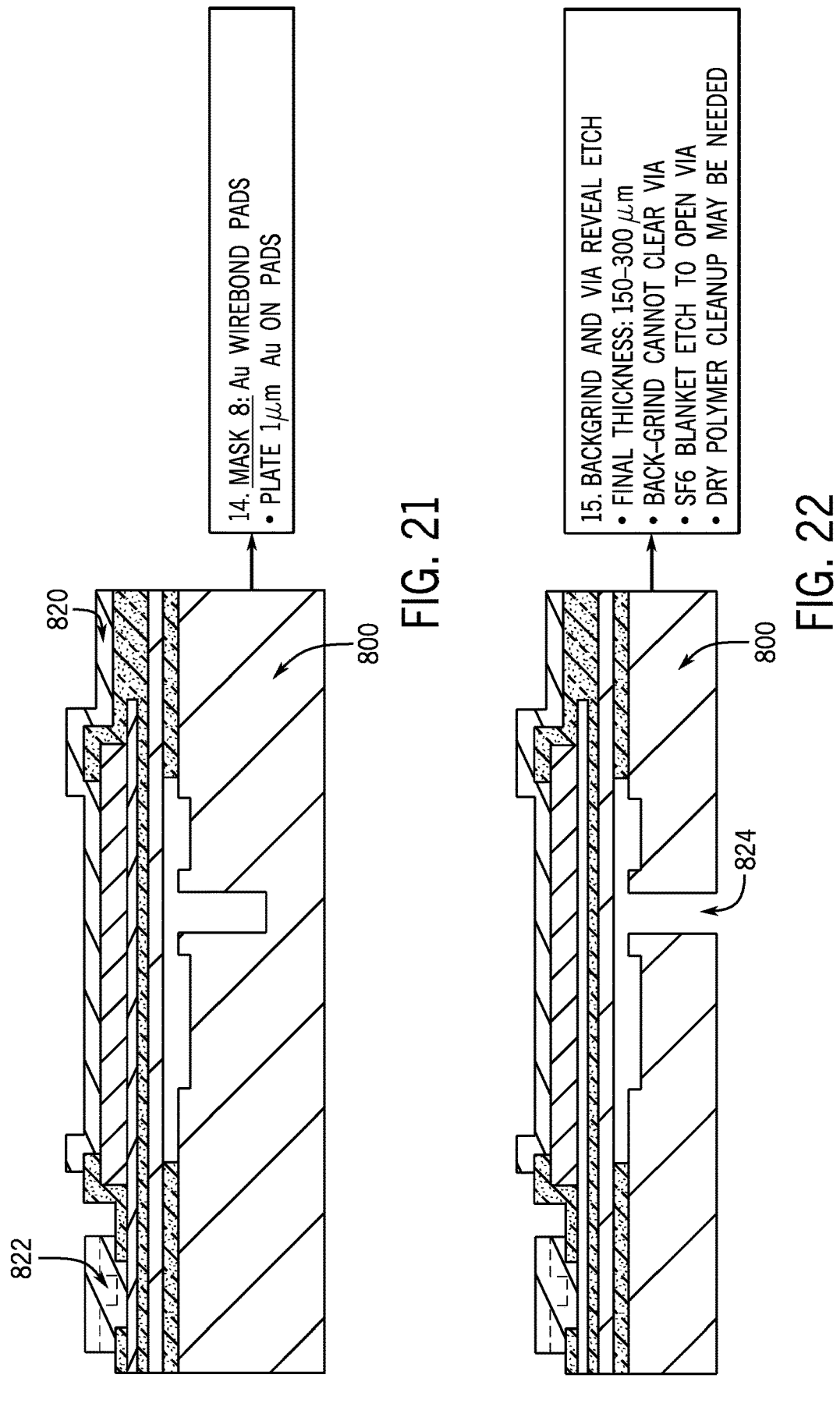

The process proceeds to step 13 wherein an electrode 820 is deposited and patterned on top of piezoelectric (PZT) element 814 and pads 815 on bottom electrode layer 816 as shown in FIG. 20. Top electrode 820 may comprise 10 nm Titanium Tungsten (TiW) and 100 nm of gold (Au) for example. The process then proceeds to step 14 wherein gold (Au) pads 822 are electroplated to 1 μm (e.g.) as shown in FIG. 21. Then, the process concludes with step 15 wherein silicon layer 800 is back-grinded, etched and polished approximately 15 μm short of the opening 824 (VIA). This is shown in FIG. 22. Dry polymer cleanup may be used as needed. These steps are described with respect to valve fabrication. However, the same process steps are used for pump fabrication.

As described, the chamber of the substrate is completely sealed until the very last step 15 in the process above, therefore minimizing the propensity for defect introduction (contamination). This is done by dividing the final wafer thinning step into two steps. First, a wafer is grinded/polished to within 25 μm (e.g.) of the inlet/outlet and (final) blanket dry etched step to open up the inlet/outlet. This significantly reduces contamination in the chamber/fluid path from wet chemical processes.

As indicated above, the measurements in these figures and described herein are examples values for several parameters. However, those skilled in the art know that other values may be used to achieve desired results.

FIGS. 23-39 depict several stages and steps of another pump and valve fabrication along with the corresponding pump and valve structure. (These figures are in cross-section.). The pump or valve is a cavity substrate that includes a top wafer and a bottom wafer. The fabrication process is split between the top wafer and the bottom wafer before they are bonded together. FIGS. 23-29 depict the fabrication process of the top wafer, FIG. 30-36 depict the fabrication process of the bottom wafer, and FIG. 37-39 depict the bonding process and mounting of the piezo actuators. Both top and bottom wafers are silicon wafers with a thickness of approximately 525 μm.

The process proceeds to step 1 for the top wafer 2300 fabrication wherein a silicon material 2302 is the starting material used to for a first silicon layer. A double sided polishing is performed on the initial silicon wafer followed by the growth of a silicon dioxide to form a silicon dioxide layer 2304 (SiO₂) as shown in FIG. 23. A silicon dioxide layer thickness of 100-300 nm may be created, but other thickness measurements are possible as known by those skilled in the art. Subsequently, silicon nitride is deposited on the silicon dioxide layer 2304 to form a silicon nitride layer 2306 as also shown in FIG. 23. Silicon nitride layer 2306 thickness of 50-100 nm may be used, but other measurements are possible as known by those skilled in the art. The same layering appears on the opposing side as shown.

The process proceeds to step 2 wherein spinning of photoresist and photolithographic patterning 2308 on the front side (of the top/first wafer) are completed for assisting in the creation of (i.e., its definition) the valve and pump diaphragm (membrane) by defining openings (i.e., markers as a guide for subsequent etching as described below) as shown in FIG. 24. At step 3, silicon dioxide layer 2304 and silicon nitride 2406 layers are removed by dry etching at the valve and pump openings as shown. Additionally, a protective layer 2310 is applied to avoid scratching the backside of the wafer during wet etching as shown in FIG. 25. This material can be Pro TEK B3, but other materials may be used instead as known to those skilled in the art.

Figures 26, 27, 28, 29:
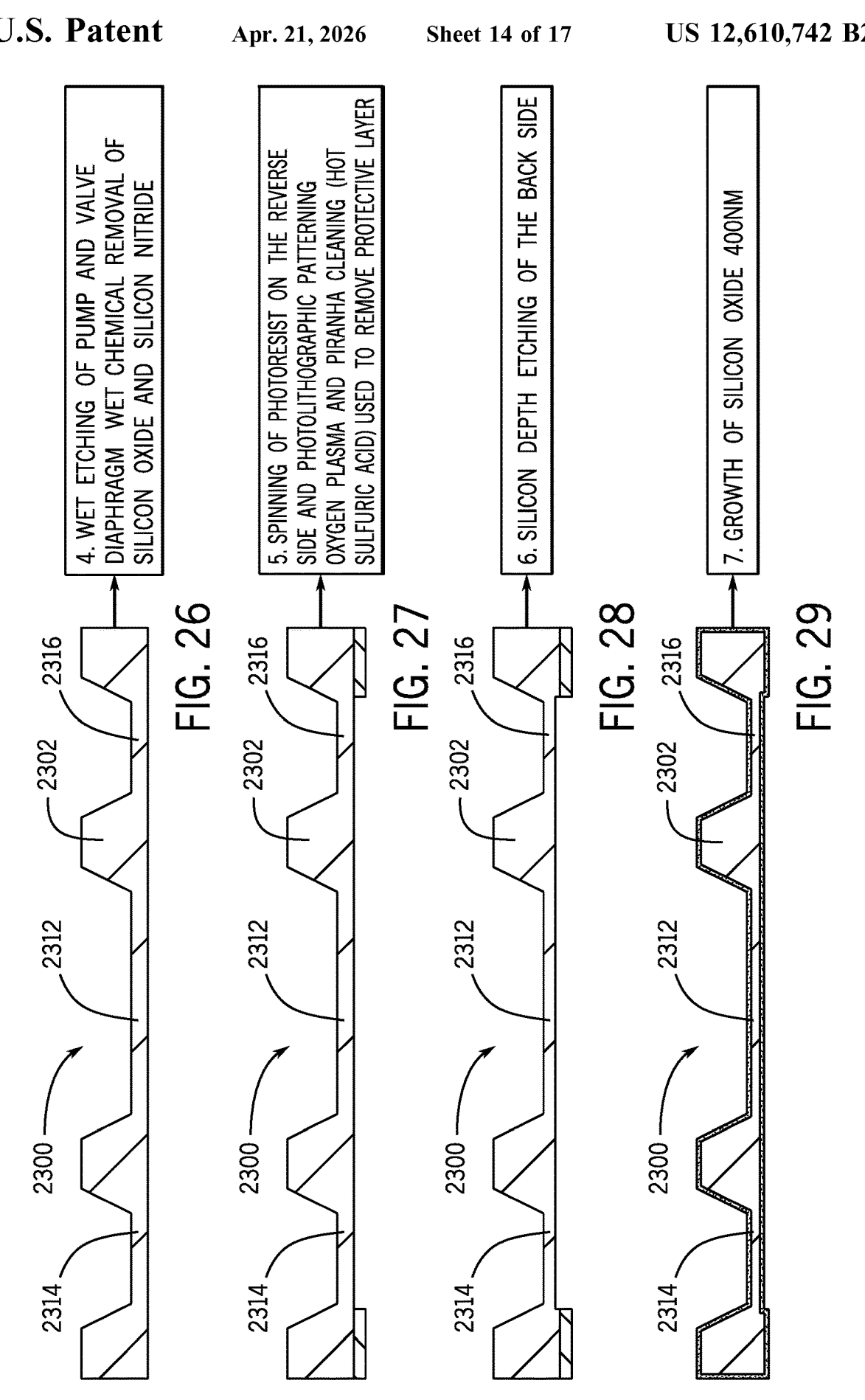

The process proceeds to step 4 wherein the wet etching is performed on silicon layer 2300 to create the diaphragms (membranes) for the pump 2312 and valves 2314, 2316 followed by a wet chemical removal of silicon oxide and silicon nitride as shown in FIG. 26. Furthermore, oxygen plasma and piranha cleaning (hot sulfuric acid) are applied to remove protective layer 2310. The depth of the etching is set by the time control of the etching process. The thickness of the pump and valve diaphragm (membrane) can be 30-50 μm, but other measurements are possible as known by those skilled in the art.

As described, wet etching on the base silicon wafer 2300 creates the three different diaphragms 2312, 2314, 2316 in this example for the inlet, pump and outlet valves. The wet etching is performed at a selected temperature (e.g., 60 degrees Celsius) known to those skilled in the art. The amount etched is dependent on the time allowed for etching. In addition, etching three different membranes for example (or any number thereof) with a thicker silicon structure provides increases pump structure solidity or firmness in between the membranes. This improved solid structure helps avoid coupling. During coupling, as known to those skilled in the art, two membranes vibrate despite lack of activation when the piezoelectric actuator and corresponding membrane are actuated.

The process proceeds to step 5 wherein a spinning of photoresist and photolithographic patterning on the back side are done for assisting in the creation of a definition for the opening (as a guide for subsequent etching as described below) of the top side of the pump and valve chambers as shown in FIG. 27. At step 6, silicon depth etching is performed on the back side of wafer 2300 to define the top of the pump and valve chambers as shown in FIG. 28.

The process proceeds to step 7, wherein wet chemical removal of the photoresist is done followed by growing a silicon dioxide layer on the outside perimeter of the remaining silicon wafer as shown in FIG. 29. The silicon dioxide layer thickness can be 200-400 nm, but other measurements are possible as known by those skilled in the art. This completes the fabrication process of top wafer 2300.

The process proceeds to step 8 for the bottom wafer 3000 fabrication wherein a silicon material is the starting material used for a first silicon layer 3002. A double sided polishing is performed on the initial silicon wafer 3002 followed by the growth silicon dioxide to form a silicon dioxide layer 3004 (SiO₂) as shown in FIG. 30. A silicon dioxide layer thickness of 100-300 nm may be used, but other measurements are possible as known by those skilled in the art. Subsequently, silicon nitride is deposited on silicon dioxide layer 3004 to form a silicon nitride layer 3006 as also shown in FIG. 30. A silicon nitride layer thickness of 50-100 nm may be used, but other measurements are possible as known by those skilled in the art. (These silicon dioxide and silicon nitride layers appear on both sides of silicon layer 3002.)

The process proceeds to step 9 wherein spinning of photoresist and photolithographic patterning on the front side are done to for the definition of the inlet and outlet openings as seen in FIG. 31. At step 10, the silicon dioxide layer 3004 and silicon nitride layer 3006 are removed by dry etching at the inlet and outlet openings as shown in FIG. 32. Additionally, a protective layer 3008 to avoid scratching the backside of the wafer during wet etching is applied. This material can be Pro TEK B3. The process proceeds to step 11 wherein the wet etching is performed on silicon layer 3002 to create the inlet and outlet openings of the valves as shown in FIG. 33. Furthermore, oxygen plasma and piranha cleaning (hot sulfuric acid) is used to remove protective layer 3008 as also shown in FIG. 33.

The process proceeds to step 12 wherein a spinning photoresist and photolithographic patterning on the front side for the definition of the bottom of the pump chamber and valve seats 3400, 3402 while the backside is protected with a conformal film of parylene 3010 as shown in FIG. 34.

At step 13, silicon depth etching is performed on the front of the wafer 3000 to define the bottom of the pump and valve chamber 3400 as well as the valve seats 3402, 3404 as shown in FIG. 35. The chamber depth can be 25-40 μm and the valve seats can be 2-30 μm, but other measurements are possible as known by those skilled in the art. The process proceeds to step 14, wherein the protective conformal layer 3010 of parylene is removed with oxygen plasma as well as wet chemical removal of the photoresist as shown in FIG. 36. This completes the fabrication of the bottom wafer.

The process proceeds to step 15 wherein plasma-assisted low temperature bonding of top and bottom wafers 2300, 3000 are performed to fully define and completely seal the pump chamber 3700 and valve chambers 3702, 3704 as shown in FIG. 37. At step 16, vapor deposition chromium and gold are performed on the topside as shown in FIG. 38. The thickness of the chromium layers can be 10-20 nm and the thickness of the gold layer can be 100-200 nm, but other measurements are possible as known by those skilled in the art. The process concludes at step 17 wherein the piezoelectric actuators 3900, 3902, 3904 are mounted onto the top side of the pump and valve diaphragms using conductive epoxy as shown in FIG. 39. Piezoelectric actuator functions to pump or deform/bend silicon layer as described above.

The pumps and valves described herein may have many applications in a variety of industries including the medical industry, such as drug delivery, lab-on-a-chip, point of care diagnostics and micro-dosing in industrial control.

It is to be understood that the disclosure teaches examples of the illustrative embodiments and that many variations of the invention can easily be devised by those skilled in the art after reading this disclosure and that the scope of the present invention is to be determined by the claims below.

What is claimed is:

1. A method of fabricating a MEMS device that includes one or more wafers configured as a pump or valve, the pump or valve includes an inlet port to receive fluid and an outlet port to release the fluid within the pump or valve, the method comprising:

growing silicon dioxide on a silicon layer of the one or more wafers to form a silicon dioxide layer on the silicon layer;

depositing silicon nitride on the silicon dioxide layer of the one or more wafers to form a silicon nitride layer on the silicon dioxide layer;

spinning a front side of the one or more wafers to create a pattern thereon defining an area for the pump or valve;

dry etching the one or more wafers at the area for the pump or valve to remove the silicon dioxide and silicon nitride layers to define an opening for the pump or valve; and wet etching the silicon layer to remove the silicon dioxide and silicon nitride layers at the area to create a membrane for the pump or valve to thereby displace the fluid or prevent fluid flow within the pump or valve.

2. The method of claim 1 further comprising applying a protective layer to a backside of the wafer to avoid damage during the wet etching.

3. The method of claim 1 wherein the spinning is photoresist and photolithographic patterning.

4. The method of claim 2 further comprising removing the protective layer by using oxygen plasma and piranha cleaning.

5. The method of claim 1 further comprising wherein the depth of etching is set by time control.

6. The method of claim 1 further comprising spinning a back side of the one or more wafers to create a pattern for defining an opening on the top side of the pump or valve.

7. The method of claim 6 further comprising etching the back side of the one or more wafers to define a top of the pump or valve.

8. The method of claim 7 wherein the spinning is photoresist and photolithographic patterning.

9. The method of claim 7 further comprising removing photoresist by wet etching.

10. The method of claim 9 further comprising growing a silicon dioxide layer on the outside perimeter of the one or more wafers.

11. A method of fabricating a MEMS device that includes one or more wafers configured as a pump or valve, the pump or valve includes an inlet port to receive fluid and an outlet port to release the fluid within the pump or valve, the method comprising, the method comprising:

growing silicon dioxide on a silicon layer of the one or more wafers to form a silicon dioxide layer on the silicon layer;

depositing silicon nitride on the silicon dioxide layer of the one or more wafers to form a silicon nitride layer on the silicon dioxide layer;

spinning a front side of the wafer to create a pattern thereon defining an area for the pump or valve;

dry etching the wafer at the area for the pump or valve to remove the silicon dioxide and silicon nitride layers to define an opening for the pump or valve; and wet etching the silicon layer to remove the silicon dioxide and silicon nitride layers at the area to create the inlet and outlet openings of the one or more wafers.

12. The method of claim 11 further comprising applying a protective layer to a backside of the wafer to avoid damage during the wet etching.

13. The method of claim 11 wherein the spinning is photoresist and photolithographic patterning.

14. The method of claim 11 further comprising spinning a front side of the wafer to create a pattern thereon defining a bottom area thereon for a chamber of the pump or the valve.

15. The method of claim 14 further comprising depth etching the front of the wafer to remove the silicon layer to define the bottom of the pump chamber or valve chamber and valves seats.

16. The method of claim 15 further comprising removing the photoresist.

17. A method of fabricating a MEMS device that includes first and second wafers configured together as a pump or valve, the pump or valve includes an inlet port to receive fluid, an outlet port to release the fluid within the pump or valve and a chamber, communicating with the inlet port and outlet port, for storing the fluid within the pump or valve, the method comprising:

growing silicon dioxide on a silicon layer of the first wafer to form a silicon dioxide layer on the silicon layer;

depositing silicon nitride on the silicon dioxide layer of the first wafer to form a silicon nitride layer on the silicon dioxide layer;

spinning a front side of the first wafer to create a pattern thereon defining an area for the pump or valve;

dry etching the first wafer at the area for the pump or valve to remove the silicon dioxide and silicon nitride layers to define the opening for the pump or valve;

wet etching the silicon layer of the first wafer to remove the silicon dioxide and silicon nitride layers at the area to create a membrane for the pump or valve to thereby displace the fluid within the chamber or prevent fluid flow from moving through the inlet port, the chamber and the outlet port within the pump or valve; and growing silicon dioxide on a silicon layer of the second wafer to form a silicon dioxide layer on the silicon layer;

depositing silicon nitride on the silicon dioxide layer of the second wafer to form a silicon nitride layer on the silicon dioxide layer;

spinning a front side of the second wafer to create a pattern thereon defining an area for the pump or valve;

dry etching the second wafer at the area for the pump or valve to remove the silicon dioxide and silicon nitride layers to define an opening for the pump or valve;

wet etching the silicon layer to remove the silicon dioxide and silicon nitride layers at the area to create inlet and outlet openings of the second wafer;

bonding the first and second wafers to define the chamber of the pump or the valve; and mounting piezoelectric actuators on the membrane of the pump or valve.

18. The method of claim 17 wherein the bonding is assisted by low temperature bonding.

19. The method of claim 17 further comprising depositing chromium and gold on the first wafer prior to bonding.

20. The method of claim 17 wherein the spinning is photoresist and photolithographic patterning.

21. The method of claim 17 further comprising wherein the depth of wet etching of the first wafer is set by time control.

22. The method of claim 17 further comprising spinning a back side of the first wafer to create a pattern for defining an opening on a top side of the pump or valve.

23. The method of claim 22 further comprising etching the back side of the first wafer to define a top of the pump or valve.

24. A cavity substrate of a MEMS device configured as a pump or valve with an inlet port to receive fluid and an outlet port to release the fluid within the pump or valve, the substrate comprising:

first and second silicon layers, the first silicon layer configured as a membrane;

a chamber defined by the first and second silicon layers for receiving fluid, configured to communicate with the inlet and outlet ports, the chamber further configured in a rectangular or oblong shape, wherein the second silicon layer is configured to support the membrane over the chamber, to thereby enable the membrane to move fluid from the chamber or prevent the fluid from moving through the chamber; and a silicon dioxide layer in between the first and second silicon layers.

25. A method of fabricating cavity substrate of a MEMS device that is configured as a valve with an inlet port to receive fluid and an outlet port to release the fluid within the valve, the method comprising:

depositing silicon dioxide onto a silicon layer to form a silicon dioxide layer;

patterning and etching the silicon dioxide layer using lithography and plasma etch to create a height of the valve;

patterning and etching the silicon layer to form a valve seat and a chamber of the cavity substrate;

patterning and etching the silicon layer to create the inlet and outlet ports of the cavity substrate;

fusion bonding a silicon on insulator wafer to the cavity substrate;

removing a handle wafer to expose the silicon layer as a membrane;

depositing a piezoelectric stack on silicon oxide layer, the piezoelectric stack includes a piezoelectric element and an electrode layer between the piezoelectric element and the silicon dioxide layer;

pattering and etching the piezoelectric element;

patterning and etching the electrode layer up to the silicon dioxide layer;

depositing an interlayer dielectric layer (ILD) or passivation layer;

patterning the interlayer dielectric layer until the interlayer dielectric layer reaches the electrode layer and piezoelectric element;

depositing and patterning the electrode layer on top of the piezoelectric element and pads on bottom electrode layer;

electroplating gold pads; and back grinding, etching and polishing the silicon layer short of the opening in the silicon layer.

\*   \*   \*   \*   \*